United States Patent
McKinzie, III

(10) Patent No.: US 8,595,924 B2
(45) Date of Patent: Dec. 3, 2013

(54) METHOD OF ELECTROMAGNETIC NOISE SUPPRESSION DEVICES USING HYBRID ELECTROMAGNETIC BANDGAP STRUCTURES

(76) Inventor: William E. McKinzie, III, Fulton, MD (US)

( * ) Notice: Subject to any disclaimer, the term of this patent is extended or adjusted under 35 U.S.C. 154(b) by 975 days.

(21) Appl. No.: 12/603,071

(22) Filed: Oct. 21, 2009

(65) Prior Publication Data

US 2010/0180437 A1  Jul. 22, 2010

Related U.S. Application Data

(62) Division of application No. 11/583,212, filed on Oct. 18, 2006, now Pat. No. 7,626,216.

(60) Provisional application No. 60/729,142, filed on Oct. 21, 2005, provisional application No. 60/792,551, filed on Apr. 17, 2006.

(51) Int. Cl.
*H05K 3/02* (2006.01)
*H05K 3/10* (2006.01)

(52) U.S. Cl.
USPC ............ 29/846; 29/601; 29/832; 333/12

(58) Field of Classification Search
USPC ........... 174/255, 260; 257/532; 333/12, 22 R, 333/219, 247; 343/700 MS, 795; 361/794, 361/818; 29/600, 601, 830–832, 846, 847, 29/852
See application file for complete search history.

(56) References Cited

U.S. PATENT DOCUMENTS

| | | | |
|---|---|---|---|
| 5,886,597 A | 3/1999 | Riad | |
| 6,198,362 B1 * | 3/2001 | Harada et al. | 333/12 |
| 6,323,740 B1 | 11/2001 | Ishikawa et al. | |
| 6,504,456 B2 | 1/2003 | Iio et al. | |
| 6,515,554 B2 | 2/2003 | Ishikawa et al. | |
| 6,525,695 B2 * | 2/2003 | McKinzie, III | 343/795 |
| 6,822,526 B2 | 11/2004 | Ryu et al. | |
| 6,906,674 B2 | 6/2005 | McKinzie, III et al. | |
| 6,933,895 B2 | 8/2005 | Mendolia et al. | |
| 7,071,889 B2 | 7/2006 | McKinzie, III et al. | |

(Continued)

OTHER PUBLICATIONS

Abhari, Ramesh et al., "Suppression of Parallel-Plate Noise in High-Speed Circuits Using a Metallic Electromagnetic Bandgap Structure," 2002 IEEE Intl. Microwave Symposium, Seattle, WA, Jun. 2-7, 2002, pp. 493-496.

(Continued)

*Primary Examiner* — Donghai D. Nguyen
(74) *Attorney, Agent, or Firm* — Brinks Gilson & Lione

(57) ABSTRACT

A hybrid electromagnetic bandgap (EBG) structure for broadband suppression of noise on printed wiring boards includes an array of coplanar patches interconnected into a grid by series inductances, and a corresponding array of shunt LC networks connecting the coplanar patches to a second conductive plane. This combination of series inductances and shunt resonant vias lowers the cutoff frequency for the fundamental stopband. The series inductances and shunt capacitances may be implemented using surface mount component technology, or printed traces. Patches may also be interconnected by coplanar coupled transmission lines. The even and odd mode impedances of the coupled lines may be increased by forming slots in the second conductive plane disposed opposite to the transmission line, lowering the cutoff frequency and increasing the bandwidth of the fundamental stopband. Coplanar EBG structures may be integrated into power distribution networks of printed wiring boards for broadband suppression of electromagnetic noise.

12 Claims, 68 Drawing Sheets

(56) References Cited

U.S. PATENT DOCUMENTS

| | | | |
|---|---|---|---|
| 7,123,118 | B2 | 10/2006 | McKinzie, III |
| 7,148,425 | B2 | 12/2006 | Wu et al. |
| 7,215,301 | B2 | 5/2007 | Choi et al. |
| 7,253,788 | B2 | 8/2007 | Choi et al. |
| 2005/0029632 | A1 | 2/2005 | McKinzie, III et al. |
| 2005/0104678 | A1 | 5/2005 | Shahparnia et al. |
| 2005/0195051 | A1 | 9/2005 | McKinzie, III |
| 2005/0205292 | A1 | 9/2005 | Rogers et al. |
| 2005/0224912 | A1 | 10/2005 | Rogers et al. |
| 2006/0202784 | A1 | 9/2006 | McKinzie, III |
| 2008/0158840 | A1 | 7/2008 | Chen et al. |

OTHER PUBLICATIONS

Abhari, Ramesh et al., "Metallo-Dielectric Electromagnetic Bandgap Structures for Suppression and Isolation of the Parallel-Plate Noise in High-Speed Circuits," IEEE Trans. Microwave Theory and Techniques, vol. 51, No. 6, Jun. 2003, pp. 1629-1639.

Apletalin, V.N. et. al., "Frequency Selective Surfaces with Dumbell Shaped Slots," 2001 IEEE Antennas and Propagation Society Intl. Symposium, Jul. 8-13, 2001, Boston, MA, pp. 406-409.

Choi, Jinwoo et. al., "A Novel Electromagnetic Bandgap (EBG) Structure for Mixed-Signal System Applications," 2004 IEEE Radio and Wireless Conference, RAWCON, Atlanta, GA, Sep. 19-22, 2004.

Choi, Jinwoo et. al., "Noise Reduction and Design Methodology in Mixed-Signal Systems with Alternating Impedance Electromagnetic Bandgap (AI-EBG) Structure," 2005 IEEE Intl. Microwave Symposium, Jun. 12-17, 2005, Long Beach, CA.

Izquierdo Sanz, B. et al., "Ultra-Wideband Multilayer Substrate Integrated Folded Waveguides," 2006 IEEE MTT-S Intl. Microwave Symp., pp. 610-612.

Kamgaing, Telesphor et al., "High-Impedance Electromagnetic Surfaces for Parallel-Plate Mode Suppression in High Speed Digital Systems," IEEE 11th Topical Meeting on Electrical Performance of Electronic Packaging (EPEP), Monterey, CA, Oct. 21-23, 2002, pp. 279-282.

Kamgaing, Telesphor et al., "A Novel Power Plane with Integrated Simultaneous Switching Noise Mitigation Capability Using High Impedance Surface," IEEE Microwave and Wireless Components Letters, vol. 13, No. 1, Jan. 2003, pp. 21-23.

Kamgaing, Telesphor et al., "Inductance-Enhanced High-Impedance Surfaces for Broadband Simultaneous Switching Noise Mitigation in Power Planes," 2003 IEEE MTT-S Intl. Microwave Symp. Digest, pp. 2165-2168, Philadelphia, PA, Jun. 8-13, 2003, pp. 2165-2168.

Kamgaing, Telesphor et al., "Development and Application of Physics-based Compact Models for High-Impedance Electromagnetic Surfaces Integrated in a Power Plane Configuration," IEEE Intl. Antennas and Propagation Symp., vol. 4, Columbus, OH, Jun. 22-27, 2003, pp. 442-445.

Kamgaing, Telesphor et al., "Electromagnetic Bandgap Structures for Multiband Mitigation of Resonant Modes in Parallel-Plate Waveguides," 2004 IEEE Intl. Antennas and Propagation Symp.

Kamgaing, Telesphor et al., "Design and Modeling of High-Impedance Electromagnetic Surfaces for Switching Noise Suppression in Power Planes," IEEE Transactions on Electromagnetic Compatibility, vol. 47, No. 3, Aug. 2005, pp. 479-489.

Kamgaing, Telesphor et. al.,"Package-Level Implementation of Multiband Electromagnetic Band-Gap Structures," 2006 IEEE MTT-S Intl. Microwave Symp., pp. 598-601.

Leung, Lydia, L.W. et. al.,"Compact On-Chip Three Dimensional Electromagnetic Bandgap Structure," 2006 IEEE MTT-S Intl. Microwave Symp., pp. 594-597.

Oh, Seung-Seok et al., "Enhanced Power Plane with Photonic Bandgap Structures for Wide Band Suppression of Parallel-Plate Resonances," 2005 IEEE Antennas and Propagation Intl. Symposium, Washington DC Jul. 3-8, 2005.

Qin, J. et al., "Power Plane with Planar Electromagnetic Bandgap Structures for EMI Reduction in High-Speed Circuits," 2006 Antennas and Propagation Intl. Symposium, pp. 365-368.

Qin, J. et al., "Ultra-Wideband Mitigation of Simultaneous Switching Noise Using Novel Planar Electromagnetic Bandgap Structures," IEEE Microwave and Wireless Components Letters, vol. 16, No. 9, Sep. 2006, pp. 487-489.

Rogers, Shawn D., "Electromagnetic Bandgap Layers for Broad-Band Suppression of TEM Modes in Power Planes," IEEE Trans. Microwave Theory and Techniques, vol. 53, No. 8, Aug. 2005, pp. 2495-2505.

Rogers, Shawn, et. al., "Noise Reduction in Digital/RF Daughter Card with Electromagnetic Bandgap Layers," 2006 IEEE Topical Meeting on Electrical Performance of Electronic Packaging.

Shahparnia, Shahrooz et al., "A Simple and Effective Model for Electromagnetic Bandgap Structures Embedded in Printed Circuit Boards," IEEE Microwave and Wireless Component Letters, vol. 15, No. 10, Oct. 2005, pp. 621-623.

Wang, Xiao-Hua et. al., "A Novel Uniplanar Compact Photonic Bandgap Power Plane with Ultra-Broadband Suppression of Ground Bounce Noise," IEEE Microwave and Wireless Components Letters, vol. 16, No. 5, May 2006, pp. 267-268.

Waterhouse, R.B. et al., "A Small Electromagnetic Bandgap Structure," 2006 IEEE MTT-S Intl. Microwave Symp., pp. 602-605.

Wu, Tzong-Lin et. al., "A Novel Power Planes with Low Radiation and Broadband Suppression of Ground Bounce Noise Using Photonic Bandgap Structures," IEEE Microwave and Guided Wave Letters, vol. 14, No. 7, Jul. 2004, pp. 337-339.

Wu, Tzong-Lin et. al., "A Novel Power Plane with Super-Wideband Elimination of Ground Bounce Noise on High Speed Circuits," IEEE Microwave and Guided Wave Letters, vol. 15, No. 3, Mar. 2005, pp. 174-176.

Wu, Tzong-Lin et. al., "Electromagnetic Bandgap Power/Ground Planes for Wideband Suppression of Ground Bounce Noise and Radiated Emission in High Speed Circuits," IEEE Trans. Microwave Theory and Techniques, vol. 53, No. 9, Sep. 2005, pp. 2935-2942.

Xin, Hao et al., "A W-Band Quasi-TEM Waveguide Using Electromagnetic Crystal (EMXT) Surfaces," 2006 IEEE MTT-S Intl. Microwave Symp., pp. 606-609.

\* cited by examiner

| Transmission Line | Length | Line Width |
|---|---|---|
| AB | $d/\sqrt{2}$ | $\sqrt{2}d$ to $w_2$ |
| BC | $P-g_1-2w_1$ | $w_1$ |
| CD | $d/\sqrt{2}$ | $\sqrt{2}d$ to $w_2$ |
| AE | $g_2+0.5w_1$ | $w_2$ |
| FD | $g_2+0.5w_1$ | $w_2$ |
| EF | $L_2+w_2$ | $w_1$ |
| GH | $L_2+w_2$ | $w_1$ |

METHOD OF ELECTROMAGNETIC NOISE SUPPRESSION DEVICES USING HYBRID ELECTROMAGNETIC BANDGAP STRUCTURES

This application is a divisional application of U.S. Ser. No. 11/583,212, filed on Oct. 18, 2006, issued as U.S. Pat. No. 7,626,216, which claims the benefit of priority to U.S. provisional application Ser. No. 60/729,142, filed on Oct. 21, 2005 and U.S. provisional application Ser. No. 60/792,551, filed on Apr. 17, 2006, each of which is incorporated herein by reference.

TECHNICAL FIELD

The present application relates to suppressing the propagation of electromagnetic signals. In particular, an apparatus and method of noise suppression in electronic systems having a waveguide-like physical structure is described.

BACKGROUND

In printed circuit boards (PCBs), the power distribution systems are often parallel metal planes, which conduct prime power to loads performing the functions of, for example, microprocessors, serial data ports, memory, displays, amplifiers, detectors and the like. The electrical loads may be analog, digital or passive. Where an electronic switching operation is part of the circuit function, including the clocking of digital circuits, the process of digital switching results in unwanted electrical noise on the power distribution systems, sometimes called simultaneous switching noise (SSN), or ground bounce noise (GBN), and more generically called power plane noise (PPN).

In a printed circuit board, loads are connected to a power plane and a ground plane by vias, which are conductive objects disposed perpendicular to the electrically conductive planes, penetrating the dielectric layers separating the planes, and serving to connect components to signal lines, power and ground. Electrical noise (hereinafter "noise") arises, for example, from the changing electrical currents traveling through vias that pass between the power and the ground planes. The rate of change of current, di/dt, in a via creates a transient magnetic field that radiates from the vicinity of the via as a cylindrical transverse electromagnetic (TEM) wave. Other components also may connect to the power or ground planes using vias, and the summation of the electromagnetic fields impinging on a via over the distance between ground and power planes results in inducing a noise voltage in the via, and thus the pick up of noise. For very fast digital switching circuits with high slew rates, the generated noise becomes very broadband and can contain microwave frequencies. When induced on a via connecting to a component in the circuit, this noise voltage may create electromagnetic interference (EMI). That is, the noise can deleteriously effect the other circuits by causing data errors in memory or computing devices, by desensitizing sensitive receivers, and related problems.

Typical engineering approaches to suppressing noise voltages on power distribution systems include adding radio frequency (RF) bypass capacitors, sometimes with widely differing capacitance values, at locations near the noise-generating vias. This approach may be effective up to several tens or hundreds of MHz depending on the design of the bypass capacitors, but becomes ineffective at higher frequencies due to the parasitic (incidental) inductance of the bypass capacitors and of the vias used to connect such capacitors to the power or ground planes. Another approach is to use extremely thin (2 mils or less) high-dielectric-constant layers between power and ground planes. This approach, sometimes called embedded capacitance, may lower the characteristic impedance of the power distribution system, however embedded capacitance does not prevent power plane resonances caused by TEM waves reflecting off the edges of the PCB. An embedded capacitance layer with a relatively high dielectric constant may actually exacerbate the problem of coupling noise between devices on the same power plane due to the high dielectric constant, which increases the density of resonant modes in a given frequency range.

An approach to suppressing power plane noise uses a periodic structure, known as a uniplanar compact photonic bandgap (UC-PBG) structure, as either the power or ground plane in a power distribution network (PDN). This EBG structure is a double-sided PCB where one side has a periodic metal pattern 10 connected by links 20 shown in FIG. 1, and the other side has a solid conductive ground plane. A parallel-plate waveguide (PPW), formed by a UC-PBG power plane next to a solid ground plane, will have inherent noise suppression properties due to the presence of electromagnetic stopbands. These stopbands are created by voltage waves traveling on the EBG structure that experience multiple reflections at periodic discontinuities where the reflections add up out-of-phase at locations on the EBG structure. Voltage waves whose frequency is within a stopband will decay exponentially with distance traveled similar to $TE_{10}$ mode decay below cutoff in a rectangular waveguide. An alternative UC-PBG would have an inductive trace 20 between adjacent patches 30, which may be termed "L bridges," as shown in FIG. 2. The fundamental stopband, or lowest frequency stopband, can begin at frequencies under 1 GHz when the dielectric layer is a conventional FR4 printed circuit board (PCB) material.

There are several problems with the UC-PGP concepts for TEM mode suppression in general, and for power supply noise suppression specifically. One problem is the relatively large size of the period used in the periodic structures, which may be about 30 mm. At least three contiguous unit cells are required to realize the multiple reflections needed for a stopband, and this 90×90 mm area is too large for many printed circuit board applications. The period will decrease if high permittivity substrate materials are used such as ceramic in an LTCC module. However, the largest production volume application for EBG structures is in printed circuit boards having electrical power distribution systems comprised of fiberglass laminates such as FR4. Another problem is that relatively narrow traces 20, 30 used to connect adjacent metallic portions 10 of the pattern are needed to achieve the relatively high series inductance required to place the lower band edge frequency of the fundamental stopband below 1 GHz. For instance, the L-bridges in the EBG structure of FIG. 2 may be only 0.02 mm (8 mils) in width. This narrow trace width limits the current-carrying capability of the periodic structure, essentially creating a fuse.

Additionally, there exists a frequency regime between that where bypass capacitors are effective in noise reduction, and the practical frequency regime for the use of UC-PGP structures where significant noise generating sources may be found in many electronic systems.

Another approach to suppressing power plane noise uses an electromagnetic bandgap (EBG) structure comprised of an array of shunt scatterers embedded between power and ground planes to create an omni-directional noise filter. Such an EBG structure includes a Sievenpiper high-impedance surface covered by a power plane to form a parallel-plate waveguide. The periodic loads of shunt scatterers may be comprised of an interior patch that is capacitively coupled to the power plane, along with a via connecting the patch capacitor to the ground plane. Herein, an individual patch capacitor and the associated via located between two plates of a parallel-plate waveguide are referred to as a resonant via. A resonant via is a shunt LC circuit formed by a series combination of at least one via and at least one capacitor.

An equivalent circuit model for a power-plane electromagnetic bandgap (EBG) structure using arrays of resonant vias was taught by McKinzie III and Rogers in a US patent application: 2005/0224912, filed on Mar. 17, 2004, which is commonly assigned and is incorporated herein by reference. A typical resonant-via EBG structure for power plane noise suppression is shown in FIG. 3 and consists of a square lattice array of square coplanar patches 11 located in close proximity to a conductive plate 12 of the PPW, each patch 11 having a corresponding via 13 connecting the patch to the opposing conductive plate 14 of the PPW.

A resonant via may be modeled, for example, as a shunt LC network where the L and C form a shunt branch circuit to ground, as shown in FIG. 4. Inductive grid EBG structures may be modeled for stopband performance, for example, using the transmission line equivalent circuit of FIG. 5 where a series inductance denoted by $L_2$ connects adjacent square patches having dimension d.

One of the problems with EBG noise suppression structures of the type shown in FIGS. 3 and 4 (which use printed circuit resonant vias) is that a useful operating range is typically limited to frequencies above about 1 GHz to 2 GHz. However, significant noise, for example, from switching power supplies may be present, such as in the 30 MHz to 1 GHz frequency range. The lower band-edge cutoff frequency of the fundamental (lowest frequency) stopband of a resonant-via PPW EBG structure is given by $$f_c = \frac{1}{2\pi\sqrt{C_1\left(L_1 + \frac{\mu_o h}{4}\right)}} \quad (1)$$

where, $C_1$ is the capacitance between a single patch and an upper parallel-plate $$C_1 = \epsilon_{r2}\epsilon_o s^2/t_2; \quad (2)$$

$L_1$ is the inductance of a single via located between a lower plate and patch $$L_1 \cong \frac{\mu_r\mu_o t_1}{4\pi}\left[\ln\left(\frac{1}{\alpha}\right) + \alpha - 1\right]; \text{ and} \quad (3)$$

h is the total height of the PPW, where $h=t_1+t_2$; $\epsilon_o$ and $\mu_o$ are the permittivity and permeability of free space, $\mu_r$ is the relative permeability of the dielectric layer or layers surrounding the via, and $\alpha=r^2/P^2$ is the ratio of via cross sectional area to the area occupied by a unit cell.

For a typical PCB application, the dielectric layers may have a relative dielectric constant of about 4. The period and hence patch dimensions are limited to about 0.3 inches, and the smallest practical dimension of $t_1$ is about 4 mils. Vias are typically fabricated with a 20 mil diameter drill size, and the separation distance between the power and ground planes is typically 30 mils or less. Using these constraints, $f_c$ is limited to about 2.0 GHz, and the fundamental stopband of a typical resonant via PPW EBG may extend up to about 7 GHz.

One means of decreasing $f_c$ is to make the unit cell period larger than 0.3 inches. This will lower this cutoff frequency, which is inversely proportional to patch length, but the patches will also occupy much more PCB area. For example, to reduce $f_c$ from 2 GHz to 50 MHz would mean increasing the patch size from about 0.3 inches to about 12 inches, which is impractical in most applications as at least several contiguous cells are desirable to from a distinct stopband. Many power planes lack the required area.

Alternatively, a thinner and higher dielectric constant layer for the capacitive layer between the patches and upper plate may be selected. However, this choice dramatically increases manufacturing costs. Furthermore the thinner dielectric layers may not withstand "hipot" testing where up to 1500 volts of potential is applied across the layer. Hipot testing is now a requirement for PCB cores used in many computer workstations and high-end servers.

There thus exists a frequency regime above that where bypass capacitors are effective in noise reduction, and below that where the practical frequency regime exists for the use of UC-PGP structures, and where significant noise generating sources may be found in many electronic systems. Hence, there is a need for power plane noise suppression techniques having a fundamental stopband extending down to below 50 MHz and up to at least several GHz. Furthermore there is a need to suppress power plane PPW resonances in this same frequency range.

SUMMARY

Electromagnetic bandgap (EBG) structures that behave as distributed bandstop filters to suppress transverse electromagnetic (TEM) mode propagation in parallel-plate waveguides (PPWs) and in stripline waveguides are described. These structures may be used in both analog and digital circuits for broadband noise suppression or for isolation of devices.

In an aspect, an apparatus includes a first conductive surface and a second surface having a pattern of conductive patches formed in the surface thereof. The first and second surfaces may be layers of printed circuit board, a printed wiring assembly, an integrated circuit device, or the like. The patches may be connected by an inductance, and have a conductive element disposed between the first surface and the second surface. A capacitance may couple the conductive element to the patch or the first conductive surface. An opposing end of the conductive element may be capacitively or conductively coupled to the other of the patch or the first conductive surface. The conductive element may be a via in a printed circuit board.

In another aspect, the inductance may be a conductive link, having the characteristics of for example, a straight link, a meander line, a S-link, an L-link, or a coupled transmission line.

In yet another aspect, the inductance may be a discrete circuit element, such as a surface mount technology (SMT) inductor.

In still another aspect, the capacitance may be a distributed capacitance, such as buried capacitance layer, and a third conductive plane may be used as a power supply plane.

The apparatus may be disposed such that it is located between a noise generating component or circuit and a component or circuit which is susceptible to noise. The apparatus may be disposed to cover an entire surface area of the printed circuit board, or a portion thereof, and be in the form of a linear array of patches (one dimensional) or a cover an area of he printed circuit board (two dimensional). Multiple occurrences of the apparatus may be disposed on the printed circuit board, and each occurrence may have differing characteristics, including the values of the inductances, capacitances, patch size and the like.

The apparatus may be configured as a microstripe, stripline, parallel plate waveguide, or the like in planar geometries, and the equivalents in cylindrical or spherical geometries.

The characteristics and dimensions of the patches, inductances, capacitances, conductive elements such as vias, the dielectric constant of separating layers, and the like may be varied so as to determine the characteristics and frequency limits of the electromagnetic stop bands.

An apparatus is described including a first conducting plane, a second conducting plane, and a third conducting plane where the third conducting plane is disposed between the first conducting plane and the second conducting plane, and spaced apart from the first conducting plane and the second conducting planes. The third conducting plane has a plurality of coplanar conducting patches, adjacent patches being connected by coupled transmission lines.

In another aspect, an apparatus includes a first conducting plane, and a second conducting plane disposed parallel to the first conducting plane and separated therefrom. The second conducting plane has a plurality of conducting patches, and adjacent patches may be connected by a coupled transmission line.

In yet another aspect, an apparatus includes a first conducting plane and a second parallel conducting plane having a two-dimensional array of dumbbell-shaped slots.

In still another aspect, an apparatus includes a first conducting plane and a second conducting plane opposing the first conducting plane and separated therefrom. The second conducting plane has a plurality of coplanar patches, and the patches are connected by high impedance transmission lines. Slots are formed in the first conducting plane under a portion of the high-impedance transmission lines.

In a further aspect, an apparatus includes a first conducting plane; and a second conducting plane disposed parallel to the first conducting plane. The second conducting plane has a periodic arrangement of alternating low-impedance transmission lines and high-impedance transmission lines. The high impedance transmission lines are formed with slots in the first conducting plane disposed under a portion of the high-impedance transmission lines.

In yet a further aspect, an apparatus includes a first conducting plane, a second conducting plane, and a third conducting plane disposed between the first conducting plane and the second conducting plane and separated therefrom. The third conducting plane has a periodic arrangement of alternating low-impedance transmission lines and high-impedance transmission lines. Slots are formed in at least one of the first or second conducting planes, and the slots disposed opposing at least a portion of the high-impedance transmission lines.

In yet another aspect, a coplanar EBG structure may be fabricated by forming an array of dumbbell-shaped (or H-shaped) slots in a conductive plane. The slots may be formed in a periodic array where some slots are rotated by 90° to appear as I-shaped slots. The H-shaped slots and I-shaped slots may be nested together such that the ends of the H-shaped slots are in close proximity to the middle of the I-shaped slots, and visa versa. The result may be a perforated conducting plane with continuous paths for electric current to flow across the coplanar EBG structure.

Such a perforated conducting plane may be placed in close proximity to a solid ground plane to form a periodic parallel-plate waveguide (PPW). TEM modes that propagate in this waveguide may experience alternating passbands and stopbands in radio frequency. The fundamental stopband may be defined by the period and dimensions of the dumbbell-shaped slots.

A coplanar EBG conductor may also be used as the center conductor in a stripline configuration. In this case, solid outer conductive planes are placed on both sides of the coplanar EBG conductor. TEM modes that propagate in this stripline waveguide may also experience alternating passbands and stopbands in frequency.

A modified EBG structure may be used to lower the fundamental stopband in both PPWs and stripline waveguides by forming additional rectangular slots in the adjacent ground planes at locations centered on the dumbbell-shaped slots. Such slots may reduce the distributed capacitance along the high-impedance lines concomitantly increasing the impedance levels of the high-impedance lines. The stopband bandwidth ratio, that is, the ratio of high to low bandedge frequencies, may be increased.

Coplanar EBG structures may be enhanced by forming slots in adjacent ground planes under the narrow traces that form isolated high-impedance transmission lines. This enhancement results in a reduced cutoff frequency and a wider fundamental stopband since the contrast of characteristic impedance values between high and low-impedance transmission lines is increased.

A design method is described whereby the cutoff frequency of the fundamental stopband may be engineered to specific target frequencies by selection of, for example, the unit cell dimensions, relative dielectric constants, and values of characteristic impedances.

In some aspects, planes are arranged as two-dimensional (2D) periodic structures with a substantially isotropic equivalent circuit with respect to the principal plane directions in the plane of the PCB. As such, propagation of noise voltages may be suppressed in an omni-directional manner inside the power distribution system. In yet other aspects, the periodic structure is essentially linear in physical arrangement, or one-dimensional. Such arrangements may be useful to suppress noise in power busses or in narrow (high aspect ratio) power planes where the direction of current flow (the direction of TEM wave propagation) may be essentially unidirectional.

A method of suppressing electromagnetic noise in electronic circuit is described, including disposing a conductive plane parallel to an array of conductive patches; connecting adjacent patches an inductive component; disposing a conductive element between the conductive plane and the patches, and coupling the conductive element to at least one of the patches or the conductive plane with a capacitive element.

The method further includes, selecting the characteristics of the patches, the spacing of the patches from each other and the conductive plane, the dielectric constant of a dielectric layer which may separate the patches and the conductive plane, the characteristics of the inductance and capacitance elements, so as to result in a desired bandstop region for electromagnetic propagation. The method may further include sizing the inductor so as to be capable of carrying a desired power supply current.

The fundamental stopband in both PPW and stripline embodiments of EBG structures may be lowered by forming additional rectangular slots in the adjacent ground planes at locations centered on the dumbbell-shaped slots. Such slots may reduce the distributed capacitance along the high-impedance lines, concomitantly increasing the impedance levels of the high-impedance lines. The stopband bandwidth ratio, that is, the ratio of high to low band edge frequencies, may be increased.

In an aspect, a conductive connection between patches in a planar waveguide structure is configured and dimensioned such that the characteristic impedance of the connection at high frequencies is high and the resistance of the connection for DC current flow is low, and the connection is contained in at least one of the planes of the planar waveguide structure.

In another aspect, a conductive connection between patches in a stripline structure is configured and dimensioned such that the characteristic impedance of the connection at high frequencies is high and the DC resistance of the connection is low, and the connection is contained in at least one of the planes of the stripline structure.

In yet another an aspect, a conductive connection between patches in an EBG structure is configured and dimensioned such that the characteristic impedance of the connection at high frequencies is high and the DC resistance of the connection is low, and the connection is contained in at least one of the planes of the EBG structure.

The EBG structure may be formed of any conductive material, such as metals, conductive polymers, and the like.

The structures may have differing characteristics in different orthogonal coordinate directions, and thus have a non-isotropic behavior

BRIEF DESCRIPTION OF THE DRAWINGS

FIG. 13 shows an alternative 1D unit cell equivalent circuit for the hybrid EBG structure shown in FIG. 7a;

DESCRIPTION

Figure 1:
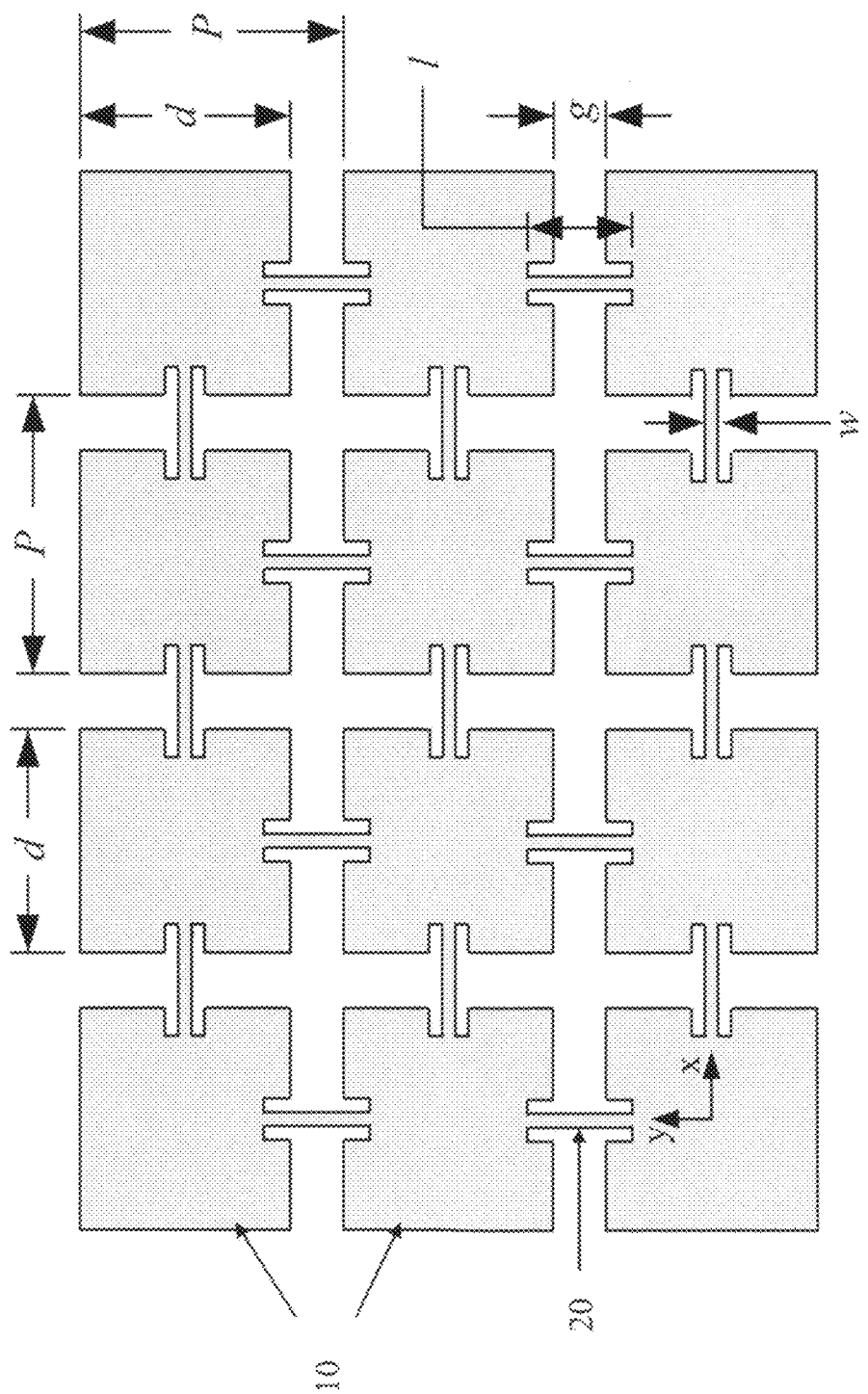
FIG. 1 shows a prior art inductive grid power plane comprised of a uniplanar compact PBG.
Figure 2:
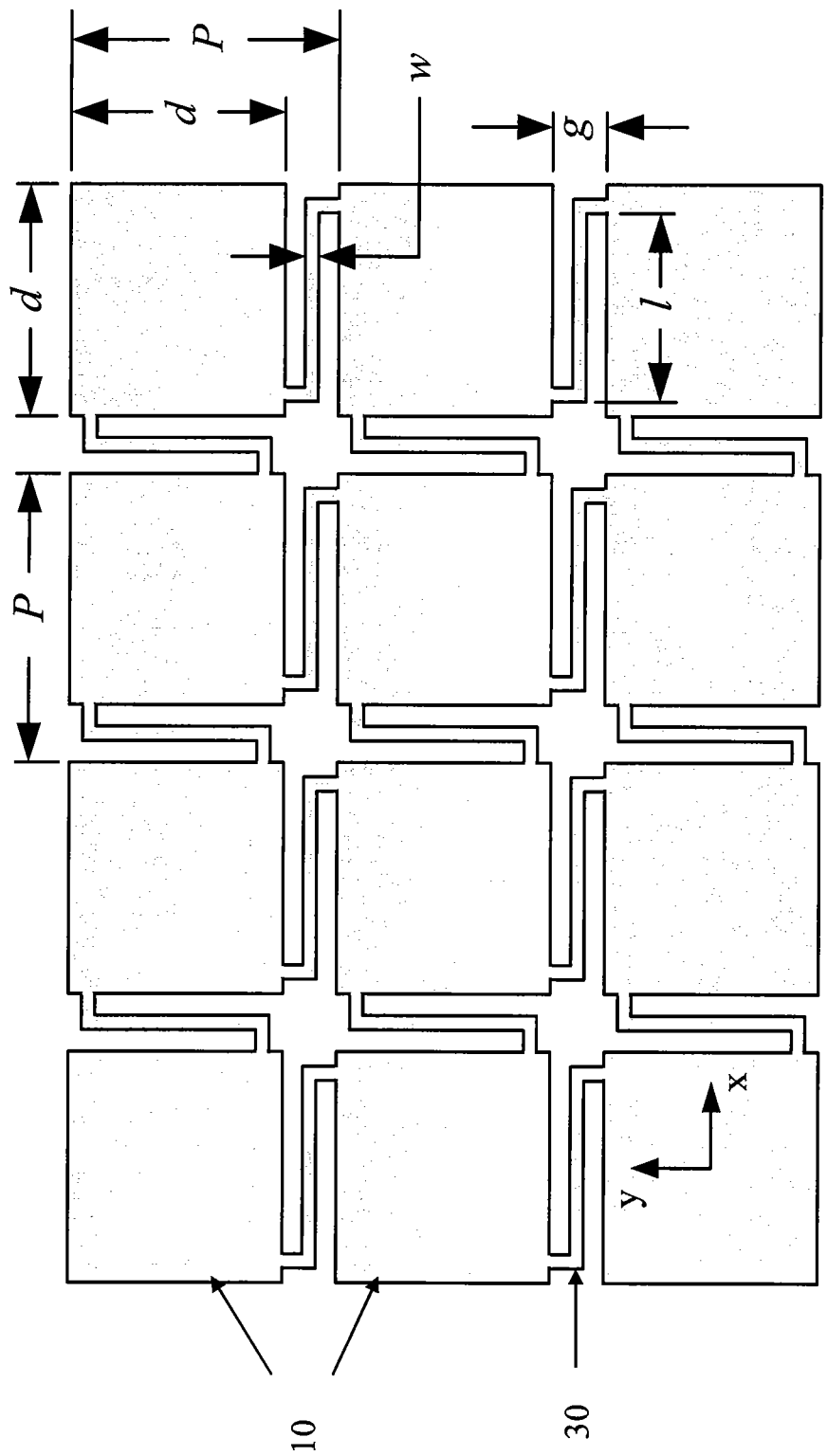
FIG. 2 shows a prior art inductive grid power plane comprised of L-bridges connecting patches.

Exemplary embodiments may be better understood with reference to the drawings, but these examples are not intended to be of a limiting nature. Like numbered elements in the same or different drawings perform equivalent functions. When a specific feature, structure, or characteristic is described in connection with an example, it will be understood that a person skilled in the art may employ such a feature, structure, or characteristic in connection with the other examples, whether or not explicitly stated herein.

Switching of electronic devices including laser diodes, line drivers, microprocessors, and other digital circuits may create transient and sometimes periodic or quasi-periodic voltage waveforms in their associated power distribution systems, which may be termed "noise". Generally "noise" in this context is any signal or voltage that is present in the circuit or components that arises from the operation of another part of the circuit, or an external source, and which is not intended or expected by the designer. Such noise may, for example, cause data errors by varying the level of signal present at a point in the system where the data is evaluated, or cause overload or desensitization of analog circuits, such as may be used in, for example, sensitive radio receivers.

In printed circuit boards (PCBs), the power distribution system is often comprised of one or more pairs of parallel metal plates called power and ground planes. For electronic devices that switch periodically, such as a microprocessor or a data link, the noise may exhibit a fundamental frequency equal to the reciprocal of the switching period and that is often as high as hundreds of MHz. Such switching frequencies are increasing as new technology is being developed, and the fundamental frequencies are expected to rise further. Lower-frequency switching noise is also encountered.

Transient noise waveforms have a frequency content defined by the Fourier transform of the temporal waveform. This frequency content can easily extend into the microwave frequency band if high slew rates (di/dt) are present. Electromagnetic fields arising therefrom may couple as transverse electromagnetic (TEM) modes into the volume between power and ground planes when the vias that supply current to the devices pass vertically through the space between planes. Electromagnetic bandgap (EBG) structures disclosed herein may suppress or limit the propagation of noise voltage on parallel plate waveguides (PPWs) and stripline waveguides generally and, in particular, on power distribution systems comprised of such waveguides.

EBG structures are periodic structures in which propagation of electromagnetic waves is forbidden certain frequency bands, which may be termed stop bands.

EGB structures may have a periodicity or quasi-periodicity in one or more directions, corresponding to axes of symmetry, where the propagation characteristics of an electromagnetic wave are substantially uniform. In a printed circuit board (PCB) or printed wiring board or assembly, this may consist of a two-dimensional (2D) array extending parallel to the surface of the board, a linear array oriented in any direction, or a concatenation of linear arrays enclosing or isolating an area on the circuit board. When compared with a parallel plate waveguide (PPW) having the same cross sectional characteristics, an EBG structure suppresses the propagation of electromagnetic waves between the plates of the waveguide over a broad frequency regime.

When geometrical shapes are described, it will be understood by persons of skill in the art that such shapes are often used for technical description as they are convenient to model analytically. Particularly in full-wave electromagnetic solutions using the finite element and method-of-moments techniques, such geometries are simpler to represent for numerical analysis. Generally, any regular shape, or approximation to such shape, will yield similar results, and any differences accounted for by correction of dimensions or component values by multiplicative constants. Further, while the analysis normally presumes a periodic structure for the distribution of elements, such as patches, vias and the like, similar results will be expected where the dimensional characteristics are relatively slowly varying in the coordinate directions. Moreover, the use of a multiplicity of quasi-periodic dimensional arrangements is similarly expected to yield results consistent with the range of dimensions selected, and may also result in a reduction in fine structure in the actual performance of the structures. Electromagnetic noise voltage waveforms that propagate through the EBG structures may be independent of the DC voltages applied to the power and ground planes. The descriptions of the power and ground planes in the examples may generally be interchanged without affecting the analysis or performance of the EBG structures. That is, for example, the ground plane may be patterned with patches and connected as an inductive grid, and the power plane may be left as a substantially solid conductive plane, without altering the bandstop properties of the EBG structure. Also, within the same PCB, one may alternate the inductive grid (and equivalently the solid conductive plane) between the power plane and ground planes as a function of position on the printed wiring board.

The terms "printed wiring board" and "printed circuit board" are equivalently used herein, as they are both used to describe a manufactured item as described herein. It will be understood by persons of skill in the art that additional wiring and components are added to fully realize the functional aspects of an electronic circuit. Other arrangements such as integrated or hybrid circuits may be used. Furthermore, it will be understood by persons of skill in the art that the EBG structures disclosed herein may be used at the board, package, or chip level, and also in non-planar structures.

A hybrid EBG structure is disclosed, incorporating both the shunt circuit of a resonant-via EBG structure as well as the series impedance of the unit cell of an inductive-grid EBG structure. When appropriately combined, these structures permit the fundamental stopband cutoff frequency to be substantially reduced.

The resonant-via EBG structure may include a first conductive surface, which may be a ground plane or a power plane of a power distribution network, and a via extending between the first conductive surface and a second conductive surface. The via is electrically connected to one of the conductive surfaces, but may be isolated from the other conductive surface by a gap formed in that conductive surface so as to completely surround the top of the via. As such, there may be no direct electrical connection between the first conductive surface and the second conductive surface.

Figure 3:
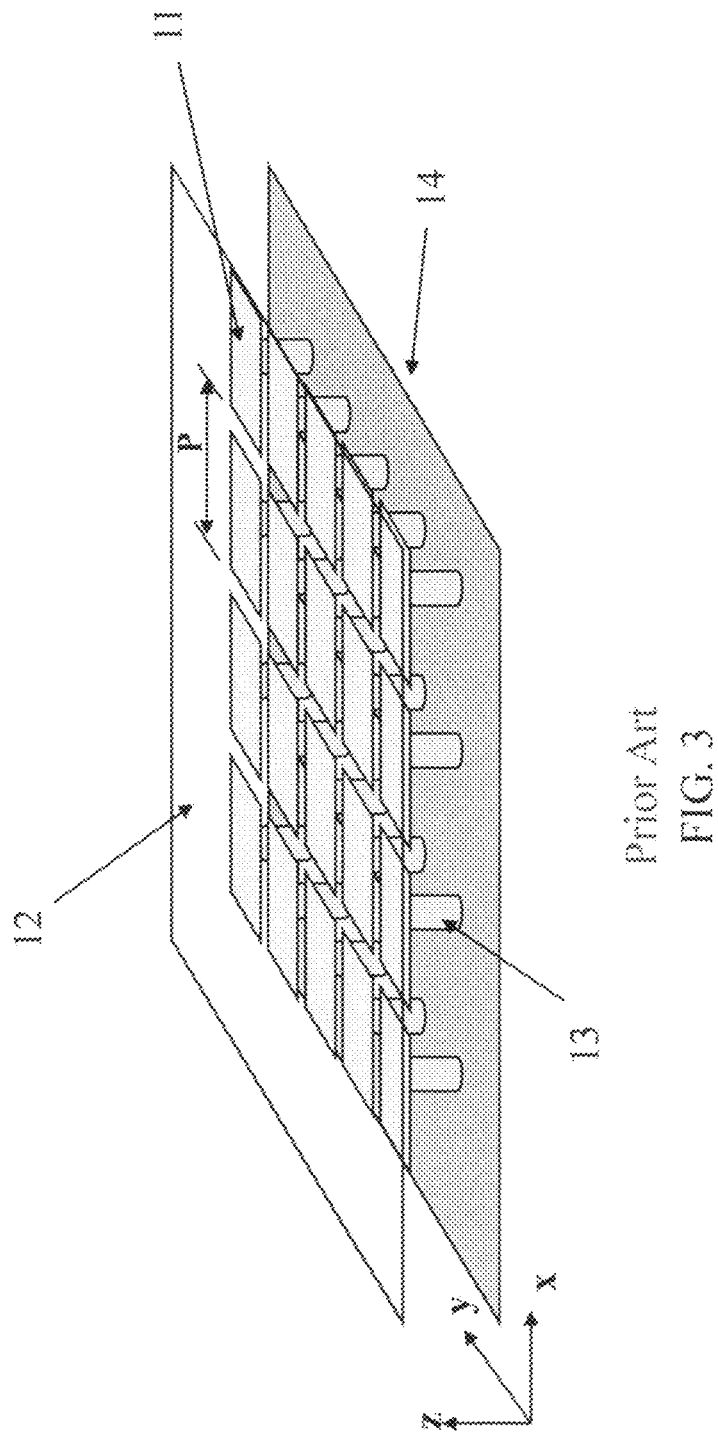
FIG. 3 shows a prior art two-dimensional (2D) array of internal T resonant vias is used as an EBG structure.

Electromagnetically, there is a connection between the second end of the via and other conductive surface due to the stray capacitance across the gap surrounding the top of the via. Alternatively, the second end of the via may be connected across the gap by a capacitor, which may be a discrete capacitor such as a surface mount technology (SMT) capacitor. One of the conductive surfaces may segmented into a plurality of patches, which have a planar geometrical form and which are disposed such that a via is associated with each patch. The patches are spaced closely to each other in the plane of the conductive surface, but the patches are electrically isolated from each other. The first and the second conductive planes are typically spaced apart by a dielectric layer. In another alternative, a resonant-via EBG may be formed as shown in FIG. 3.

In a two-plane arrangement, either the plane with the conductive patches, or the opposing conductive plane may be the power plane, with the other of the conductive planes being the ground. For simplicity of discussion, and without limiting the generality of the disclosure, one of the planes may be called the power plane and the other plane the ground plane, even though their functions may be interchanged. Similarly, the one of the planes to which the via is connected by a capacitor may be either the ground plane or the power plane. Moreover, vias may be connected to either of the power plane or the ground plane by a capacitor interchangeably, so that a first via may be connected to the ground plane by a capacitor, and a second via may be connected to a patch by a capacitor. The first via may be connected directly to the power plane and the second via may be connected directly to the ground plane. In another aspect, opposing ends of a via may be electrically isolated from the ground and power planes and ends of each via may be connected to the ground and power planes by capacitors. Buried resonant-via structures may also be used.

Generally, the power and ground planes may be incorporated in a printed circuit board having additional layers of dielectric material, additional conductive layers such as, for example, signal layers, and electrical and mechanical components may be affixed to one or more layers. Where the power or ground plane is overlain by other layers of the printed circuit board, the capacitor connecting an end of the via to the power or ground plane may be mounted on an exterior surface of the printed circuit board, and connected to the via and the appropriate conductive plane by vias. Connection of components mounted on the surface of a PCB to buried layers is well known in the art.

The examples given herein generally show the components and interconnections associated with the EBG structure, and the other portions of the electrical circuit are not shown for clarity. These include mounting of components for the remainder of the electrical circuit, signal traces, and the like, including vias which may extend to or through the layers shown in the figures. Such additional features may result in some modification of the regularity of the structures shown herein. The effect of these additional features on the electromagnetic performance of the EGB structure may be computed or measured, if needed, for design purposes.

Inductive-grid EBG structures may include a first conductive plane, which may be a ground plane of a power distribution network, and a second conductive plane disposed parallel to the first conductive plane and spaced therefrom by a dielectric layer. The second conductive surface may be segmented into a plurality of patches, which have a planar geometrical form. The patches are spaced closely to each other in the plane of the second conductive surface. In an inductive grid EBG, adjacent patches are connected to each other using an electromagnetic transmission line or an inductance element. The characteristics of such a connection are such that a DC current may flow between adjacent elements, and thus the patches of the second conductive surface may be connected to form one or more power distribution planes co-planar with the second conductive surface. The choice of connecting element may depend on the current carrying capacity desired, and the range of frequencies over which the suppression of propagation of noise in the PPG structure is desired.

Predictions of performance, which are useful in design, may be performed by full-wave electromagnetic wave calculations, and examples of these computations will be presented. However, it may also be useful to represent aspects of the physical structure and components as lumped constant electrical elements or by transmission lines. When represented in this manner, the manipulation of the parameters and visualization of the effect on electromagnetic performance may be facilitated. Relationships between lumped constant parameters and structural features will be disclosed based electromagnetic full-wave simulations, and it will then be apparent to persons skilled in the art as to the techniques and methods for adapting the EGB structures described herein for differing desired frequency ranges, and for shapes that differ from the planar structures, such as coaxial or waveguide applications.

Figure 4:
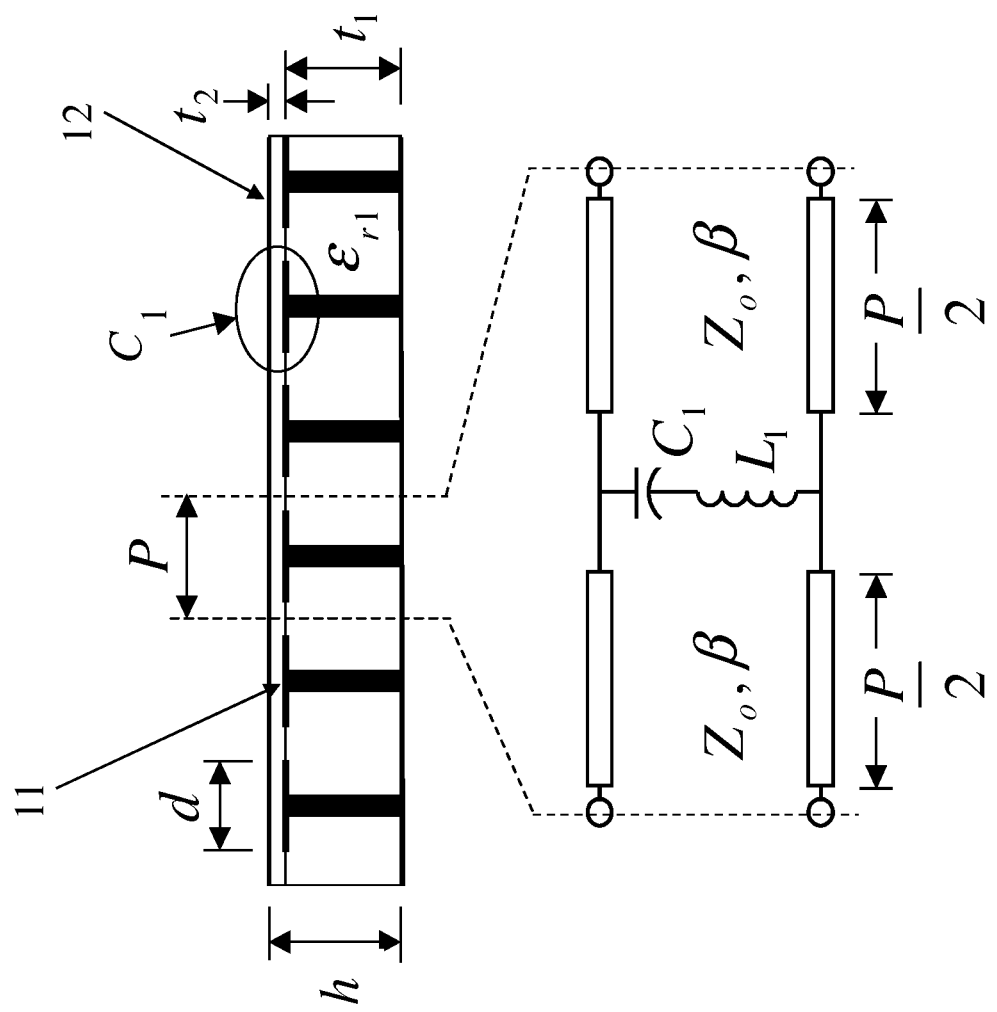
FIG. 4 shows a prior art electrical equivalent circuit of a unit cell of an internal-T resonant via array.

A unit cell of the resonant via EBG structure may be represented by a series L-C shunt circuit, disposed between two transmission lines, as shown in FIG. 4. The transmission lines have an impedance given approximately by $$Z_o = \frac{\eta_o}{\sqrt{\varepsilon_{e\!f\!f}}} \frac{h}{P}.$$

In this circuit, $C_1$ typically represents the value of a discrete SMT capacitor, or the capacitance of a capacitor in a buried layer. $L_1$ represents the self-inductance of a metallic via, and its value is determined in part by the period of the vias as indicated from equation (3). A person of skill in the art will recognize that all components have stray capacitance, inductance and resistance, and that these values may be combined appropriately with the specifically identified circuit components to yield an effective value. The circuit representation described herein is valid for radio frequencies, but it should be recalled that there is no physical coplanar connection between adjacent patches in a resonant via EBG structure that contains internal or external patches.

Figure 6:
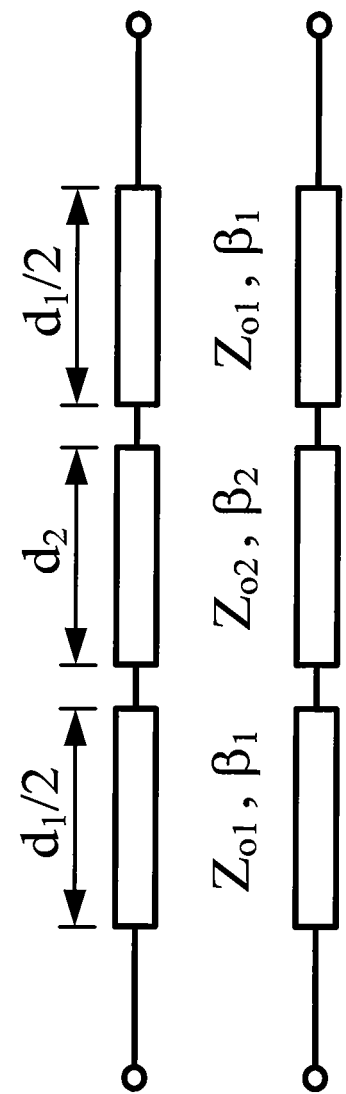
FIG. 6 shows an alternative equivalent electrical circuit of a unit cell of an inductive grid array.

A unit cell of an inductive-grid EGB structure such as the plane which is shown in FIG. 1 may be represented by one of two equivalent circuits. The choice of the representation is normally a matter of convenience, depending on the type of inductive element being used. FIG. 6 shows the unit cell as being represented by a cascade of transmission lines. The two ends of the circuit are usually transmission lines of a low characteristic impedance $Z_{o1}$ with a propagation constant $\beta_1$, and a central high characteristic impedance transmission line $Z_{o2}$, and a propagation constant $\beta_2$. The length of the first transmission line may be approximately half the patch size, and the length of the second transmission line depends on the type and configuration of the traces connecting the patches. It should be understood that the unit cell of FIG. 6 models that portion of the periodic structure from the center of a given patch to the center of an adjacent patch.

Figure 5:
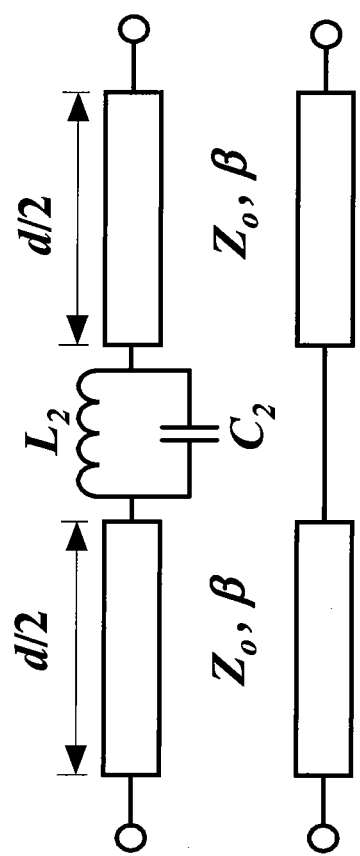
FIG. 5 shows an electrical circuit of a unit cell of an inductive grid array.

An alternative equivalent circuit for the inductive-grid EBG structure, shown in FIG. 5, replaces the central transmission line with a parallel L-C network. This equivalent circuit may be appropriate for a configuration where a meander line is used to connect adjacent patches, or the patches are, for example, connected by lumped constant inductors, which may be SMT devices. The capacitance $C_2$ generally represents the capacitance between the opposing edges of adjacent patches. The presence of $C_2$ in the unit cell model of FIG. 5 leads to a reduction of the stopband bandwidth for the fundamental and higher-order stopbands. When the patches are buried by another dielectric or conductive layer, a lumped constant inductance may be used to connect adjacent patches using vias, similarly to the situation described for the resonant-via configuration. It will be appreciated that, in addition to the RF equivalent circuit representation, the inductor results in a direct connection between the adjacent patches such that a DC current may flow.

That is, the inductive-grid EBG structure differs from the resonant-via EBG structure in that there may be a DC connection between adjacent patches of the inductive-grid EBG structure using one of a printed circuit trace, a transmission line, or a discrete inductor element, whereas the patches of the resonant-via EBG are isolated from each other. A resonant-via EBG can be used in a power plane, however, isolated patches on a separate internal or external buried metal layer may be used.

Figure 7:
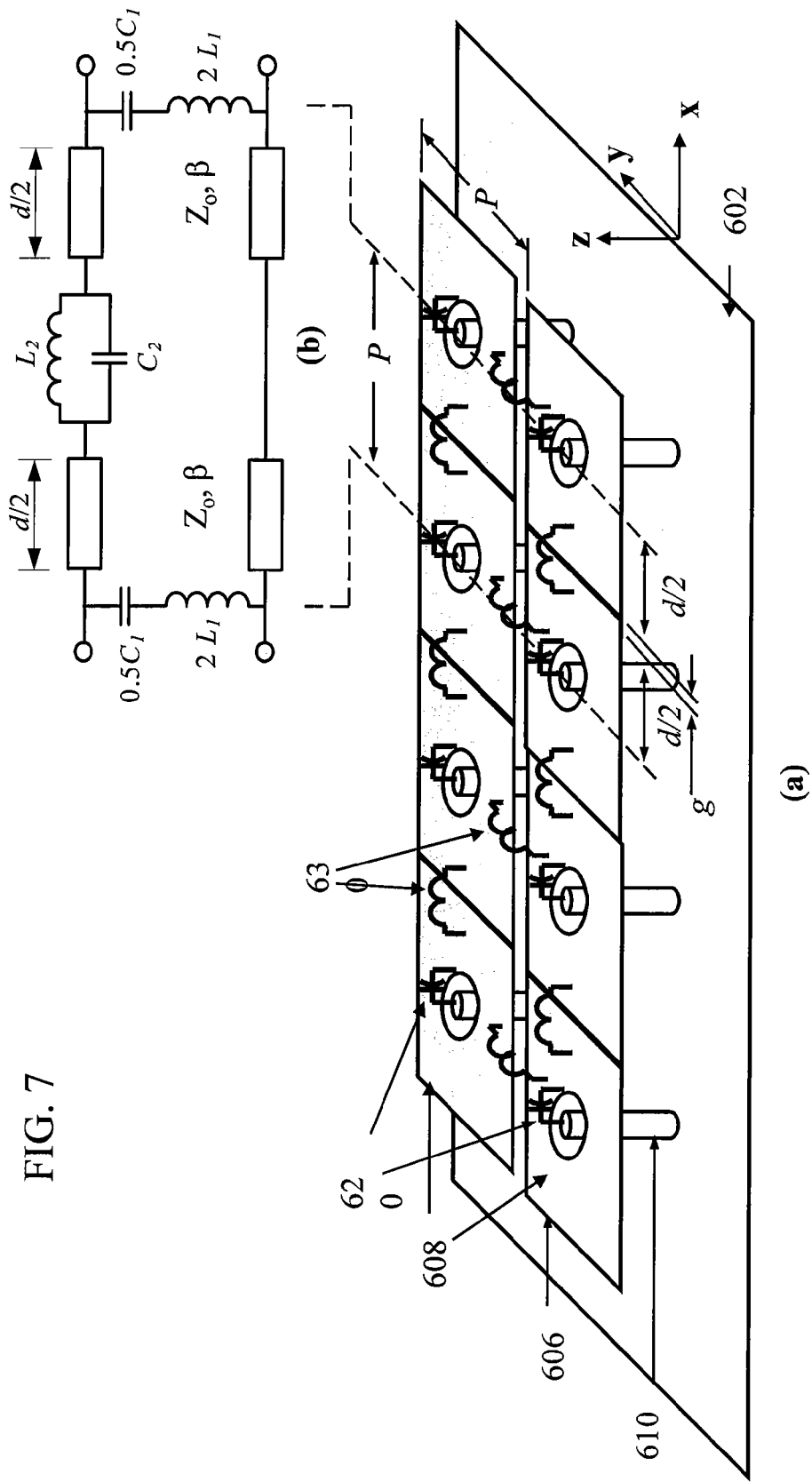
FIG. 7 shows a (a) perspective view two-dimensional (2D) hybrid EBG structure; (b) unit cell equivalent circuit.

Combining the resonant-via and inductive-grid EBG structures as shown in FIG. 7(a), incorporates the two structures so that the patches 608 are shared, and that DC continuity may be maintained in each of the conductive layers 602, 606, to the extent needed in a specific design. A combination of the two types of EGB structures may be represented by a composite equivalent circuit. FIG. 7(b) shows a composite EGB structure equivalent circuit, having both resonant vias and an inductive grid, and where the parallel L-C representation of the connection between patches of the inductive grid is used. Such a composite structure is termed a "hybrid EBG structure" herein.

At least one of the power plane or ground plane is patterned into an array of patches 608 that are connected to each other by way of series inductances. In addition, the patches of the power or ground plane are connected to the opposite plane by vias 610. That is, the patches may be co-planar with one of the conductive planes in the power distribution network, and cooperate with the vias to form shunt LC branch circuits between the power and ground planes. Furthermore, the patches may also be modeled as small sections of parallel-plate transmission lines that are periodically loaded with shunt and series reactive networks.

In some examples, the series inductances are realized by surface mount chip inductors, and the shunt capacitances of resonant vias are realized by surface mount chip capacitors. In other examples, the series inductances are realized with printed traces that reduce cost and increase reliability. In yet other examples, the shunt capacitances of resonant vias are realized by printed patches on other metal layers in close proximity the either the power or ground plane.

In some examples, the series inductances are realized with printed traces that reside on metal layers other than the power or ground plane. By moving the inductive traces off the power or ground planes, the value of inductance may be increased, thus decreasing the cutoff frequency of a desired stopband. The inductance of the connections between the patches may also be realized by configuring the connections as coupled transmission lines.

In another aspect, design methods whereby the cutoff frequency of the fundamental stopband may be engineered to a specific target performance through selection of the unit cell dimensions, relative dielectric constants, and values of series inductance and shunt capacitance are disclosed.

In an aspect, where lumped constant inductors are used for the series inductances, and lumped constant capacitors are used for the shunt capacitances, the period of the EBG structure may be reduced while achieving a given cutoff frequency by increasing the $L_2$ and $C_1$ values. This may permit such hybrid EBG structures to be made smaller for a given number of cells, so as to be compatible with other circuit elements and overall board size constraints. It will be appreciated that a multiplicity of hybrid EBG cell designs may be incorporated into a single printed circuit board to be consistent with design requirements relating to the types and locations of circuit elements and desired stopband frequencies.

Some examples of hybrid EBG structures are arranged as two-dimensional (2D) periodic structures with an essentially isotropic equivalent circuit with respect to the principal plane directions in the plane of the PCB. As such, the structures suppress the propagation of noise signals in an omni-directional manner inside the power distribution system. In other examples, the periodic structure is substantially linear in physical arrangement; that is having a periodicity in one dimension. Such structures may be useful to suppress noise in power busses or in narrow (high aspect ratio) power planes where the direction of current flow (the direction of TEM wave propagation) is essentially unidirectional. Other orientations of the principal axes of the hybrid EBG structure with respect to the principal axes of the board are possible.

The following examples of hybrid EBG structures will be described as integrated into parallel power and ground planes of a power distribution system in a printed wiring board. However, in general, such hybrid EGB structures may be integrated into any multilayer panel circuit including a conventional printed circuit or printed wiring board, a ceramic module, a chip scale package, a wafer level package, or a semiconductor chip, to create stopband filters for the dominant TEM mode.

A variety of examples are described. The examples can illustrate only a small number of the possible configurations and selection of parameter values that may be used. In many of the examples, similar structural dimensions are used for dielectric thickness, trace width and patch size. This is done for convenience in presentation and so that the examples may be compared or contrasted without having to discuss the effect of all of the parameter values in each example. The sizes and types of materials and the combinations which are possible are not intended to be restricted by these examples.

The EBG structures are generally described in terms of their incorporation into parallel power and ground planes of a power distribution system in a printed wiring board. However, in general, these structures may be incorporated into any waveguide structure capable of supporting a TEM mode.

FIG. 7(a) shows a hybrid EBG structure that is integrated into a power distribution system. The z direction is normal to power and ground planes. A power plane 606 may be subdivided into a coplanar array of conductive patches 608. The patches are illustrated as rectangles, but they may be any polygonal shape or approximation thereto. The conductive patches 608 may be electrically connected together in both the x and y directions by inductances 630 to form an inductive grid. The inductances may be realized in various forms including chip inductors, air core coils, or printed traces. As printed traces, the inductances 630 may be coplanar with the power plane 606, or the traces may lie out-of-plane.

The power plane 606 is spaced parallel to, and a height h above, a conducting ground plane 602. The ground plane may be a substantially continuous conductive plate.

A via 610 extends between patch 608 and the ground plane 602. A resonant via is a combination of at least one via located between different metal layers in a printed wiring board and at least one capacitor in series therewith. For example, a resonant via may be comprised of a via 610 that connects the ground plane 602 to a via pad (not shown) that is coplanar with the power plane 606, and a capacitor 620 that connects the power plane end of the via, or the via pad, to a conductive patch 608. The via 610 may be a conventional drilled and plated hole, or the via may be a vertical rivet, rod, post, pressed pin, or a wire that allows electrical current to flow easily from the level of the ground plane 602 to the level of the power plane 606. The inductance of via 610 is designated L1. Via 610 is illustrated as having a circular cross section, but the via may have any cross-sectional shape or multiple cross-sectional shapes, or an aggregation of vias, so as to yield a desired inductance. The capacitor 620 may be a lumped element such as a chip capacitor, or a printed patch located in close proximity to the conductive patch 608, or the stray capacitance between the via pad (not shown) and the conductive patch 608. Capacitance 620 may also be realized, for example, by an interdigital capacitor located in series with the via 610 and coplanar to patch 608.

The unit cell equivalent circuit is shown in FIG. 7(b). This unit cell is defined to extend in the x and y directions from the center of one via to the center of an adjacent via, the centers of which are separated by a distance P. Thus, the unit cell has a square footprint of area P×P whose corners are at the centers of four vias, the vias forming the corners the square. The equivalent circuit includes a transmission line of characteristic impedance $Z_o$, representing TEM modes that are guided by the power and ground planes. The total length of the transmission line within a unit cell is d, which is the side length of the conductive patches 608 shown in FIG. 7a. A gap of width g separates adjacent patches 608 such that the period P of the unit cell has the relationship P=d+g The equivalent circuit of FIG. 7b also contains lumped constant series and shunt elements, although distributed structures may also be used. The shunt components $C_1$ and $L_1$ represent the capacitance 620 and the inductance of via 610 which may be found near the center of each conductive patch 608. The series element $L_2$ represents the inductance 630 that connects adjacent patches 608. Capacitance $C_2$ represents the sum of two parasitic capacitances: the first is the capacitance between adjacent patches 608, which is sometimes called the slot capacitance or gap capacitance $C_g$; and the second parasitic or stray capacitance may exist across inductance 630, and results in a self-resonant frequency (SRF) of inductor 630.

For purposes of clarity, FIG. 7(a) was drawn without showing the one or more dielectric support layer or layers which may be present between power and ground planes, or other layers surrounding the power and ground planes. This is typical of the presentation in the disclosure, although such layers may be shown where convenient or instructive.

The effective dielectric constant $\in_{eff}$ of the dielectric layer or combination of dielectric layers defines the phase constant $\beta$ for the transmission line model of FIG. 7(b). It may be convenient to consider one isotropic dielectric layer of relative permittivity $\in_r$ disposed between power and ground planes, in which circumstance, the effective dielectric constant of the equivalent transmission line is $\in_{eff}=\in_r$. When anisotropic dielectric materials are used between power and ground planes, then the z tensor element of permittivity would be used for the effective dielectric constant. The phase constant $\beta$ of the equivalent transmission line is $\beta=(\omega/c)\sqrt{\in_{eff}}$ where $\omega$ is the radian frequency and c is the speed of light in free space.

Figure 8:
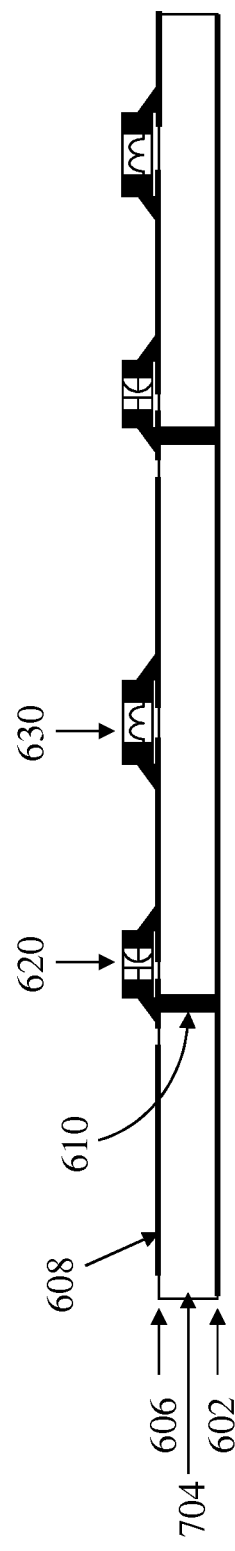
FIG. 8 shows a cross-sectional view of the hybrid EBG of FIG. 7(a) in a two-layer printed wiring board.

FIG. 8 shows a cross-sectional view of FIG. 7(b) for a two-layer printed wiring board and surface mounted components $C_1$ and $L_2$. The power plane 606 includes isolated conductive patches 608 interconnected into a grid by surface mounted chip inductors 630. Other forms of inductive connection may be used. Dielectric layer 704 separates power plane 606 from ground plane 602. Near the center of each patch 608, a via 610 connects the ground plane 602 to a via pad on the power plane layer 606. A surface mounted chip capacitor 620 may be connected between the via pad and the patch 608, so as to form a shunt LC circuit between the patch 608 and ground plane 602. In the unit cell equivalent circuit of FIG. 7(b), capacitor 620 is represented as $C_1$, and inductor 630 is represented as $L_2$.

Figure 9:
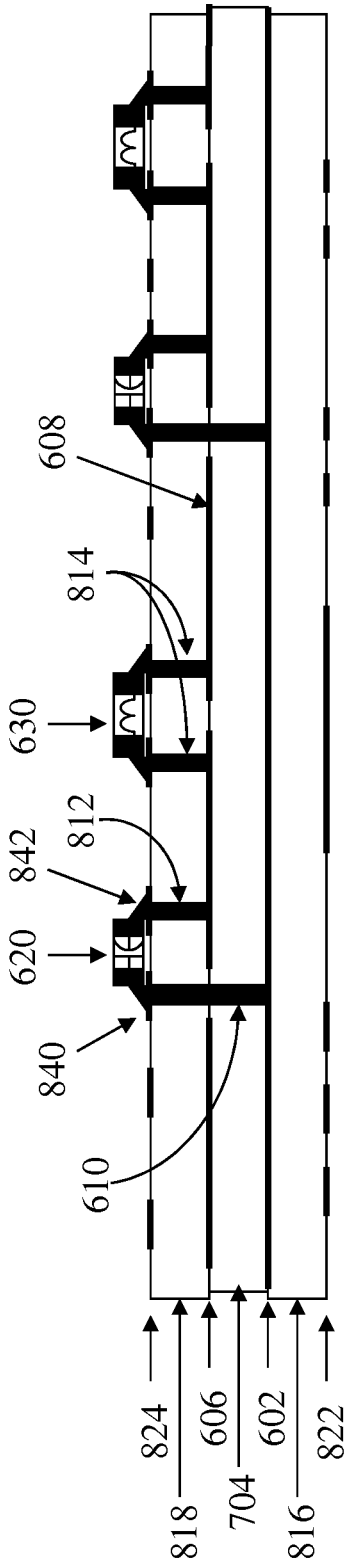
FIG. 9 shows a cross-sectional view of the hybrid EBG embodiment of FIG. 7(a) in a four-layer printed wiring board.

FIG. 9 shows a cross sectional view of FIG. 7(a) for a four layer printed wiring board and surface mounted components for $C_1$ and $L_2$. Metal layers 1, 2, 3, and 4 are a first signal layer 824, the power plane 606, the ground plane 602, and a second signal layer 822, respectively. The power distribution system is embedded within the printed circuit board as a ground plane layer 602 and a power plane layer 606. Power plane 606 includes isolated conductive patches 608 interconnected into a grid by surface mounted chip inductors 630 soldered to pads on the first signal layer 824. Vias 814 establish the electrical connections between adjacent power plane patches 608 on layer 2 and the exterior pads on layer 1 that connect to an inductor 630. The dielectric layer 704 separates power plane 606 from the ground plane 602. Dielectric layer 818 separates the first signal layer 824 from the power plane 606, and the dielectric layer 816 separates the second signal layer 822 from the ground plane 602.

Near the center of the power plane patch 608 is a via 610 that connects the ground plane 602 to a first via pad 840 on the first signal layer 824. A surface mounted chip capacitor 620 is connected between via pads 840 and 842. A second via 812 connects pad 842 to the power plane patch 608. Thus a shunt LC circuit is formed between the ground plane 602 and the power plane patch 608. In the unit cell equivalent circuit of FIG. 7(b), capacitor 620 is represented as C and inductor 630 is represented as $L_2$.

The filtering properties of hybrid EBG structures can be evaluated using a circuit analysis of the unit cell equivalent circuit shown in FIG. 7(b). This equivalent circuit may be applicable where the TEM mode has a linear phase front traveling in the x or y direction. A quasi-TEM mode on a parallel-plate waveguide (PPW) of width d and height h, without shunt or series loads, has a characteristic impedance and phase constant given by $$Z_o = \frac{\eta_o}{\sqrt{\varepsilon_{eff}}} \frac{h}{d} \quad (4)$$

and $$\beta = \frac{\omega}{c}\sqrt{\varepsilon_{eff}} \quad (5)$$

Respectively, where $\eta_o$ is the wave impedance of free space, 377$\Omega$, and the width d of the PPW is the size of the square patches.

The shunt circuits at each port of the two-port circuit model of FIG. 7(b) represent the resonant vias. One half of the capacitance $C_1$ and twice the via inductance $L_1$ is modeled in each shunt branch as the edge of the unit cell intersects the resonant via. The via inductance is halved as only half of the total via current resides inside the unit cell while all of the magnetic lines of flux encircling the via pass through the unit cell. The total via inductance may be estimated from the formula $$L_1 = \frac{\mu_o h}{2\pi}\ln\left(\frac{P}{2\pi r}\right) \quad (6)$$

where $\mu_o$ is the permeability of free space and r is the via radius, assuming a circular cross-section via. Alternatively, equation (3) could be used to compute the value of $L_1$ if $t_1$ is replaced by h. The value of capacitance $C_1$ may be established, for example, by the selection of a chip capacitor, or by a capacitive patch. The value of the inductance $L_1$ may be increased by the parasitic series inductance of the chip capacitor $C_1$ plus any stray inductance of layout details in the printed wiring board such as via 812 in FIG. 8.

The resonant via provides a shunt admittance $$Y_s = \frac{j\omega C_1}{1 - \omega^2 L_1 C_1}. \quad (7)$$

A series element in the transmission line may be created by the parallel combination of $C_2$ and $L_2$. The dominant component of $C_2$ is the slot capacitance between adjacent patches, the value of which may be determined from the gap dimension g, the dielectric constants of the dielectric layers, and the thickness of the dielectric layers.

Figure 10:
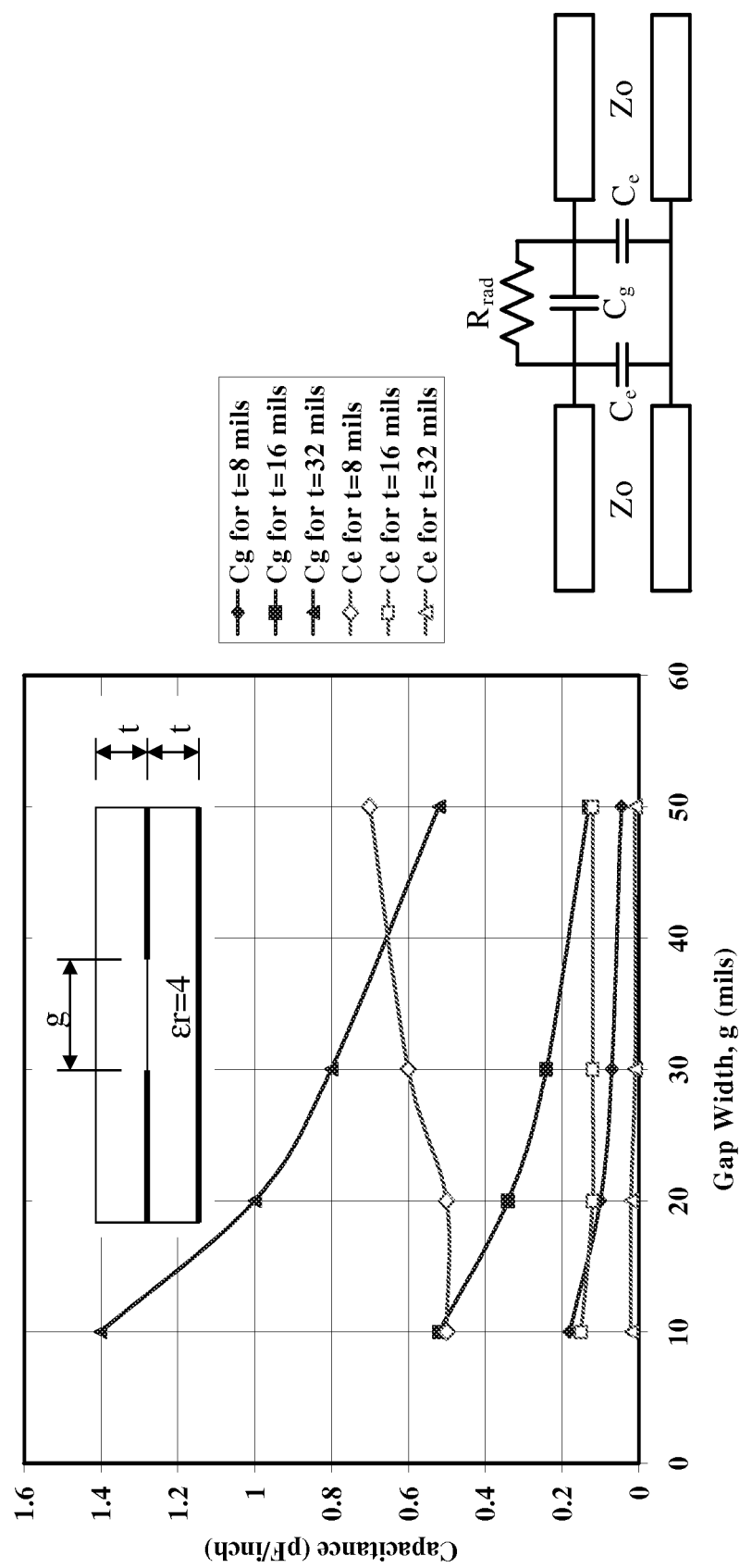
FIG. 10 shows predicted results for slot capacitance as a function of the substrate thickness and the gap dimension between patches.

FIG. 10 illustrates an equivalent circuit model for a slot discontinuity in a PPW. Full-wave simulations were performed for the two dielectric layer (substrate and superstrate) configuration as shown in cross-section as an inset. Magnetic side walls were assumed to permit electromagnetic propagation to be represented as that of a TEM mode in the substrate in a direction orthogonal to the longitudinal axis of the slot. Two-port S parameters were simulated and the frequency dependent data was use to parameter fit the circuit model. The resulting gap and end capacitances are plotted in FIG. 10 in terms of capacitance per inch of slot length in the transverse direction. The gap capacitance varies inversely with gap width g. The simulation was performed for a dielectric constant of $\in_r=4$ in both substrate and superstrate. The end and gap capacitances $C_e$ and $C_g$ would be expected to approximately scale with dielectric, constant assuming g≤2t. The end capacitance $C_e$ may be small relative to the parallel-plate capacitance between patch 608 and ground. For the case of no dielectric superstrate, $C_g$ was computed to be approximately half of the values shown in FIG. 10.

The radiation resistance $R_{rad}$ in the gap discontinuity model shown in FIG. 10 may be used to accurately fit the circuit model to full-wave S parameters, at least out to 15 GHz, where $R_{rad}=1/(x\omega C_g)$, and x is less than unity for the parameters shown. $R_{rad}$ may be larger than the reactance of $L_2$, at least for frequencies where $f<<1/(2\pi\sqrt{xL_2C_g})$ Simulations of the slot discontinuity s parameters were performed using Microstripes™ from Flomerics (Marlborough, Mass.). However, many other full-wave computational electromagnetic codes such as HFSS™ from Ansoft (Pittsburg, Pa.), or Microwave Studio™ from CST of America (Wellesley Hills, Mass.) could also be used. Full-wave modeling may be also used for complex geometries such as printed in-plane and out-of-plane inductors.

The value of $L_2$ may be determined, for example, by the selection of a chip inductor value. There is some parasitic inductance due to current crowding from the patch 608 of width d into the much smaller terminal dimensions of a chip inductor, but this parasitic inductance is usually dominated by the nominal value of $L_2$. The parasitic capacitance of $L_2$ will increase $C_2$ and may be estimated as $$C_2 = C_g + \frac{1}{(2\pi f_{SRF})^2 L_2}, \quad (8)$$

where $f_{SRF}$ is the self resonant frequency of the chip inductor. The parasitic capacitance of the chip inductor and $C_g$ may have comparable values.

The series impedance in the transmission line model due to the parallel combination of $L_2$ and $C_g$ can be expressed as $$Z_s = \frac{j\omega L_2}{1 - \omega^2 L_2 C_2}. \quad (9)$$

Using the expressions of (7) and (9) for lumped shunt and series loads, the dispersion of the EBG structure may be determined. The ABCD network parameters for the equivalent circuit of FIG. 7(b) may be written as $$\begin{bmatrix} A & B \\ C & D \end{bmatrix} = \begin{bmatrix} 1 & 0 \\ 1/Y_s & 1 \end{bmatrix} \begin{bmatrix} \cos(\beta l) & jZ_o\sin(\beta l) \\ jY_o\sin(\beta l) & \cos(\beta l) \end{bmatrix} \begin{bmatrix} 1 & Z_s \\ 0 & 1 \end{bmatrix} \quad (10)$$

$$\begin{bmatrix} \cos(\beta l) & jZ_o\sin(\beta l) \\ jY_o\sin(\beta l) & \cos(\beta l) \end{bmatrix} \begin{bmatrix} 1 & 0 \\ 1/Y_s & 1 \end{bmatrix}$$

where $l=d/2$ and $Y_o=1/Z_o$.

The Bloch theorem in solid state physics refers to the periodic nature of electron waves that propagate in 3D crystalline structures, where the possible wave functions vary only by a complex constant between similar locations in adjacent unit cells separated by an integer number of periods. The name and mathematical approach of Bloch modes or Bloch waves has been adopted to describe the voltage waves that may travel on periodic transmission line structures. The total voltage or current at a reference plane of a unit cell may vary by the complex constant $e^{\pm jk_x x}$, where the frequency-dependent parameter $k_x$ is the Bloch wavenumber. The real component of the Bloch wavenumber models propagating voltages and the imaginary component models evanescent or exponentially decaying voltages. Bloch waves may also be cylindrical functions which may be expressed, for example, as a superposition of exponentials. This may be used to represent a voltage wave launched by changing current in a via that passes through a 2D EBG structure.

The Bloch mode propagation constant γ for waves traveling in the x (or y) direction along an infinite cascade of unit cells can be calculated from the ABCD parameters of one unit cell using the relation $$\gamma = jk_x = \frac{1}{P}\cosh^{-1}\sqrt{AD}. \quad (11)$$

Since the unit cell network is symmetric, A=D. After a few algebraic steps the dispersion equation for the effective wavenumber, or Bloch wave phase constant, $k_x$ becomes $$k_x = \frac{1}{P}\cos^{-1}\left\{\cos(\beta d) + \frac{Y_s Z_s}{4}[1 + \cos(\beta d)] + j\left[\frac{Y_o Z_s + Z_o Y_s}{2}\right]\sin(\beta d)\right\}. \quad (12)$$

The plot of $k_x$ as a function of frequency is known as an ω–β diagram, and graphically presents the electromagnetic passbands and stopbands (also known as bandgaps) along with information about the speed of the wave with respect to the speed of light in the dielectric medium of the PPW.

$jk_x=\alpha_x+j\beta_x$, where $\alpha_x$ is the attenuation constant and $\beta_x$ is the phase constant. The attenuation constant $\alpha_x$ represents the decay rate across a unit cell in nepers/meter as $e^{(-\alpha_x P)}$. In this example, the unit cell circuit model is lossless, as resistance and dielectric and radiation losses were not included so that $k_x$ is either purely a real or a purely imaginary number. For frequencies where $\alpha_x$ is nonzero ($k_x=j\alpha_x$ is purely imaginary), stopbands exist and the wave becomes evanescent. The attenuation per unit cell can be calculated in decibels (dB) using the following relationship:

$$\text{Atten}=20\log[\exp(-\alpha_x P)] \quad (13)$$

Equation (13) may be used to evaluate individual configurations, such as that of FIG. 7(a) where the dielectric layers are a 16 mils thickness of FR4 ($\in_r$=4), the unit cell period is 500 mils, and a gap of 20 mils separates square patches 608; the via 610 has a radius of 10 mils so that $L_1$ is about 0.17 nH; capacitance $C_1$ is a 1000 pF chip cap; and, the inductance $L_2$ is a 10 nH chip inductor exhibiting a minimum $f_{SRF}$ of 3.6 GHz.

Figure 11:
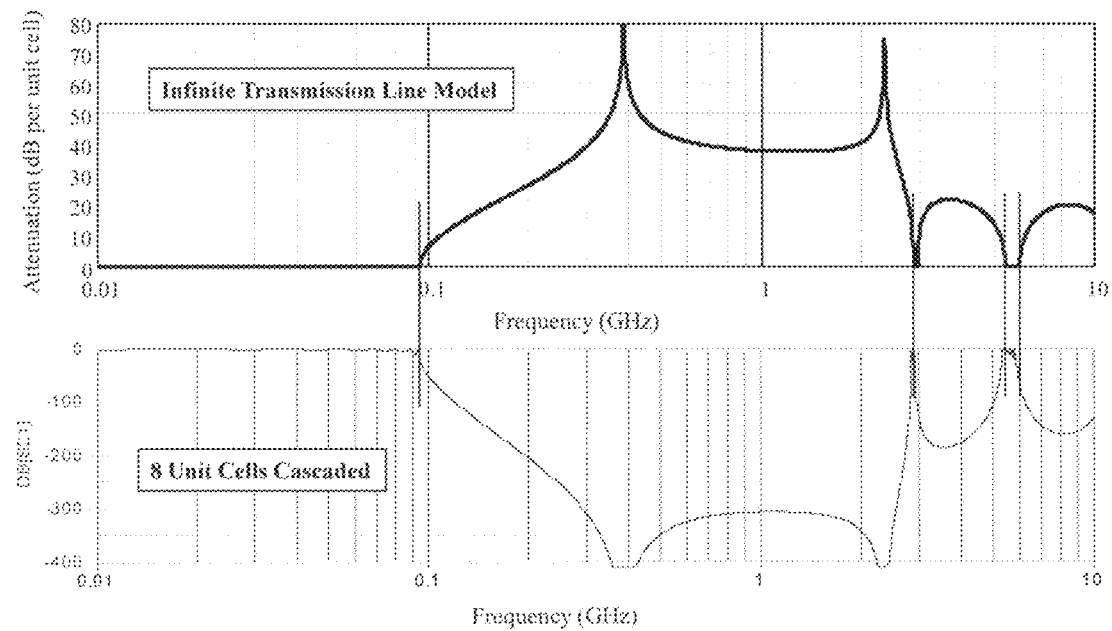
FIG. 11 shows a comparison of computed stopbands for a hybrid EBG structure of FIG. 7(a) using (a) an infinite transmission line model; and, (b) a circuit simulation of the $S_{21}$ transmission through eight cascaded unit cells.

Using the analytical model, the attenuation per unit cell for TEM waves between power and ground planes is plotted of FIG. 11a. The fundamental stopband begins at about 95 MHz and extends up to about 2.9 GHz; this is a bandwidth ratio of greater than about than about 30:1. A secondary stopband extends from about 3 GHz up to about 5.3 GHz. The dielectric loss of the substrate 704 (with a typical loss tangent in FR4 of 0.025), which has not been taken into account in the model described, may result in attenuation in the passband between 2.9 GHz and 3 GHz (3% bandwidth) such that the fundamental and secondary stopbands may appear to have merged. Thus, for this example, the effective stopband may extend from about 95 MHz to about 5.3 GHz. The computed and measured stop bands in many examples presented herein exhibit high attenuation and may exhibit sharp band edges.

The definition of the term "band edge" may vary between persons of skill in the art. For purposes of discussion, the band edge of a bandstop region is considered to be that frequency where the Bloch mode propagation constant transitions from being a purely imaginary value to a purely real value (passband to stopband), or from a purely real value to a purely imaginary value (stopband to passband), in a simulation where the analytic model is lossless. As such, the model is an approximation to the situation where the materials are considered to have ohmic losses.

Figure 12:
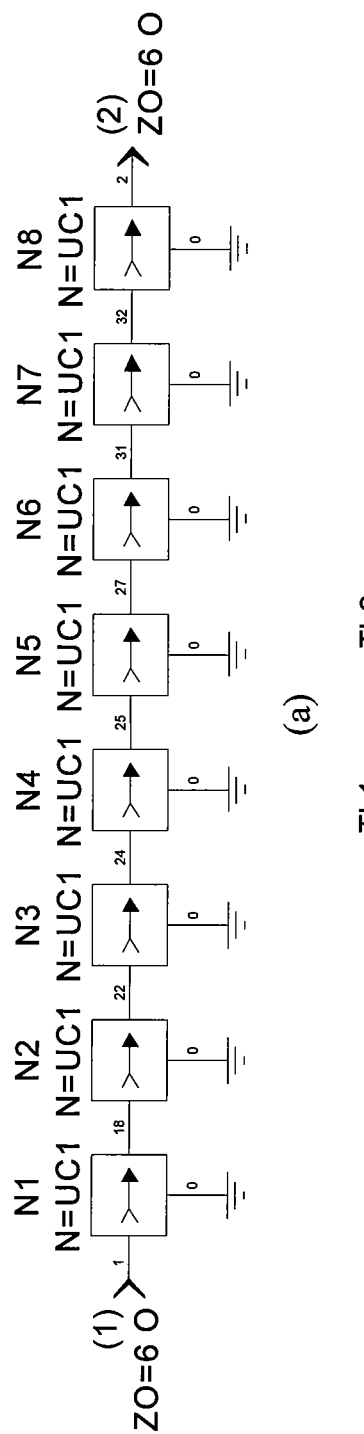
FIG. 12 shows an equivalent circuit for the hybrid EBG structure shown in FIG. 7a for (a) eight cascaded unit cells; and, (b) a detail of each unit cell.
Figure 12:
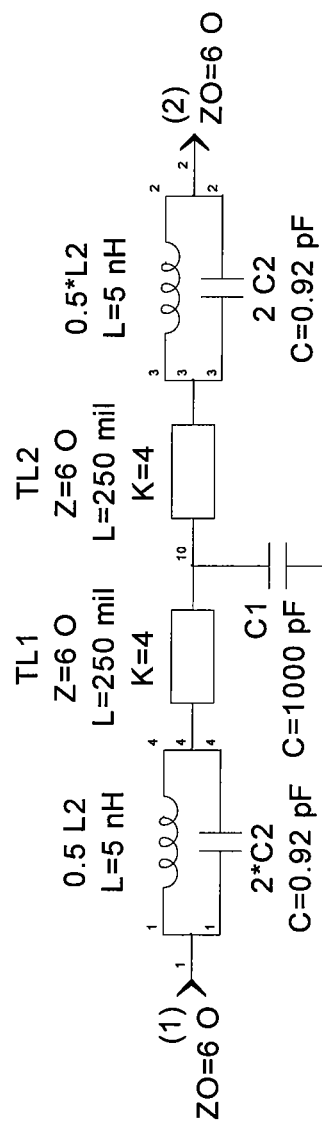

To validate the analytic model, a circuit simulation of the S-parameter transmission coefficient through eight cascaded unit cells was performed. The cascaded circuit is shown in FIG. 12(a), and the unit cell equivalent circuit is shown in FIG. 12(b). A plot of the transmission coefficient $S_{21}$ through all eight unit cells is shown in FIG. 11(b). The passbands and stopbands of the two models have frequency ranges that are in excellent agreement. Furthermore, the analytic model of equation (13) accurately predicts the attenuation level. At a frequency of 1 GHz, the analytic model predicts about 38 dB of attenuation per unit cell, or 304 dB of attenuation over 8 cells. The circuit simulation of eight cascaded cells is in excellent agreement with an $S_{21}$ value near −305 dB. The analytic result of equation (13) assumes an infinitely long transmission line. In practice, the circuit model may agree well with the analytic model for EBG structures with as few as 3 or 4 cascaded unit cells.

Figure 13:
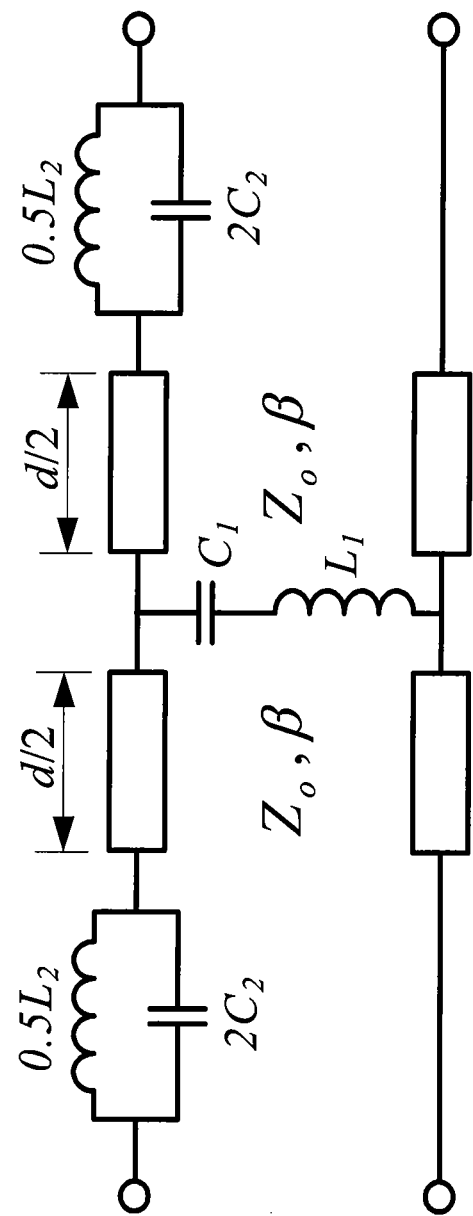

The analytic model is based on the unit cell equivalent circuit shown in FIG. 7(b) where the unit cell boundary coincided with the center of a via. However, the unit cell could be considered to begin and end on the centerline of the gaps between adjacent patches 620. Then the unit cell equivalent circuit for wave propagation in the x or y direction would be the circuit illustrated in FIG. 13. A similar analysis using ABCD parameters will yield the same dispersion equation for $k_x$ as equation (12).

Figure 14:
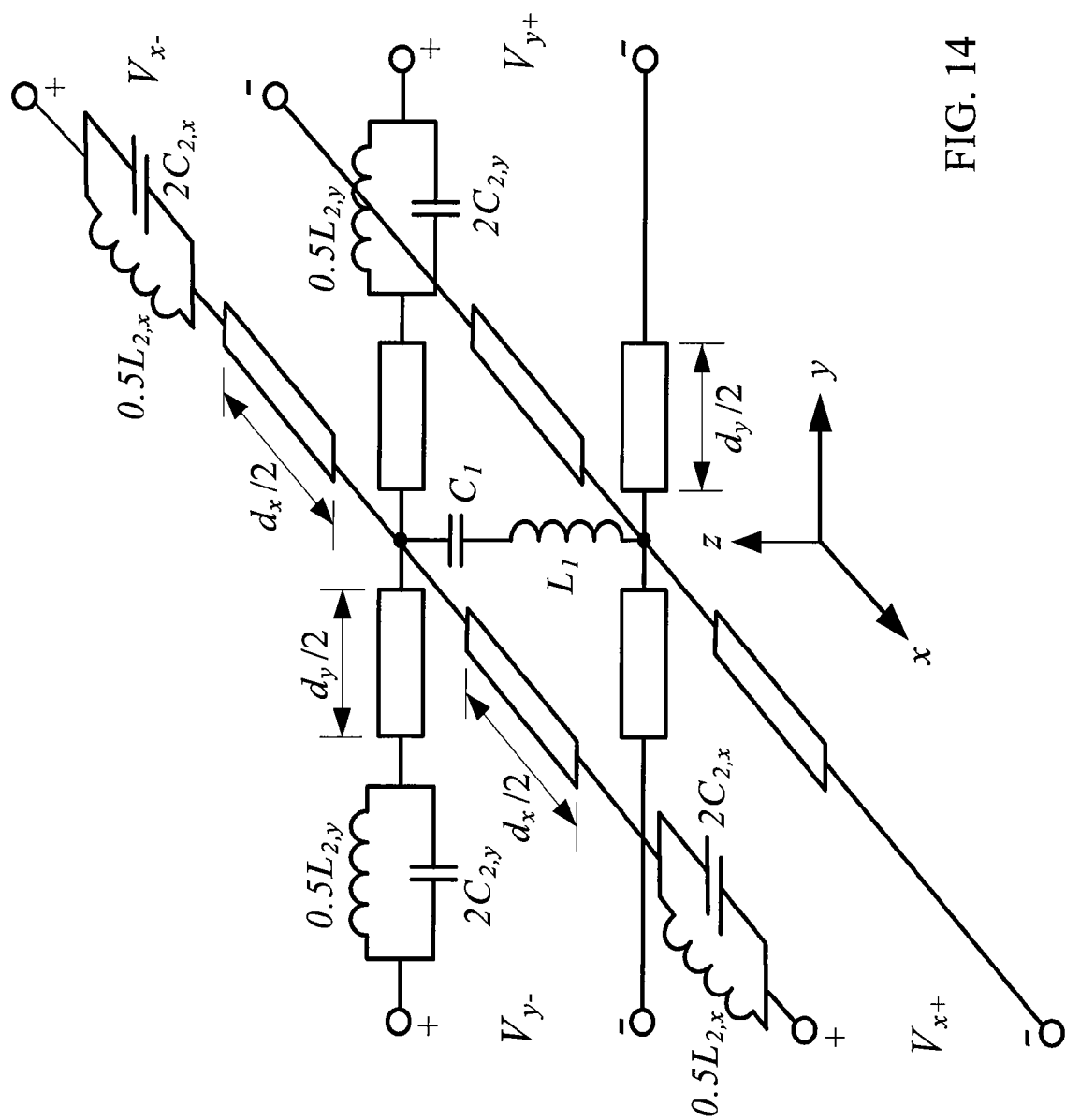
FIG. 14 shows an alternative 2-unit cell equivalent circuit for the two dimensional (2D) hybrid EBG structure shown in FIG. 7a, for a non-isotropic arrangement.

The hybrid EBG structure of FIG. 7(a) is isotropic, such that the unit cell equivalent circuit is the same in both x and y directions, and the stopbands are direction independent in the x-y plane. However, an anisotropic EBG structure with dissimilar stopband behavior for the x and y propagation directions is equally possible. For example, the square patches 608 may be modified to be rectangular patches of dimension $d_x$ by $d_y$. Another way to create an anisotropic structure is to design the inductors 630 such that the inductance $L_{2,x}$ supporting currents flowing in the x direction is different in value from the inductance $L_{2,y}$ supporting the flow of current in the y direction. Also, the gaps between patches 608 may be designed to be different in the x and y directions which would result in the capacitance $C_2$ being direction dependent. An equivalent unit cell for an anisotropic hybrid EBG structure is shown in FIG. 14 where the unit cell boundaries are defined to be the centerline of the gaps between patches.

Explicit formulas for the features of the attenuation curve are useful to gain insight into the design variables and to evaluate performance tradeoffs. At the lower band edge of the fundamental stopband $\omega_c = 2\pi f_c$, or the low frequency cutoff for the fundamental stopband, the value of $k_x$ goes to $\pi/P$. When the frequency of operation is low enough, the patch dimensions are small with respect to the wavelength of a TEM mode traveling across the patch in the dielectric and $\beta d \ll 1$. Under these conditions the dispersion equation (12) reduces to approximately $$-1 = 1 + \frac{Y_s Z_s}{4}(1+1) + j\left[\frac{Y_o Z_s + Z_o Y_s}{2}\right]\left(\frac{\omega_c}{c}\sqrt{\varepsilon_r}\,d\right). \quad (14)$$

Terms on the right hand side of equation (14) may be expressed using equation (4):

$$\frac{Y_o \sqrt{\varepsilon_r}\, d}{c} = \frac{\varepsilon_r \varepsilon_o d^2}{h} = C_p \quad (15)$$

$$\frac{Z_o \sqrt{\varepsilon_r}\, d}{c} = \mu_o h = L_p \quad (16)$$

The variable $C_p$ represents the parallel-plate capacitance to ground for the square patch 608 in FIG. 7(a). The variable $L_p$ represents the inductance per unit length for a TEM mode in a parallel-plate waveguide. Substituting equations (15) and (16) into the dispersion equation (14) along with expressions (7) and (9) for $Y_s$ and $Z_s$, the dispersion equation becomes $$-4 = \frac{-\omega_c L_2 C_1}{(1 - \omega_c L_1 C_1)(1 - \omega_c L_2 C_2)} + j\omega_c\left(\frac{j\omega_c L_2 C_p}{1 - \omega_c L_2 C_2} + \frac{j\omega_c L_p C_1}{1 - \omega_c L_1 C_1}\right). \quad (17)$$

Hence the low frequency cutoff may be expressed as $$\omega_c = \sqrt{\frac{-b - \sqrt{b^2 - 4ac}}{2a}}, \quad (18)$$

where the minus sign has been selected since the smaller root is needed. The variables for the solution of equation (18) are $$a = L_2 C_1 (4 L_1 C_2 + L_1 C_p + L_p C_2) \quad (19a)$$

$$b = [(4L_1 + L_2 + L_p)C_1 + L_2(4C_2 + C_p)] \quad (19b)$$

$$c = 4 \quad (19c)$$

In the model, six variables may affect the cutoff frequency. Consider the example of FIG. 10 where $L_1 = 0.17$ nH, $L_2 = 10$ nH, $L_p = 0.51$ nH, $C_1 = 1000$ pF, $C_2 = 0.45$ pF, and $C_p = 13.5$ pF. If the relationships of $L_2 \gg L_1$, $L_2 \gg L_p$, $C_p \gg C_2$, $C_1 \gg C_p$ are valid, then $$f_c \cong \frac{1}{2\pi}\sqrt{\frac{1 - \sqrt{1 - 16\frac{L_1 C_p}{L_2 C_1}}}{2 L_1 C_p}}, \quad (20)$$

and a further simplification and approximation for the cutoff frequency of equation (18) is $$f_c \cong \frac{1}{\pi\sqrt{L_2 C_1}}. \quad (21)$$

The exact value of $f_c$ from equation (18) without approximations is 94.57 MHz. The approximation of equation (21) yields 100.66 MHz, an error of 6.1%. The approximate formula for $f_c$ is substantially independent of the unit cell size.

The engineering analysis was validated by fabricating EBG structures and experimentally measuring the relevant properties. For example, a two layer PCB shown in FIG. 15 where the power and ground planes are opposite sides of an 18 mil thick FR4 substrate; the PCB size was 5 inches square, and the EBG structure was a 5×5 array of cells where P=1000 mils, g=20 mils, and the via radius r=10 mils. The lumped loads were surface mount technology (SMT) components where $L_2 = 12$ nH and $C_1 = 10{,}000$ pF. Three coaxial probes for ports 1, 2, and 3 couple power into the EBG structure at approximate locations of (x, y)=(4.75, 2.75), (0.25, 2.75), and (2.25, 0.25) inches, respectively, where the origin is referenced as the lower left hand corner of the PCB shown in FIG. 15(a). The coaxial probes were flange mounted SMA connectors whose center conductors were soldered to the power plane patches as shown in FIG. 15(a) and whose flanges are soldered to the ground plane as shown in FIG. 15(b).

Figure 15:
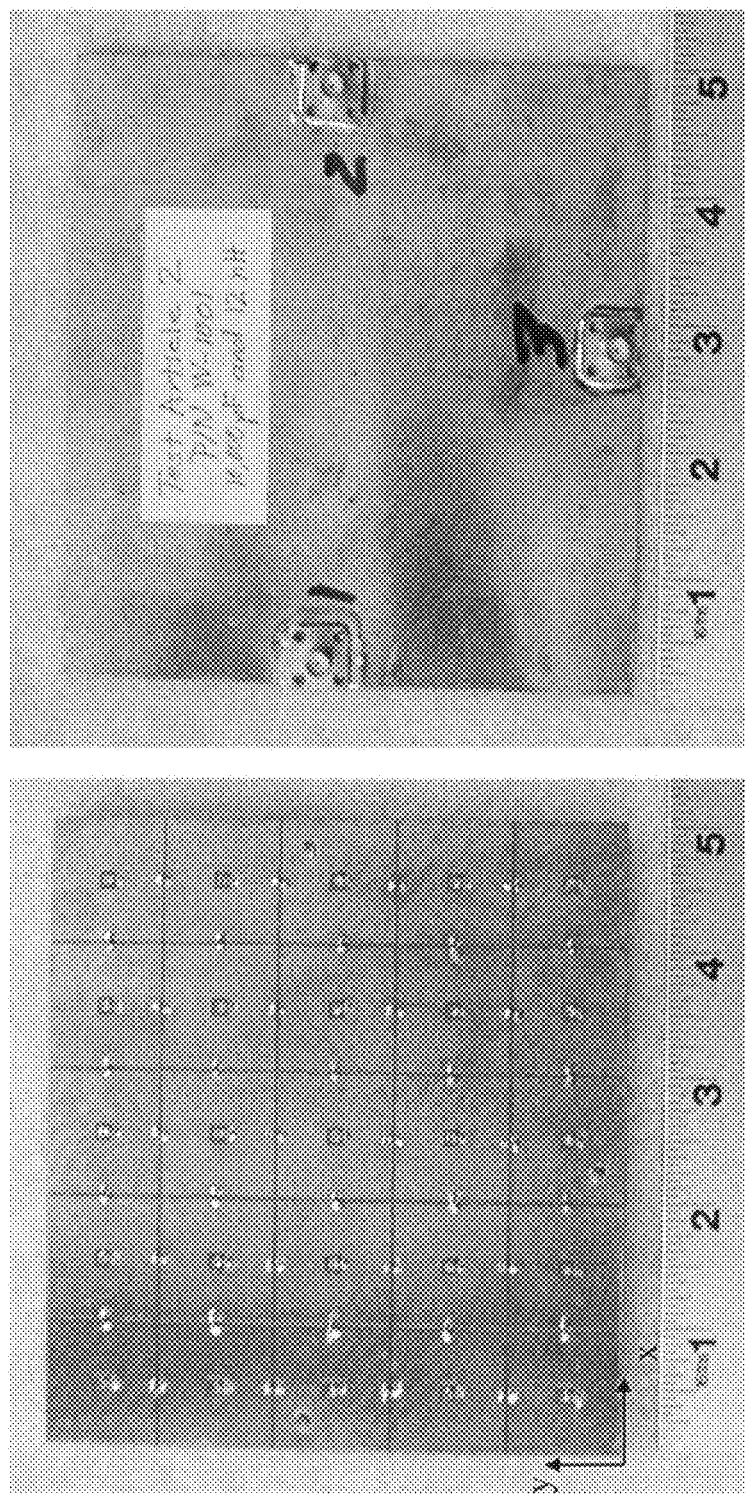
FIG. 15 shows front and back views of a hardware implementation of an example hybrid EBG structure of FIG. 7a having a dielectric layer formed from 18 mil FR4, with a 1" period and 20 mil gaps between patches; 12 nH muRata chip inductors (Digikey P/N 490-1170-ND) bridge each gap (40 PL) and 10,000 pF chip caps (Panasonic P/N PCC103BNCT-ND) at each via (25 PL)
Figure 16:
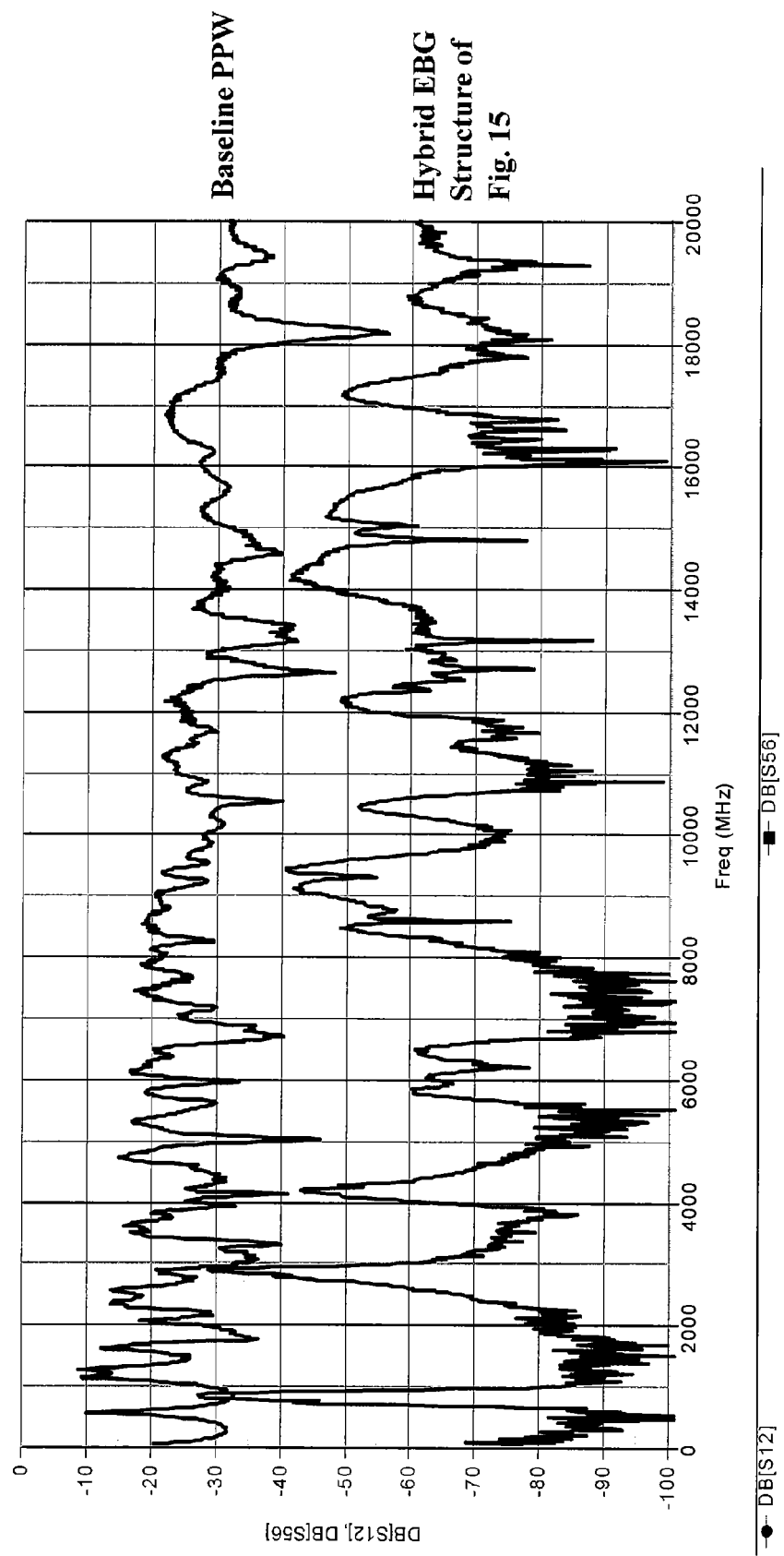
FIG. 16 shows measured coupling between ports 1 and 2 for the device shown in FIG. 15.
Figure 17:
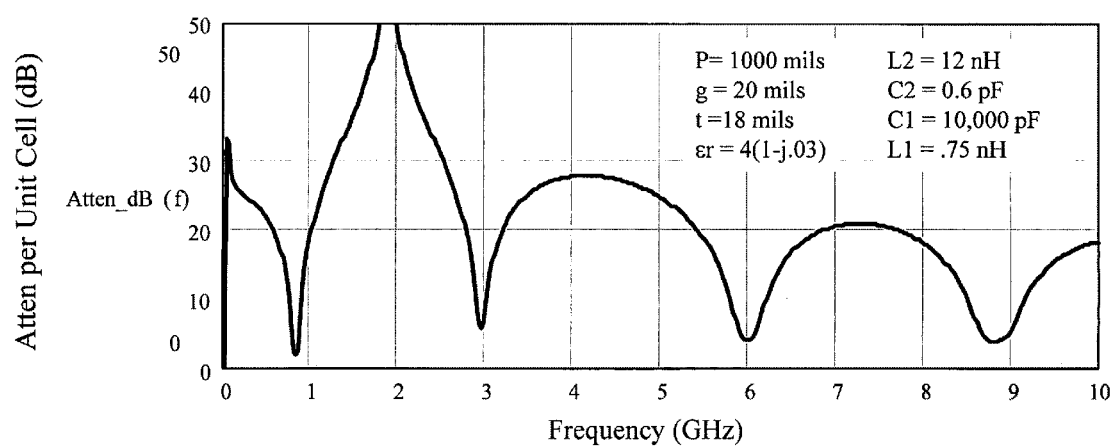
FIG. 17 shows the computed attenuation per unit cell for the device shown in FIG. 15.

The example of FIG. 15 was measured for probe-to-probe coupling in a 50 ohm test setup using an HP8720 network analyzer (available from Agilent Technologies, Palo Alto, Calif.). Results for $S_{21}$ are plotted in FIG. 16 over the frequency range extending from 50 MHz to 20 GHz. For comparison purposes, a baseline case of a PPW with the same dimensions as that in FIG. 15 and a FR4 dielectric was also fabricated and tested, where the power plane was a solid (non-etched) metal layer. The baseline measurement (upper trace of FIG. 16) shows multiple power plane resonances that appear to be fairly high Q (narrowband), especially below 2 GHz, where power loss due to radiation may be minimal. The lower trace is S21 for the hybrid EBG structure. Significant suppression of PPW modes is seen from at least 50 MHz up to at least 8 GHz. (The lower frequency limit of the network analyzer used was 50 MHz for all measurements presented herein.) The predicted attenuation plot of $S_{21}$ in dB per unit cell is shown in FIG. 17. In this computation, a loss tangent of 0.03 was used for the substrate dielectric (FR4), which accounts for the predicted passbands showing nonzero attenuation.

The predicted value of $f_c$ for the fundamental stopband is 25.4 MHz, which is in agreement with the measured data taken down to 50 MHz. The measured fundamental stopband extends from below 50 MHz to about 850 MHz where a very narrow passband is observed, which corresponds to that which was predicted. $L_1$ in the unit cell model was increased slightly to 0.75 nH to account for parasitic inductance of $C_1$, and this adjustment does affect the center frequency of the first passband.

The secondary stopband extends from about 900 MHz to about 3 GHz where another narrow passband is measured and predicted. This second passband is an insensitive function of $L_1$. Measured $S_{21}$ levels in the passbands near 900 MHz and 3 GHz are suppressed by 15 to 20 dB below the baseline peak levels due to losses in the unit cell, including dielectric losses in the FR4 substrate. Also, a suppressed spurious response is noted near 4.2 GHz, which is attributed to a parasitic resonance mode of the patches and was not predicted by the dispersion equation. However, the dispersion model based on a unit cell equivalent circuit appears to accurately predict stopbands up to at least the third stopband. Since the measured passbands are narrow and attenuated relative to the baseline peaks, this hybrid EBG structure may effectively suppress PPW modes from at least below 50 MHz to above 8 GHz.

Figure 18:
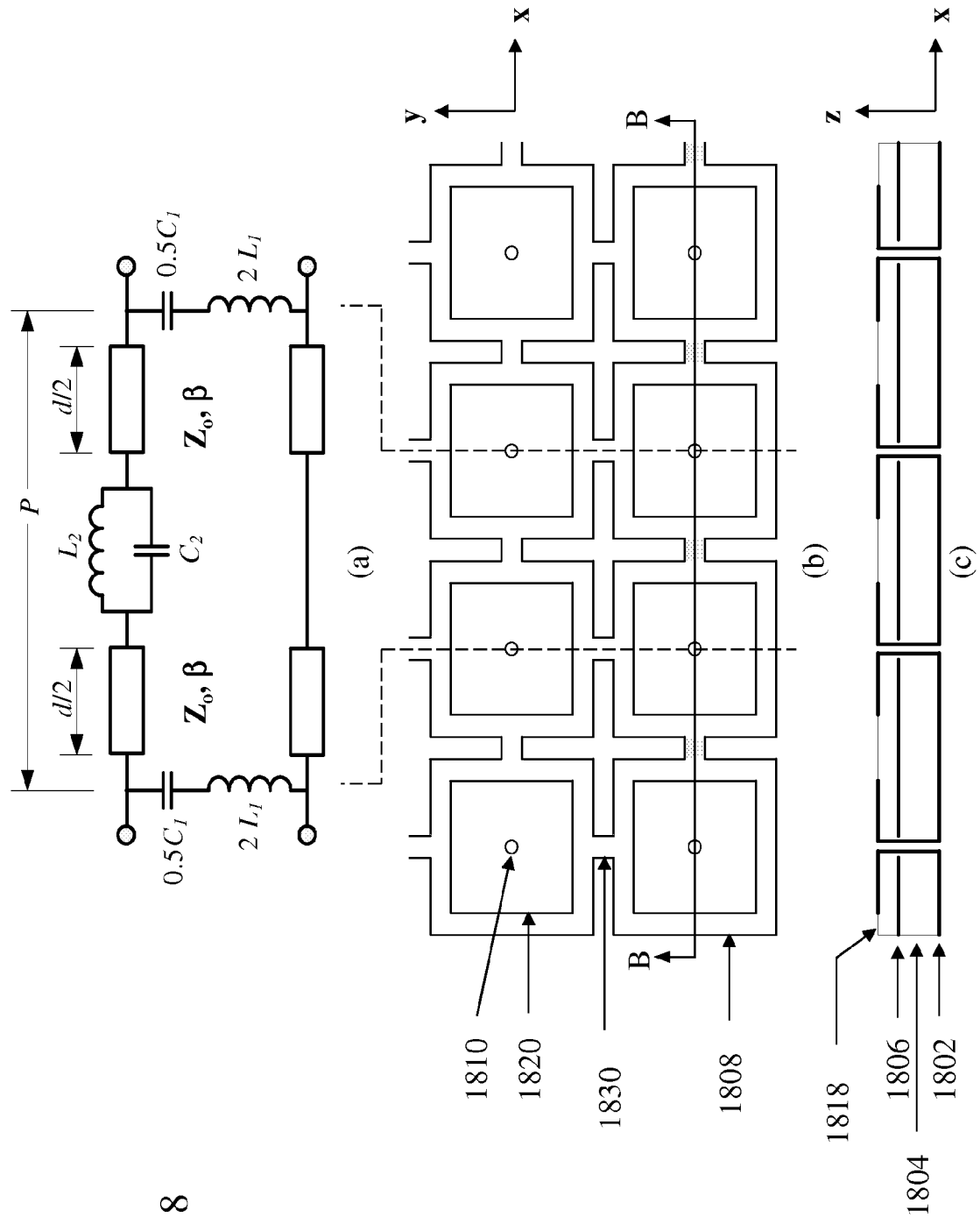
FIG. 18 shows a second example of a hybrid EBG structure having printed circuit elements, where: (a) is the equivalent circuit; (b) is a plan view; and, (c) cross-sectional view at section B-B in a 3 layer printed wiring board.

A second example of a 2D hybrid EBG structure is shown in FIG. 18 where only printed circuit elements are employed. A three layer printed wiring board is used for this example since the capacitive patches 1820 are not coplanar with the power 1806 or ground planes 1802. However, the capacitive patches 1820 may be located, for example on a signal layer.

The unit cell equivalent circuit for this example has the same topology as the first example, but values of $C_1$ and $L_2$ are typically less than that when using lumped SMT components, so the stopbands may not be as low in frequency. However the cost to produce this example may be less than for the first example.

The resonant vias are capacitive patches 1820 connected to the top end of the vias 1810 that extend down to, and connect to, the ground plane 1802. This resonant via structure may be termed external-T resonant via since the capacitive patch 1810 is external to the pair of the power plane 1806 and ground plane 1802. Alternatively, an internal-T resonant via could be used whereby the capacitive patch 1820 is located between the power and ground planes. In FIG. 18, the value of capacitance $C_1$ will be substantially the parallel-plate capacitance defined by the area of patch 1820 and the dielectric constant of the upper dielectric layer 1818. The value of $L_2$ is established by the printed inductive traces 1830 that connect adjacent power plane patches 1806. Longer and narrower traces would increase the inductance of $L_2$.

Figure 19:
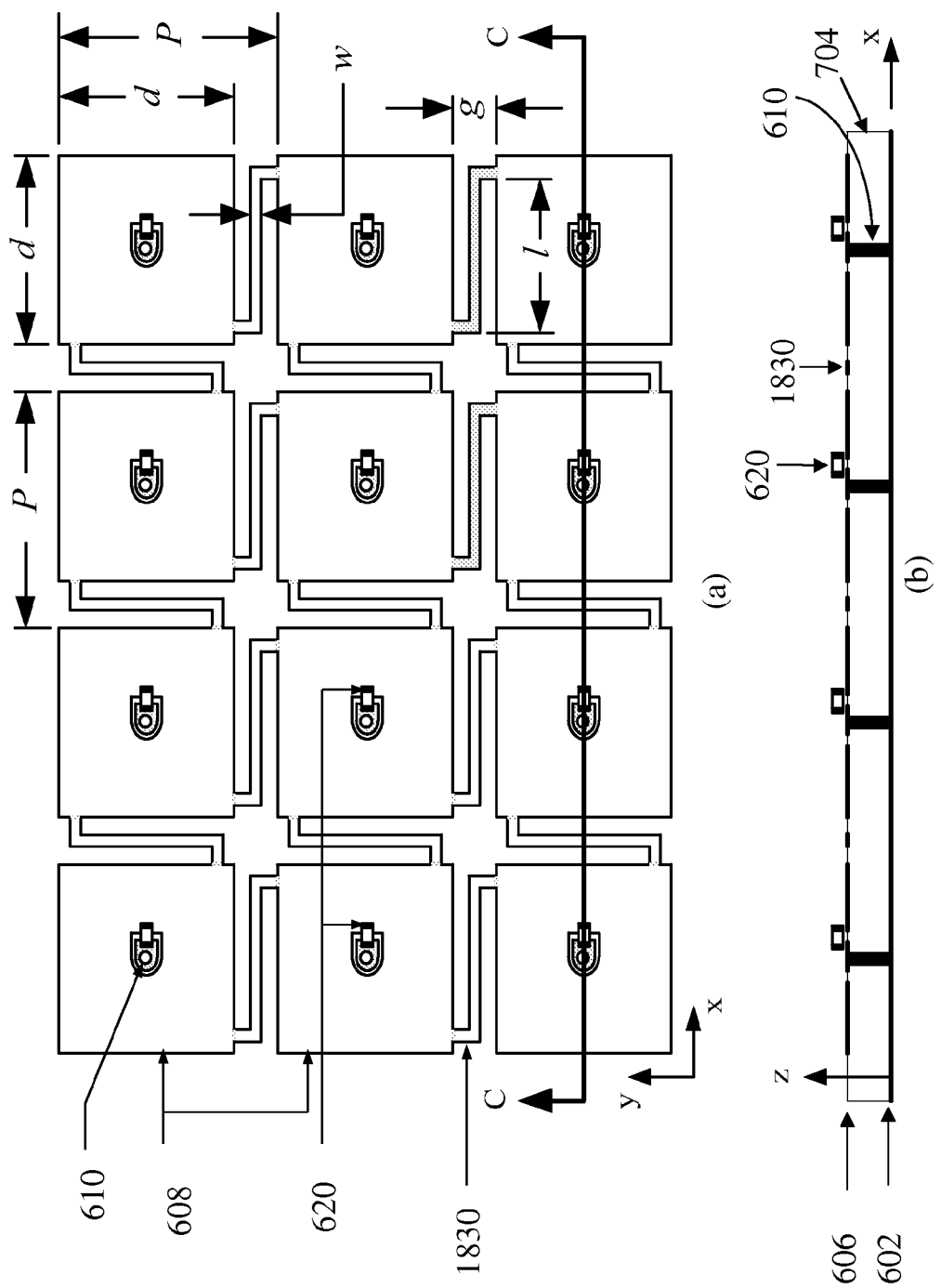
FIG. 19 shows a second example of a hybrid EBG structure that employs chip capacitors for C1 and printed traces for L2 where: (a) is plan view; (b) is a cross-sectional view, in a two-layer printed wiring board.

A third example of a 2D hybrid EBG structure is shown in plan view in FIG. 19a. The unit cell equivalent circuit is given by FIG. 7(b) but, in this example, capacitor $C_1$ 620 is realized with chip capacitors and value of $L_2$ is established by the printed inductive traces 1830. These inductive traces 1830 are in the form of L-bridges. However, any meandering trace may be used to realize the inductance $L_2$. As this example does not use chip inductors for the inductance between patches, more PCB area is needed for meandering traces to form equivalent value inductive traces 1830 when compared with chip inductors. FIG. 19(b) shows the cross sectional view of the third example, where a two layer PCB is used. Chip capacitors 620 are mounted directly to the power plane 606.

Figure 20:
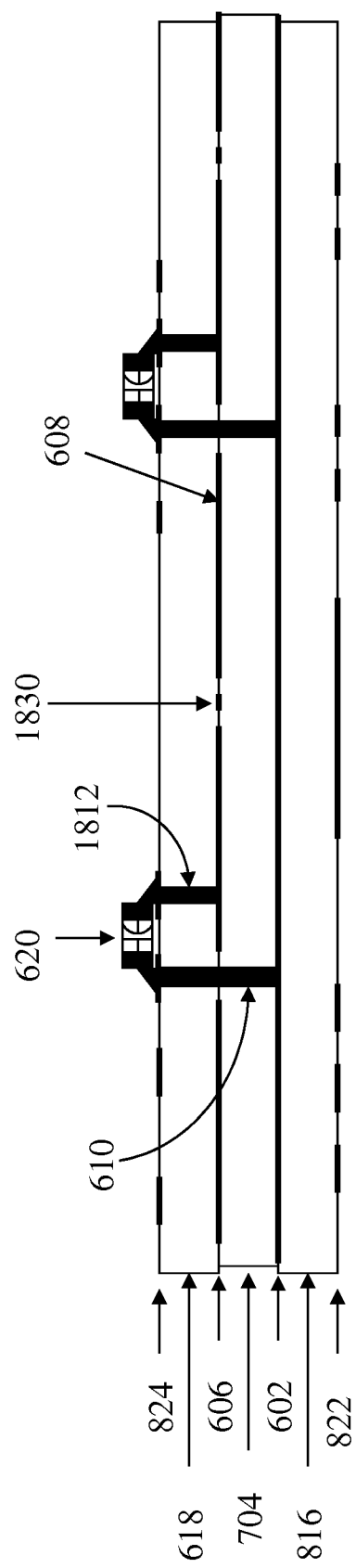
FIG. 20 shows a cross-sectional view of the hybrid EBG structure of FIG. 19 in a four-layer printed wiring board.

FIG. 20 illustrates an alternative arrangement of the third example where a four layer PCB is used. The chip capacitors 620 are mounted on a signal layer 824 and connected by vias 1812 and 610 to the power and ground planes respectively. The inductive traces 1830 are coplanar with the power plane patches 608 as both reside on the power plane 606.

Hybrid EBG structures with lumped constant SMT components for $C_1$ and $L_2$ may be used to reduce the unit cell size, and spatially local uses of a 2D hybrid EBG structure may be used on only portions of a printed wiring board.

Figure 21:
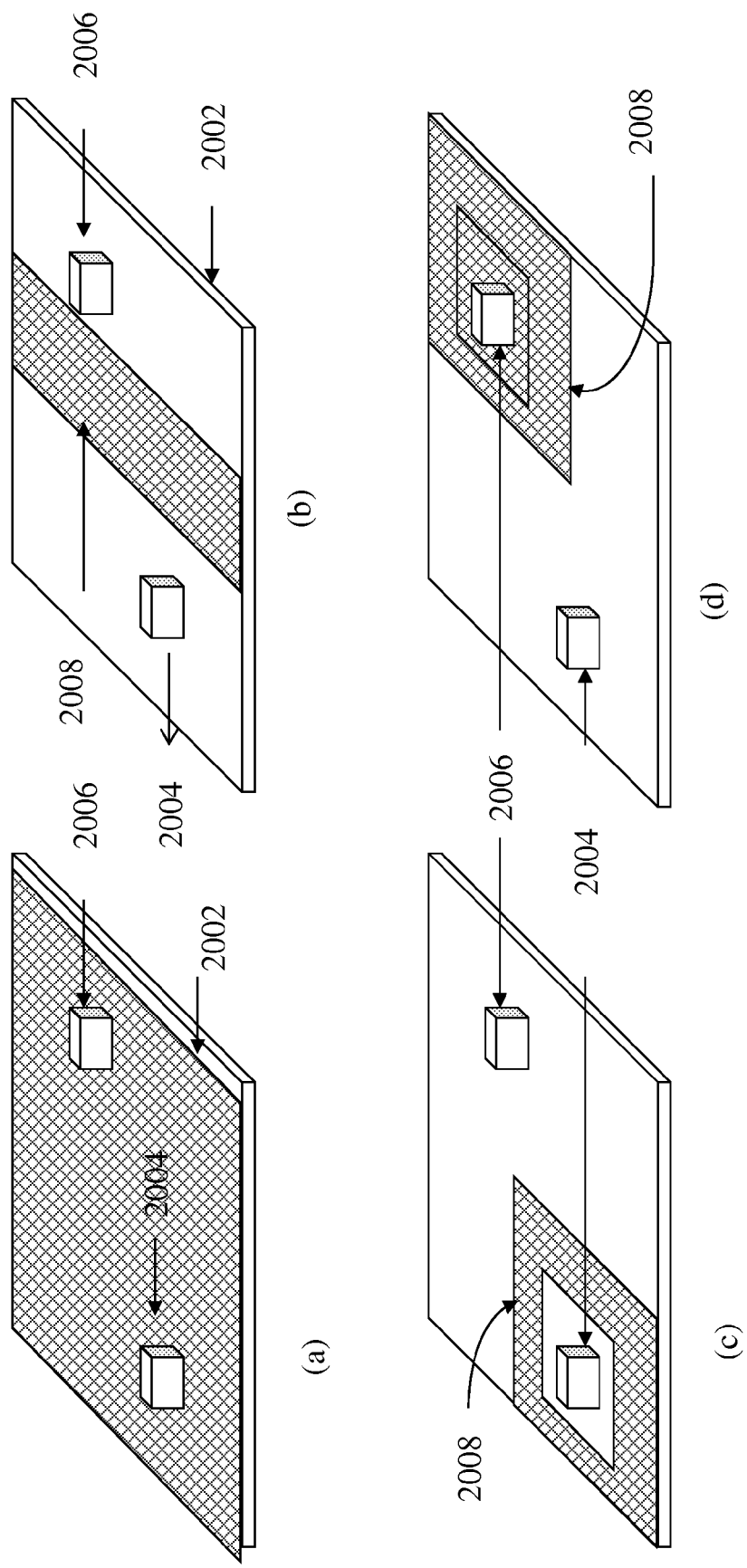
FIG. 21 shows examples of the combination of a omni-directional (2D) EBG structure into the power distribution system of a printed wiring board.

FIG. 21 illustrates several alternative board configurations using hybrid EBG structures in the power distribution system of, for example, a printed wiring board. In an aspect, the power distribution system may be comprised of power and ground planes that substantially cover the entire printed wiring board 2002 as shown in FIG. 21a. The hatched area represents the area occupied by the EBG structure 2008. An electromagnetic noise source 2004 may be located on the printed wiring board 2002 in relation to a sensitive noise component 2006. In another aspect, a noise fence as shown in FIG. 21b may be used. In yet another aspect, the hybrid EBG structure 2008 may be disposed around the noise source 2004 as an electromagnetic barrier as shown in FIG. 21c. In a further aspect, the hybrid EBG structure may be used as an electromagnetic barrier to surround the noise sensitive component as shown in FIG. 21d. In these examples, the 2D hybrid EBG structure may be designed to have an omnidirectional stopband behavior, and the EBG structure is substantially isotropic.

Figure 22:
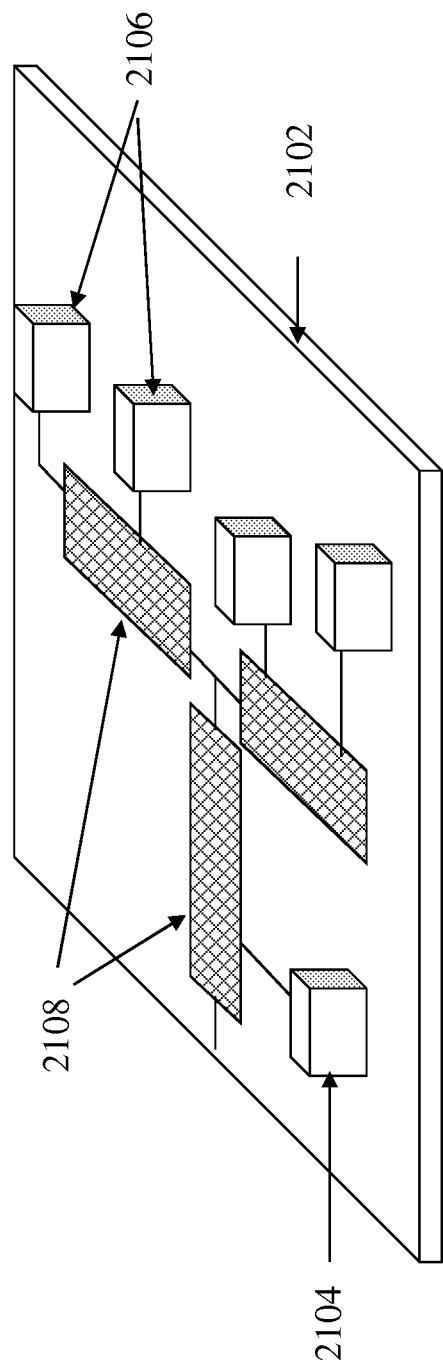
FIG. 22 shows a one dimensional (1D) hybrid EBG structure used as a power bus in a printed wiring board.

Anisotropic EBG structures that suppress wave propagation in one preferred direction only are also possible. An example is shown in FIG. 22 where a 1D hybrid EBG structure 2108 is used to supply power to both a noise source 2104 and noise sensitive components 2106. The power distribution system is comprised of relatively narrow power planes, or power busses, that are the same width as the EBG structure. The EBG structure 2108 provides for noise suppression in a direction along the longitudinal direction of the power bus.

Noise sources and noise sensitive components are not limited to digital devices. Many RF subsystems such as amplifiers, oscillators, mixers, phase locked loops, and the like, may have power supply decoupling using hybrid EBG structures.

Figure 23:
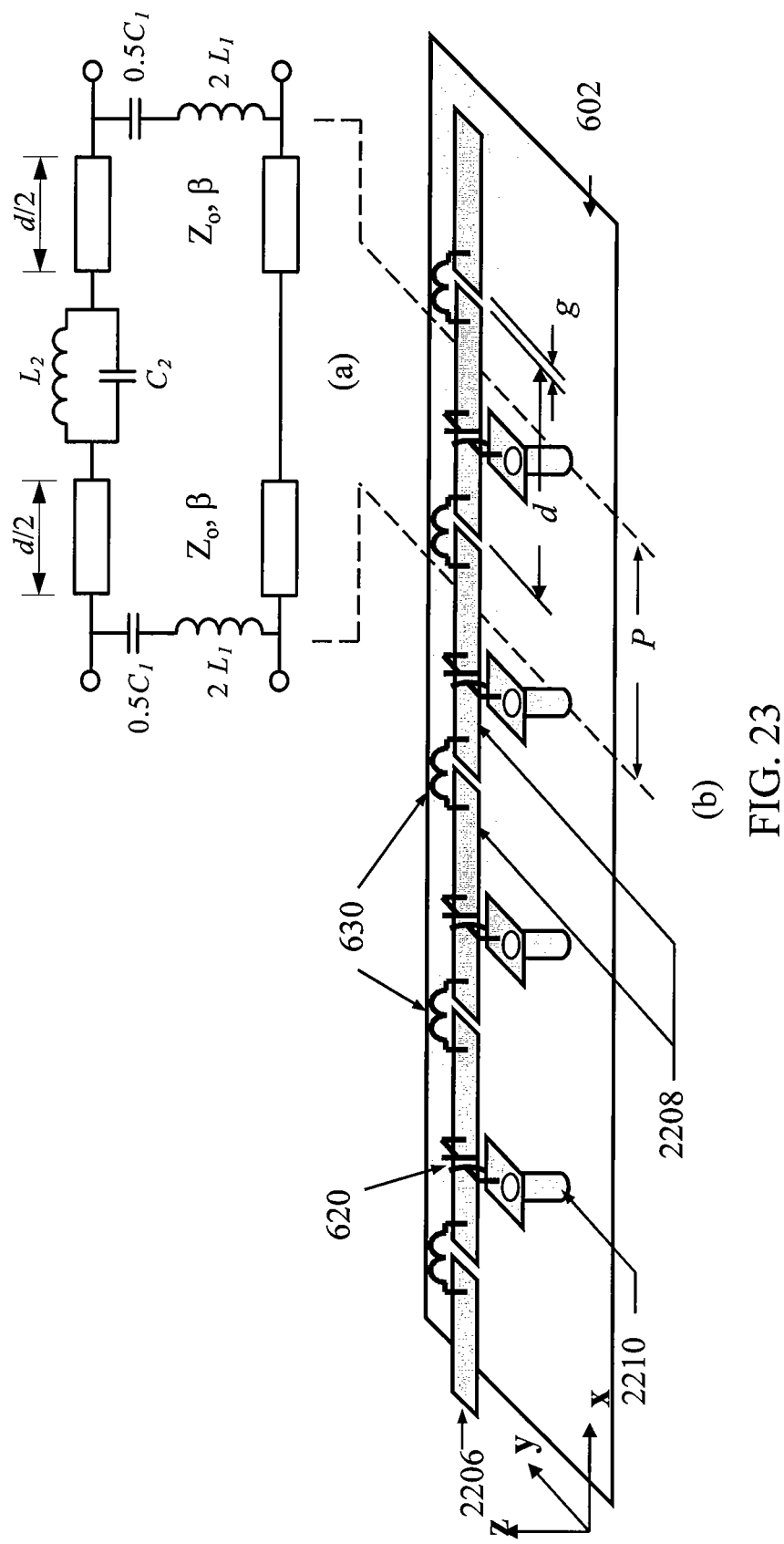
FIG. 23 shows an example of a one dimensional (1D) hybrid EBG structure using SMT capacitors and inductors, where: (a) is unit cell equivalent circuit; and (b) is a perspective view.

In a fourth example, a one-dimensional hybrid EBG structure is shown in FIG. 23. This example has some similarity to FIG. 7a, however there is only one row of conductive patches 2208 that, when connected by inductances 630, comprise a path for DC current to flow. The present example has a power bus 2006 that has been subdivided into a linear array of coplanar conductive patches 2208. The patches are illustrated as rectangles but, in general, they may be any polygonal shape. Conductive patches 2208 are electrically connected together in substantially one direction with inductances 630, to form a periodic or quasi-periodic circuit with period P. The inductances may be realized in various forms including chip inductors, air core coils, or printed traces. As printed traces, the inductances 630 may be coplanar with the power plane 606, or the traces may lay out-of-plane. When designing a circuit, segments of linearly disposed EBG structures may be connected together with angular offsets or linearly to route the power to the desired components.

In the example of FIG. 23, a resonant via connects each conductive patch 2208 to the ground plane, in a periodic or quasi-periodic manner. In this example, the metal layers form the power bus 2206 and the ground plane 602. The resonant vias may be comprised of via 2210 that connects the ground plane 602 to a via pad that is coplanar with the conductive patches 2208, and a capacitor 620 that connects the via pad to a conductive patch 2208. The via 2210 and capacitor 620 form shunt LC circuits to periodically load the power bus. The via 2210 may be a conventional drilled and plated hole, a vertical rivet, rod, post, pressed pin, a wire, or the like, that permits an electrical current to flow from the level of the ground plane to the level of the power plane. The inductance $L_1$ of via 2210 may be augmented, for example, with a meandering trace or an SMT inductor placed in series with the via. Vias described in the other examples may be of the same form as in this example.

The inductance of via 2210 is designated $L_2$ and is illustrated to have a circular cross section, but it may have any cross-sectional shape or even multiple cross-sectional shapes that yield a desired inductance. The capacitor 620 may be a lumped element such as a chip capacitor, an interdigital capacitor, a printed patch, or the like, located in close proximity to the conductive patch 2208.

FIG. 23(a) illustrates a unit cell equivalent circuit for this example, and has the same circuit topology as the unit cell equivalent circuit used for the 2D hybrid EBG structure. However, for this 1D hybrid EBG example, the transmission line structure is a microstrip. The characteristic impedance $Z_o$ and inductance $L_1$ are computed using different formulas which may be similarly derived.

Figure 24:
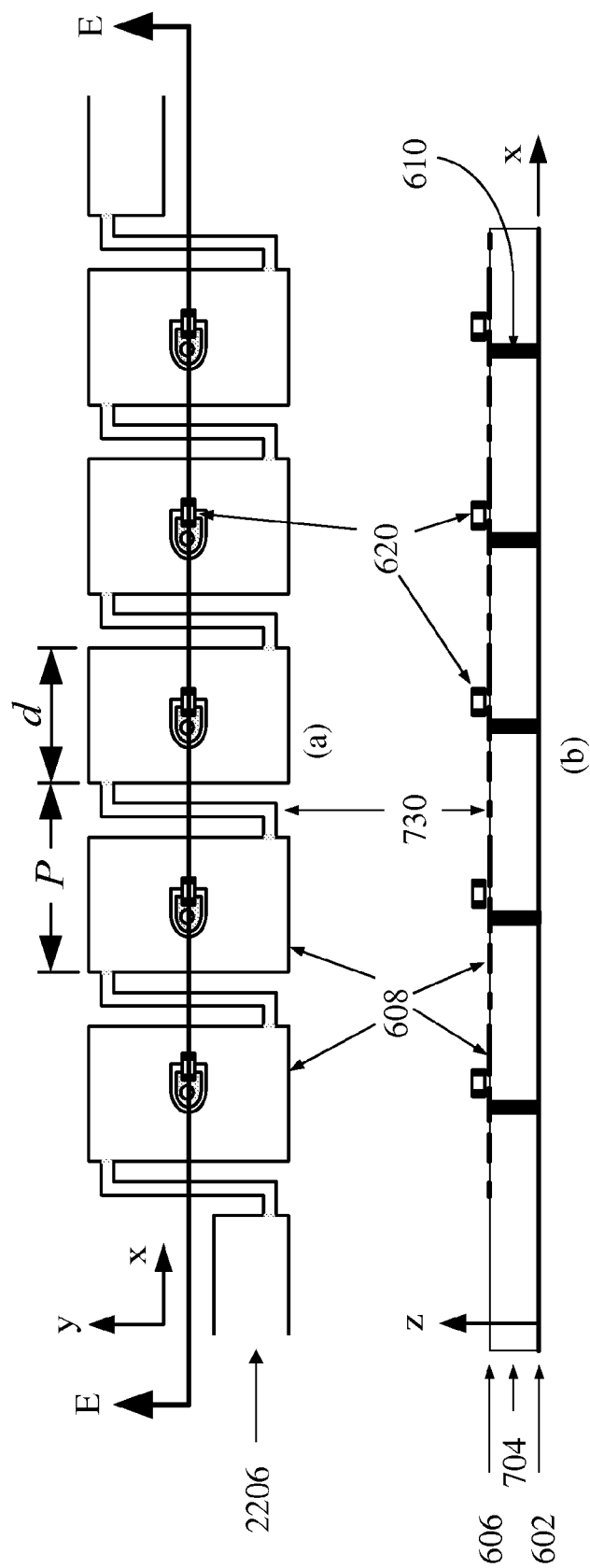
FIG. 24 shows an example of a one-dimensional (1D) hybrid EBG structure using chip capacitors for C1 and printed traces for $L_2$, where: (a) is a plan view; and (b) is a cross-sectional view at section E-E in a two-layer printed wiring board.

Another 1D hybrid EBG structure is shown in FIG. 24 as a fifth example, where the series inductances 630 of FIG. 23a are realized using printed L-bridges or, for example, printed meander lines 730. Power bus 2206 may be a substantially linear array of coplanar patches 608 interconnected by coplanar printed inductive traces 730. Resonant vias form shunt circuits to ground and are comprised of vias 610 connecting the ground plane 602 to via pads on layer 606. The pads, in turn, connect to chip capacitors 620 which are also connected to the patches 608. More PCB area is needed for meandering traces to form inductive traces 730 relative to using chip inductors 630. FIG. 24(b) shows the cross-sectional view of the fifth example where a two layer printed wiring board is used. Chip capacitors 620 are mounted directly to the patches 608.

Figure 25:
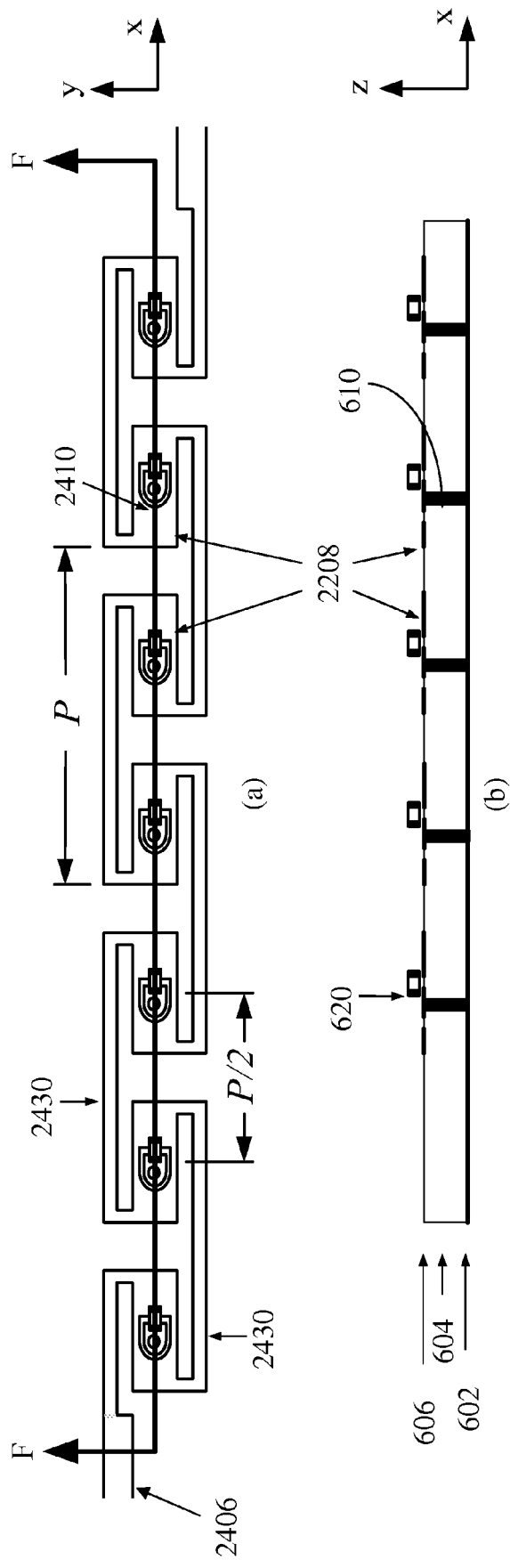
FIG. 25 shows an example of a one-dimensional (1D) hybrid EBG structure using chip capacitors for C1 and printed traces for $L_2$, where: (a) is a plan view; and, (b) is a cross-sectional view at section F-F in a two-layer printed wiring board.

FIG. 25(a) shows a sixth example of a hybrid EBG structure. This is similar to the fifth example of FIG. 24(a), however the longitudinal axis of the inductive traces 2430 are oriented parallel to the linear axis of the power bus. In addition, the inductive traces 2430 are connected at opposite ends of adjacent conductive patches 2208 which allows the inductive traces to be increased in length without substantially increasing the overall width of the power bus. In this example, the power bus is a continuous meandering microstrip line, with portions of the microstrip line narrowing to emulate a series inductance. Shunt LC circuits comprised of vias 610 in series with chip capacitors 620 periodically load the meandering microstripline.

The area of conductive patches 2208 in this example may be smaller than the patches 2608 of the example in FIG. 24(a), but the loss in the value of parallel-plate capacitance $C_p$ is typically small compared to the value $C_1$ of the chip capacitor 620.

FIG. 25b shows a cross-sectional view of the sixth example as a two layer printed wiring board. Chip capacitors 620 are surface mounted to the power bus 606. However, in alternative embodiments, the power bus of FIG. 25(a) may be embedded within interior layers of a multi-layered printed wiring board, and vias may be used to route the connections between the chip capacitor 620 and the interior power and ground traces.

Figure 26:
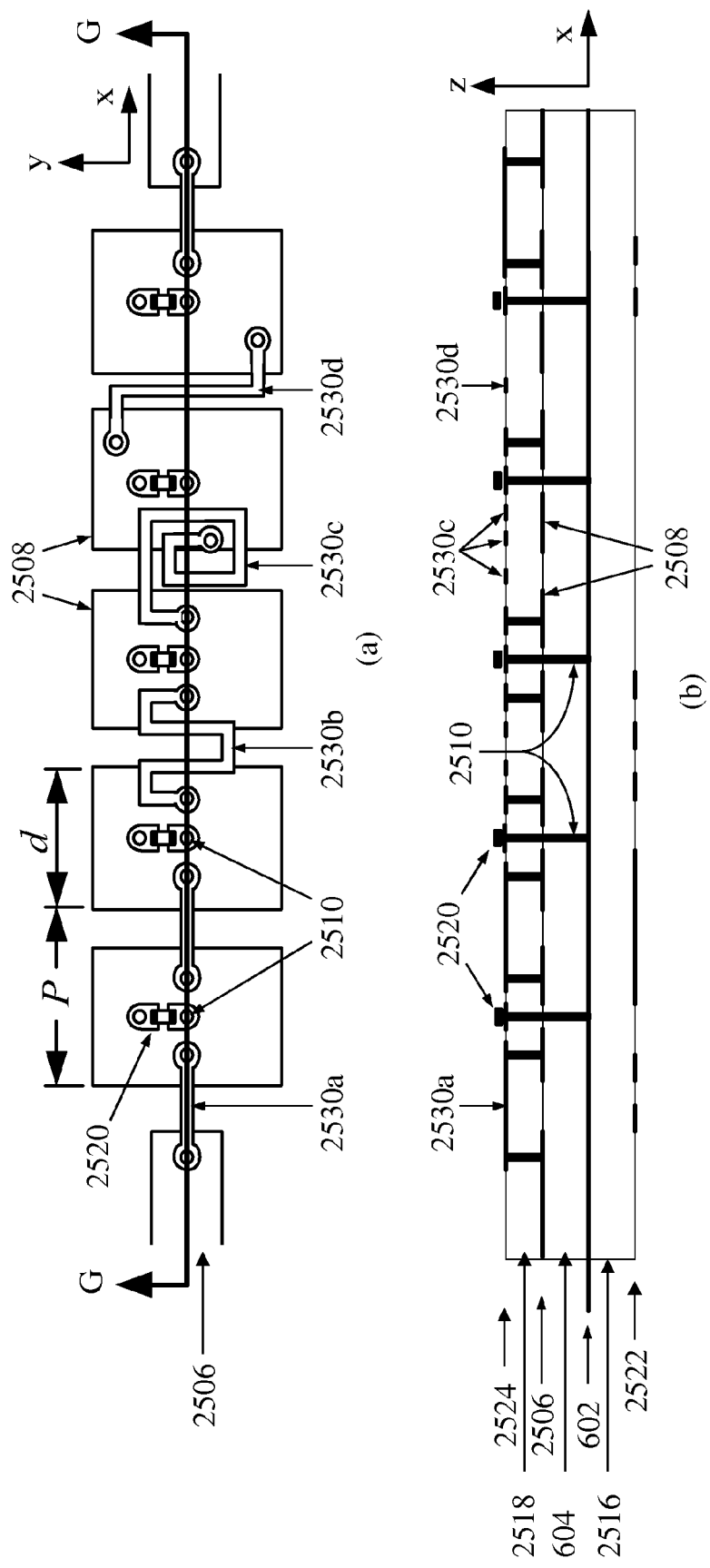
FIG. 26 shows an example of a one-dimensional (1D) hybrid EBG structure using chip capacitors for C1 and printed traces for $L_2$, where: (a) is a plan view showing different options for out-of-plane inductive traces; and, (b) is a cross-sectional view at section G-G in a four-layer printed wiring board.

A seventh example is the 1D hybrid EBG structure shown in FIG. 26. It is similar to the fourth example, shown in FIG. 23(a), and may be represented by the same equivalent circuit as that shown in FIG. 23(b). However, the present example has series inductances between patches that are realized as printed traces 2530 a-d on a signal layer 2524 located out-of-plane relative to the power bus layer 606 or the ground layer 602. Out-of-plane inductive traces may result in an increase the value of series inductance L2. The traces may be extended in physical length and may be located more distant from metal pads on adjacent layers, thereby increasing the loop area available for magnetic flux lines to encircle the inductive traces.

Various configurations of inductive traces may be used to realize the series inductance $L_2$. FIG. 26(a) illustrates four different inductive trace designs where the ends of each trace are connected by vias to contiguous patches 2508 of the power bus. Inductive trace 2530a is a straight trace. Trace 2530b is a meander line where the meandering direction is transverse to the longitudinal axis of the power bus. Trace 2530c is a spiral shape, and trace 2530d is an L-bridge.

The series inductances 630 in the 2D hybrid EBG structure of FIG. 7(a), for example, may be realized using any one or more of the of out-of-plane printed inductors illustrated in FIG. 26 for the 1D hybrid EBG structure. Furthermore, for both 1D and 2D hybrid EBG structures, any of the above realizations for shunt capacitance $C_1$ and series inductance $L_2$ may be used in any combination. For instance, in a 2D hybrid EBG structure, the printed capacitive patches of FIG. 18 may be combined with out-of-plane inductive L-bridges of FIG. 26a to create an all printed circuit EBG structure that may have a lower cutoff frequency than the second example that is shown in FIG. 18.

Thus far, the connection between patches has been made with a chip inductor or a trace acting as inductive element. Electromagnetic transmission lines may also be used. Examples eight through thirteen use a coupled transmission line, and example eight is divided into a number of sub examples.

Figure 27:
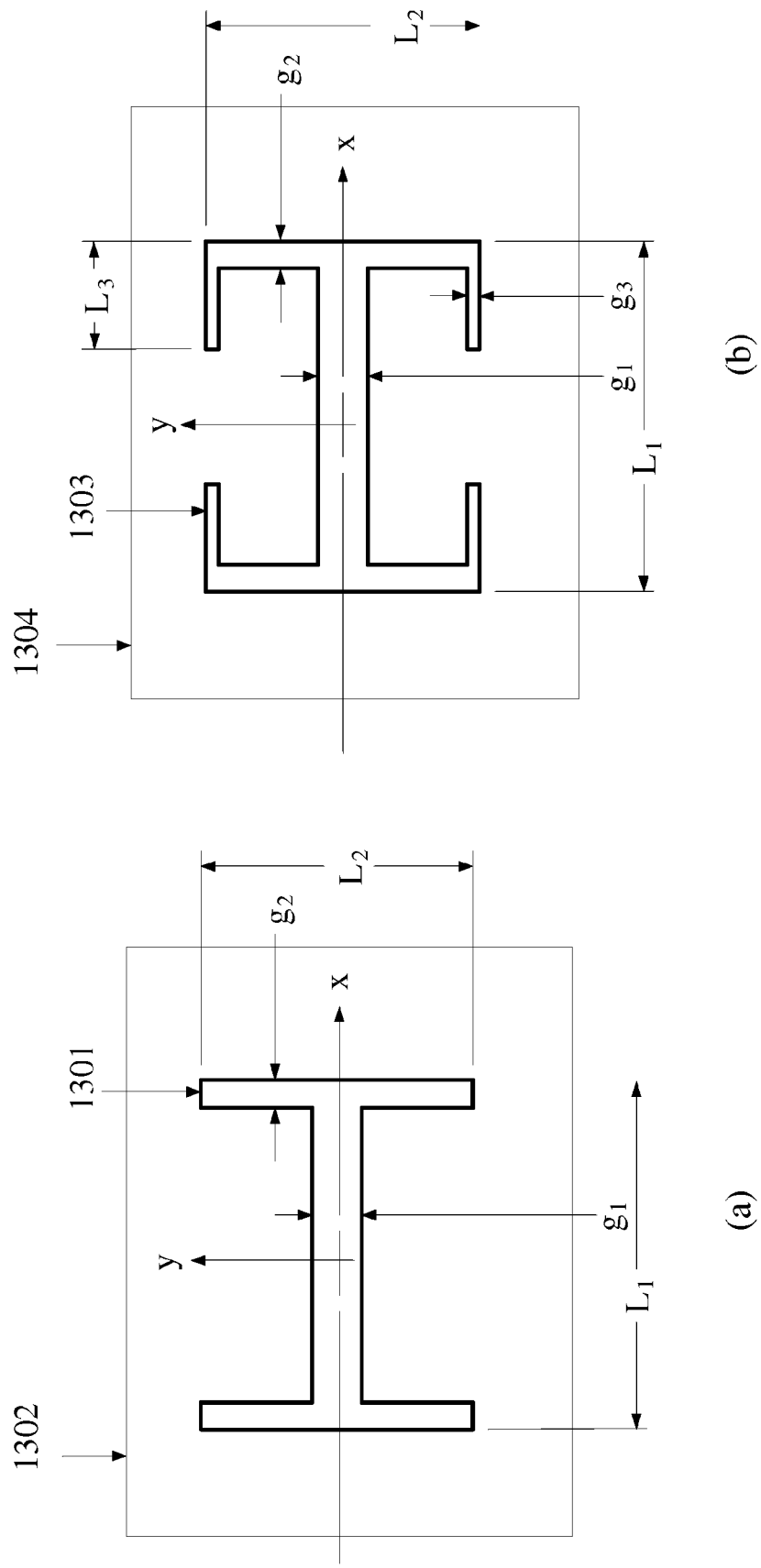
FIG. 27 shows dumbbell-shaped slots in a conductive screen: (a) is a slot; and, (b) is a modified slot.

Example eight can be understood with reference to the plan view of FIG. 27(a). A dumbbell-shaped slot 1301 is formed in a conductive plane and has an overall length $L_1$, an overall width $L_2$, a center line gap dimension $g_1$, and an end gap dimension $g_2$. Slot 1301 is a generating function shape that may be used to construct a more complex structure; for example, a periodic perforated screen. Slot 1301 is a symmetric slot wherein the line of symmetry is the x axis. For convenience, the coordinate is defined to have an origin in the center of this dumbbell-shaped slot.

Figure 28:
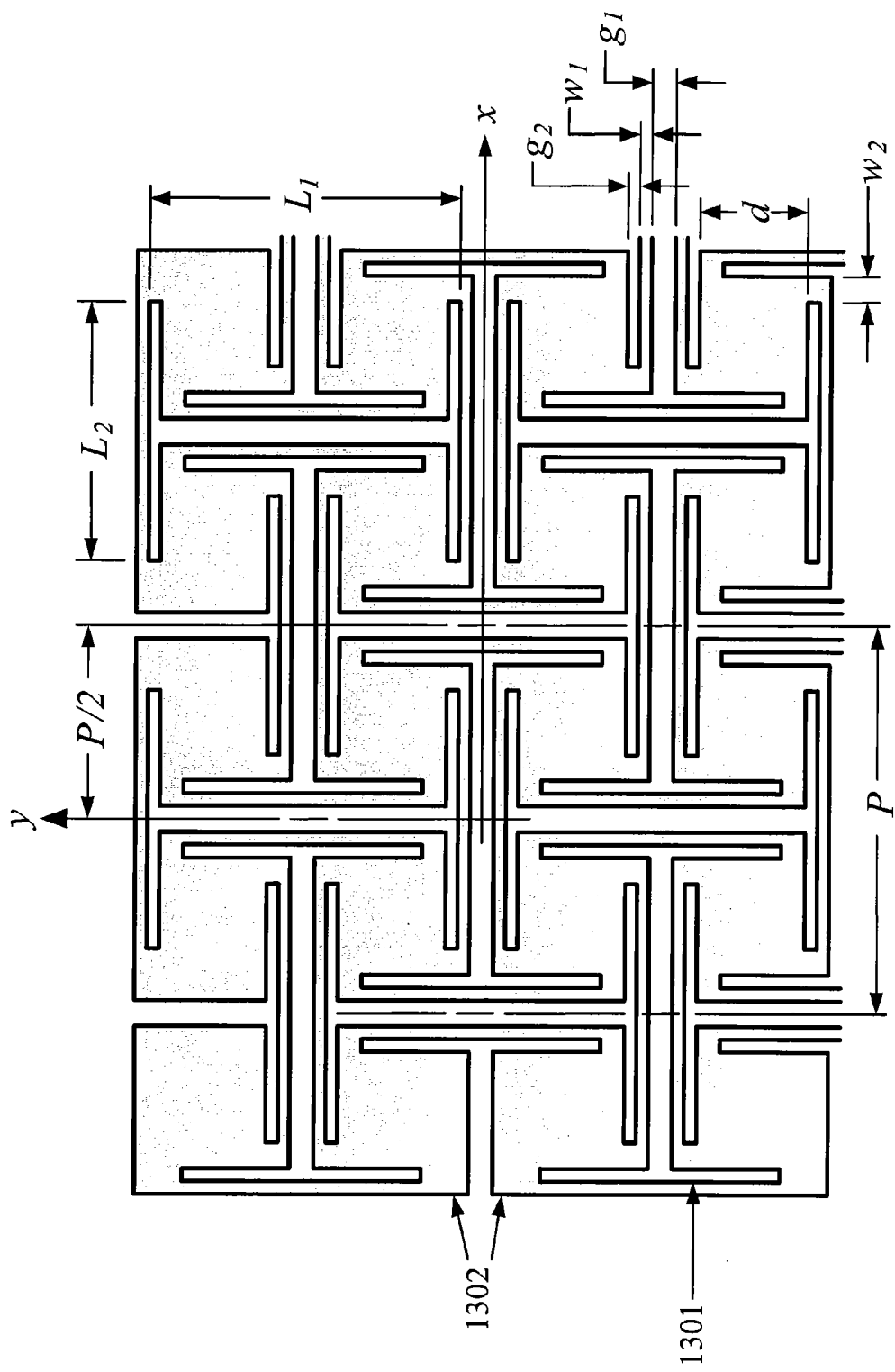
FIG. 28 shows an EBG structure having a dumbbell-shaped slot structure.

Slot 1301, in the orientation shown in FIG. 27*a*, may also be referred to as an H-shaped slot. A plurality of slots 1301 may be arrayed in both the x and y coordinate directions with a period of P (where P>$L_1$) in both orthogonal directions to create a 2D periodic array. Slot 1301 may be copied and rotated by 90° to create an I-shaped slot. A plurality of I-shaped slots may be translated in the x and y directions by intervals P/2. The I-shaped slot may arrayed in both x and y directions with the same period P. FIG. 28 shows the result, which is a two-dimensional array of nested dumbbell-shaped slots. The center-to-center distance in the x and y directions between an H-shaped slot and the nearest I-shaped slot is P/2. If the independent variables are the period P and the dimensions $g_1$, $g_2$, $w_1$, and $w_2$, then the dependent variables are then $L_1$, $L_2$, and d where $L_1=P-g_1-2w_1$, $L_2=L_1-2g_2-2w_2$, and $d=P/2-g_1-2w_1-2g_2$.

The coplanar EBG conductor of example in FIG. 28 is a locally isotropic structure in the x and y directions. That is, the period is identical in both x and y directions. If the period between slots in orthogonal directions were non-uniform, then the structure may be termed anisotropic, and electromagnetic wave modes may have different properties of wave velocity, cutoff frequency, and wave impedance for the different orthogonal directions, as previously described.

The ninth example may be understood by considering slot 1303 in FIG. 27*b* as a generating function. Slot 1303 is a dumbbell-shaped slot, modified to have an extension on the ends of the arms thereof, where this extension has length $L_3$ and gap width $g_3$. This modified slot, 1303, is formed in a planar conductive surface 1304.

Figure 29:
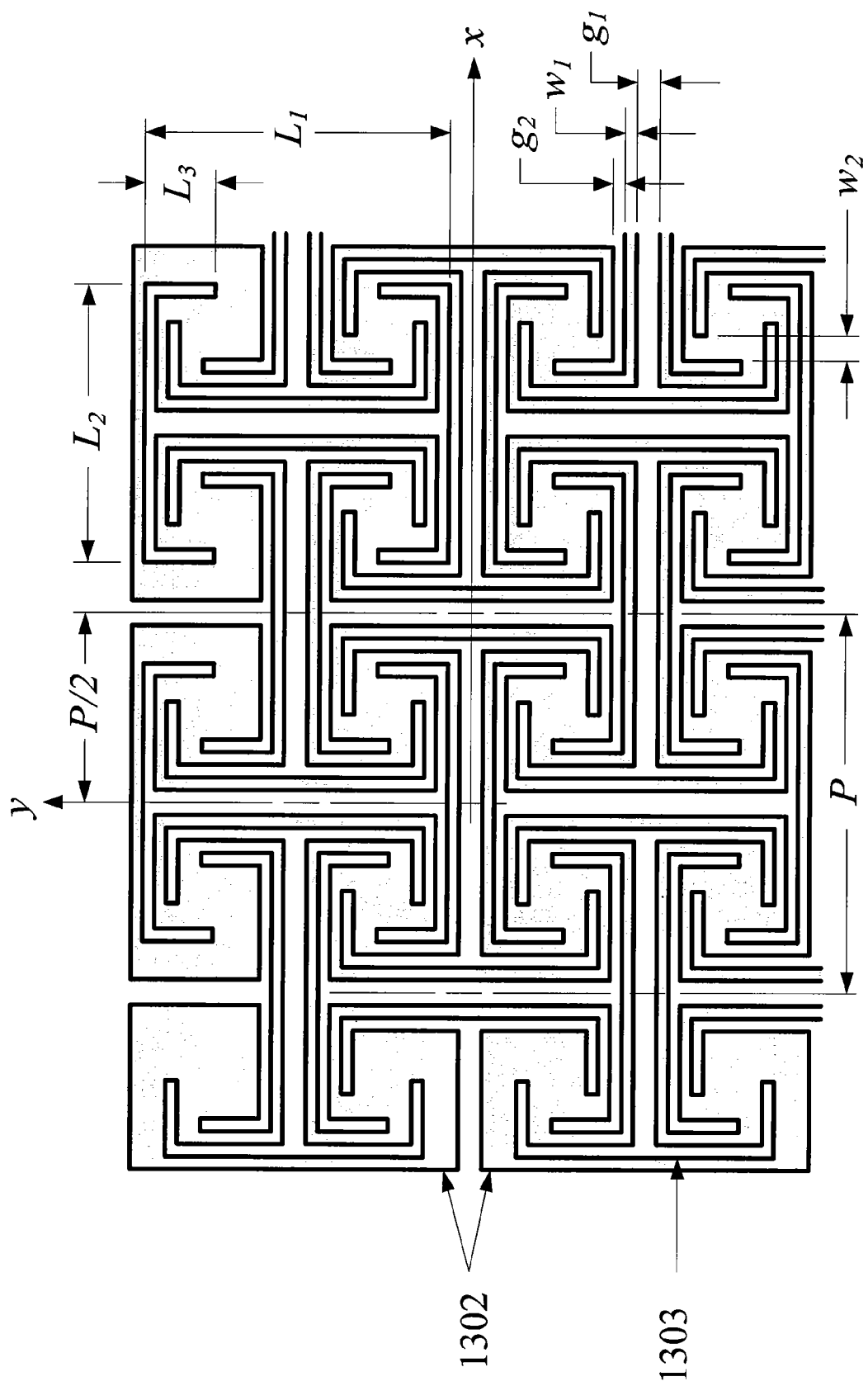
FIG. 29 shows an EBG structure having a modified dumbbell-shaped slot structure.

The ninth example may be constructed by using the slot 1303 of FIG. 27*b* as a generating function and following the same general procedure as described for the eighth example. Slot 1303 may be referred to as a modified H-shape. Slot 1303 is arrayed in both x and y directions with a uniform period of P where P>$L_1$. Then, slot 1303 is copied then rotated by 90° to appear as a modified I-shaped slot. The modified I-shaped slot is then translated by P/2 in both x and y directions to nest between two modified H-shaped slots, and then the combination is arrayed in both x and y directions. The result is shown in FIG. 29 where the conductive surface 1302 is perforated by a two dimensional array of slots 1303. The periods may be different in each direction to create an anisotropic structure. Furthermore, the slot parameters $L_1$, $L_2$, $L_3$, $g_1$, $g_2$, and $g_3$ may be different in each orthogonal direction. However, to simplify the description, the two dimensional examples are shown as isotropic structures unless specifically noted otherwise, without implying that this is a limitation.

Examples eight and nine are single planar conductors. An isolated conductor in free space will not support the propagation of transverse electromagnetic (TEM) modes. However, if additional conductive planes are disposed parallel to the conductive surfaces, then the fields and waves associated with TEM modes may propagate in the space between the planes. When a single solid conductor is placed next to the conductive screens of examples eight and nine, a parallel-plate waveguide (PPW) is formed. When two solid conductive planes are placed parallel to the conductive surfaces of examples eight and nine, and disposed on either side thereof, a stripline structure is formed. For the stripline structure, the coplanar EBG conductor of examples eight and nine is not restricted to lie midway between the outer conductors. However, for simplicity in description such a configuration will be used for the stripline structures described herein, without the implication that this is a restriction on the geometry. Since each TEM mode waveguide has periodic conductors in the x and y directions, electromagnetic bandgaps or stopbands are created for modes that the PPW or stripline would normally support.

Figure 30:
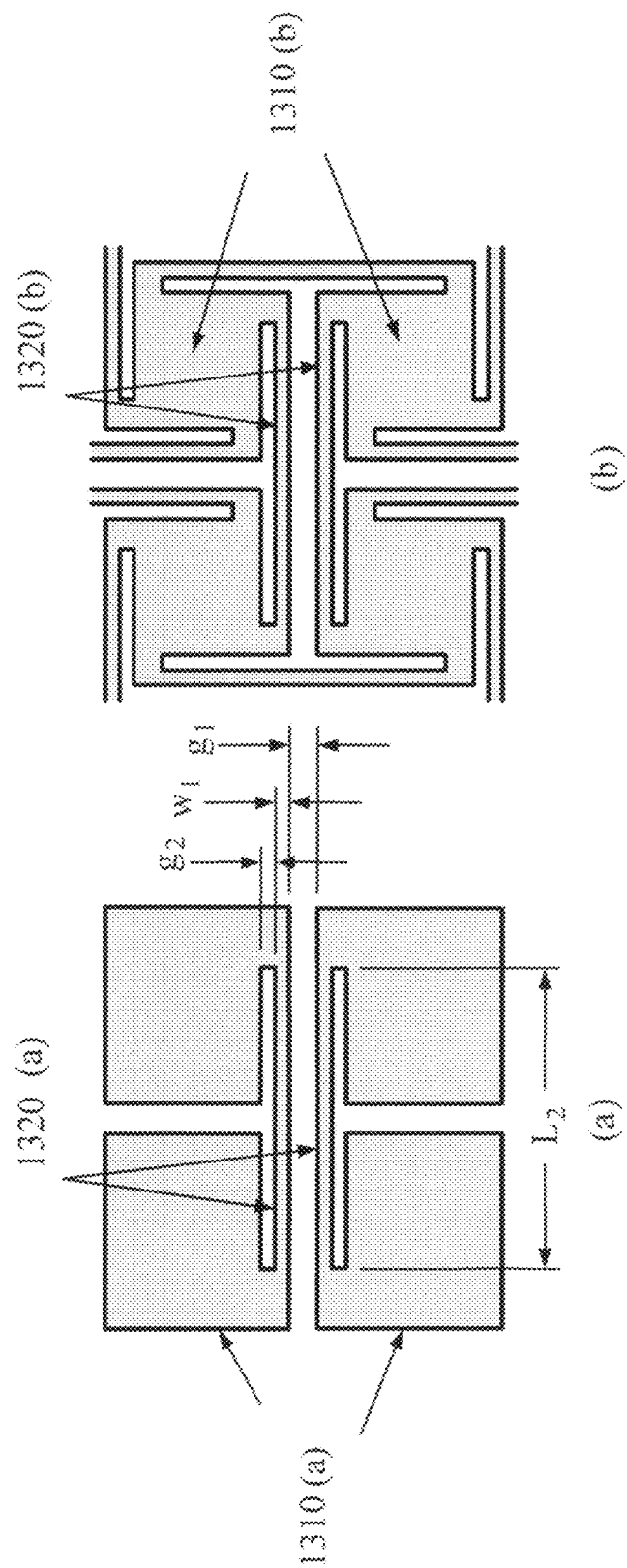
FIG. 30 shows an example of adjacent coplanar patches connected by coupled transmission lines, where: (a) has a single pair of coupled transmission lines; and, (b) is a unit cell of an EBG structure.

Alternatively, the coplanar EBG structure of example eight may be considered to be a conductive plane having an array of rectangular patches interconnected by coupled transmission lines. Such coupled transmission lines may be either microstrip or stripline transmission lines depending on whether one or two substantially continuous conducting planes are placed next to the structure of example eight. FIG. 30*a* shows four adjacent coplanar patches 1310(*a*) connected to four terminals of a pair of coupled strip transmission lines 1320(*a*). The coplanar coupled transmission lines have a gap width $g_1$, a line width $w_1$, and a length $L_2$. The distance between patches and normal to the center line of the coupled lines is $g_1+2w_1+2g_2$. FIG. 30*b* illustrates that connecting any four adjacent patches 1310(*b*) with a four port pair of coupled transmission lines 3020(*b*) may be extended to a two-dimensional infinite array. Hence, FIG. 30*b* is a unit cell of a 2D periodic waveguide.

Figure 31:
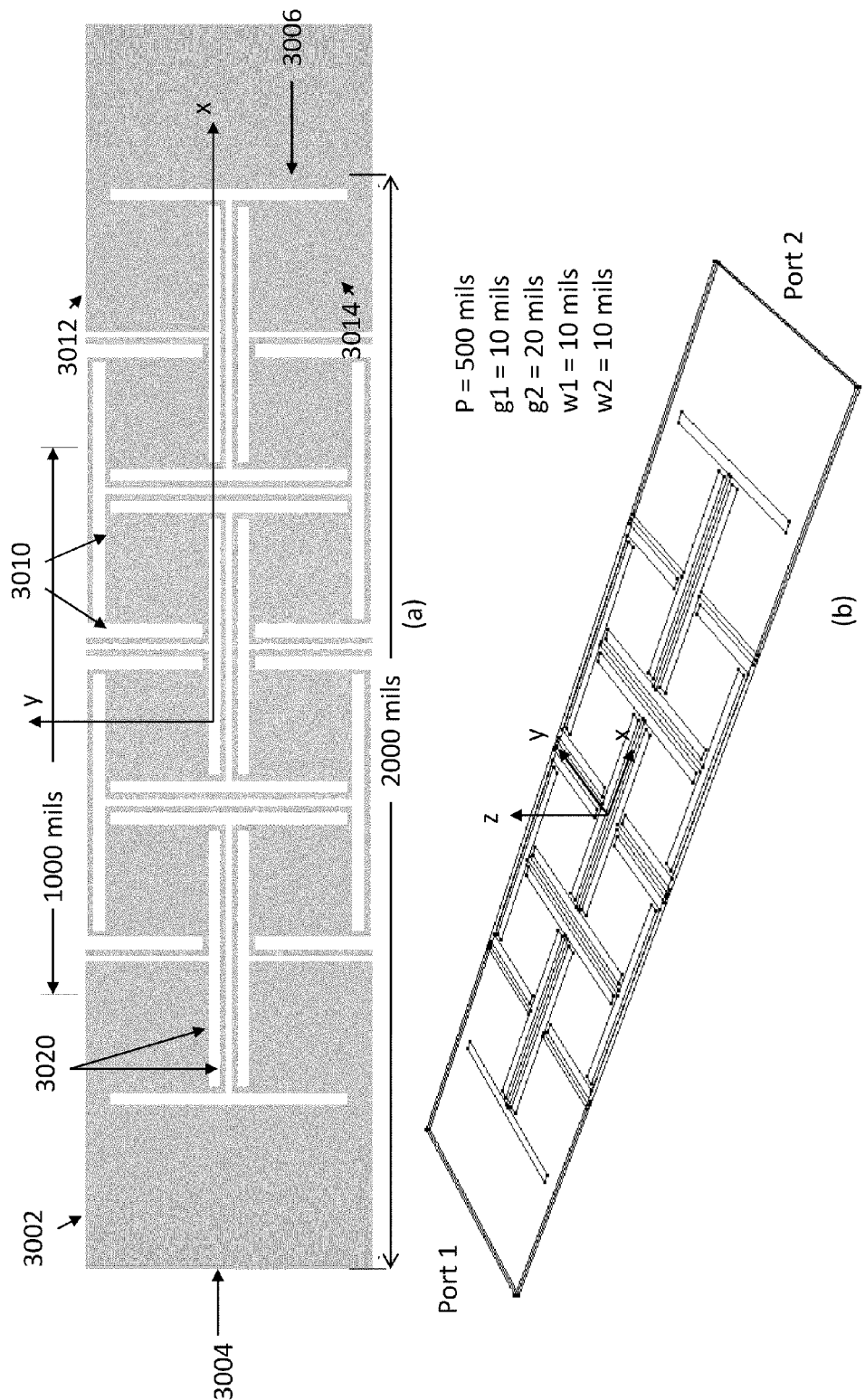
FIG. 31 shows a first sub-example of the example eight as a stripline, where: (a) is a plan view showing only the center conductor; and, (b) is a perspective view showing three conductors.

In a first sub-example of example eight, the finite length periodic structure 3002 of FIG. 31(*a*) may serve as the center conductor of a stripline waveguide. This arrangement is used to evaluate the power transmission through a finite length waveguide, and to show the resultant stopbands and passbands. FIG. 31(*a*) is a plan view of the finite length stripline which was evaluated using Microstripes™ 7.0, a full-wave electromagnetic simulator.

At the left and right sides of FIG. 31(*a*) at x=+/−1000 mils, stripline ports 3004 and 3006 are shown. At the top and bottom of the plan view (y=+/−250 mils) H-walls (3012 and 3014), or magnetic walls, are shown. The magnetic wall boundary conditions on the sides of the stripline waveguide are used to make the stripline appear analytically periodic and infinitely wide in the +/−y directions for computational purposes. Within the passbands, RF power propagates in the +/−x direction. Due to symmetry of the unit cells and the manner in which the stripline ports are disposed, magnetic walls also exist along the center lines of each horizontal pair of coupled lines. The transmission of a plane TEM wave that travels in the x direction across this 2D stripline EBG structure is modeled in this manner. Although only two full geometric periods of the coplanar EBG structure have been used in the waveguide longitudinal direction (the x direction), deep stopbands are be observed in the simulation.

The unit cell parameters used to characterize this simulation model are P=500 mils; $g_1$=10 mils; $g_2$=20 mils; $w_1$=10 mils; and, $w_2$=10 mils. The substrate is modeled as two FR4 laminate dielectric layers with a relative permittivity $\in_r$ of 4. The two cores, one on either side of the center conductor, are each 5 mils thick for a total substrate height of 10 mils. The conductors in the simulation are modeled to have zero thickness and infinite conductivity. The dielectric and conductive materials are modeled as being lossless.

Figure 32:
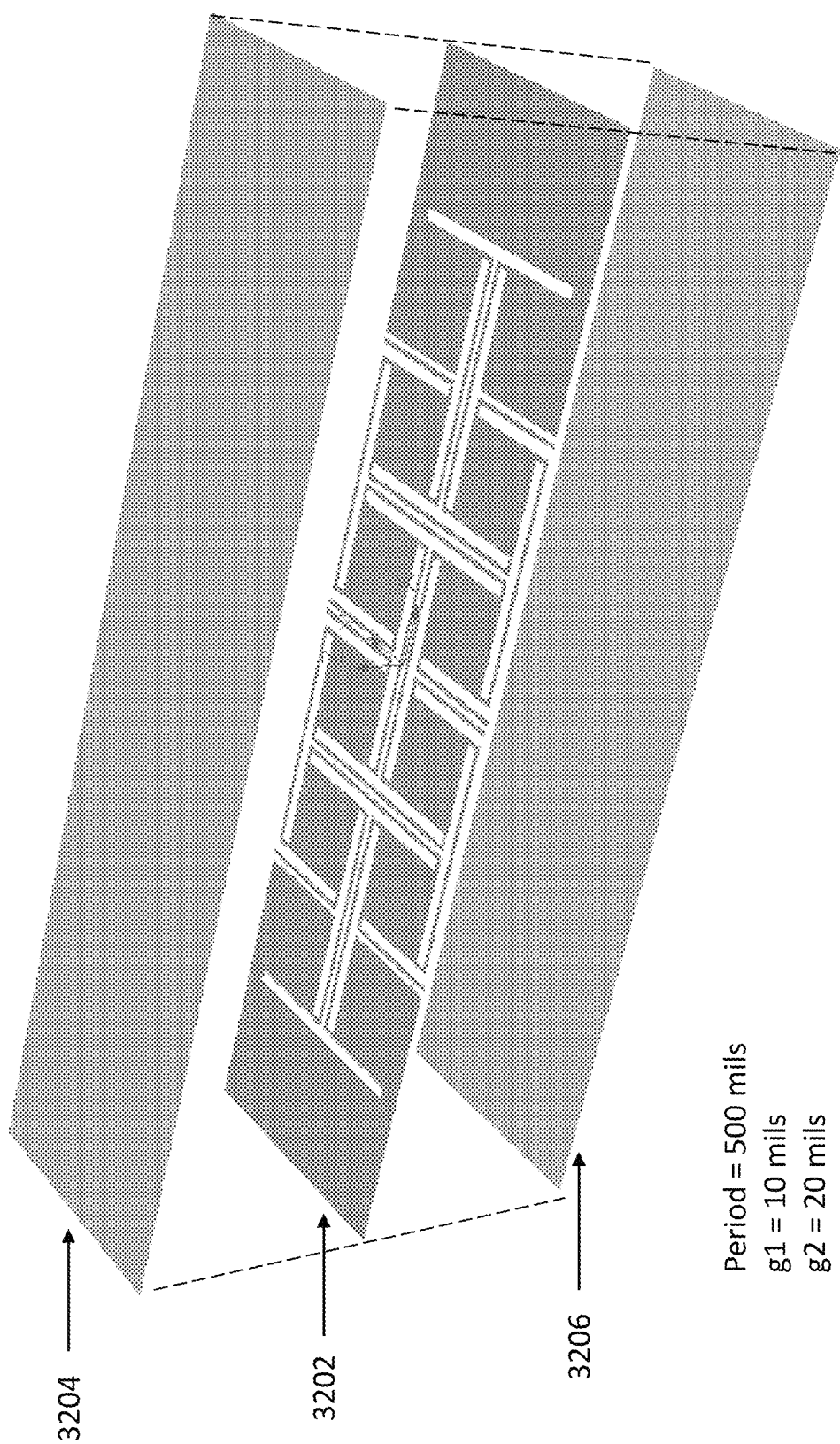
FIG. 32 shows an exploded view of FIG. 31.

FIG. 32 shows an exploded view of the stripline with the center conductor 3002, where the 5 mil thick dielectric layers disposed between the center conductor 3002 and the upper 3204 and the lower 3206 conducting planes, respectively, have been omitted from this view.

Figure 33:
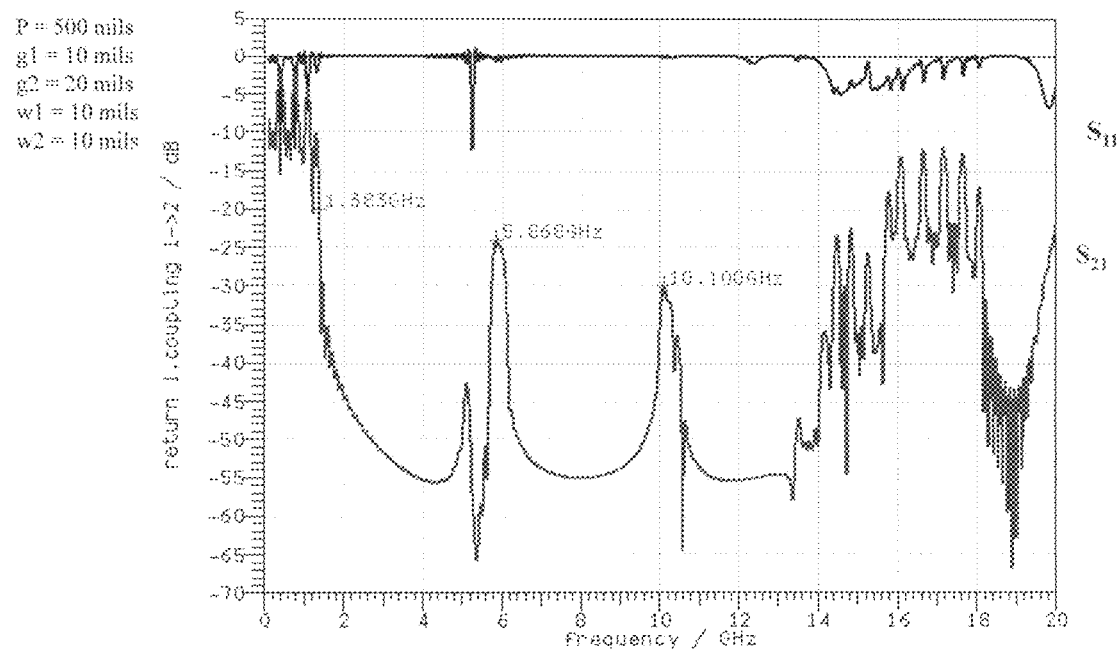
FIG. 33 shows the S parameters for a full-wave simulation of the structure of FIGS. 31 and 32.

The computed S parameters, for transmission and reflection, for are shown in FIG. 33. The transmission plot shows a fundamental stopband beginning at about 1380 MHz (−20 dB transmission) and extending up to about 5 GHz. Higher frequency stopbands are also observed, such as those between 6.1 GHz and 10 GHz. The stopband attenuation exceeds 50 dB over most of these stopband frequency ranges.

Figure 34:
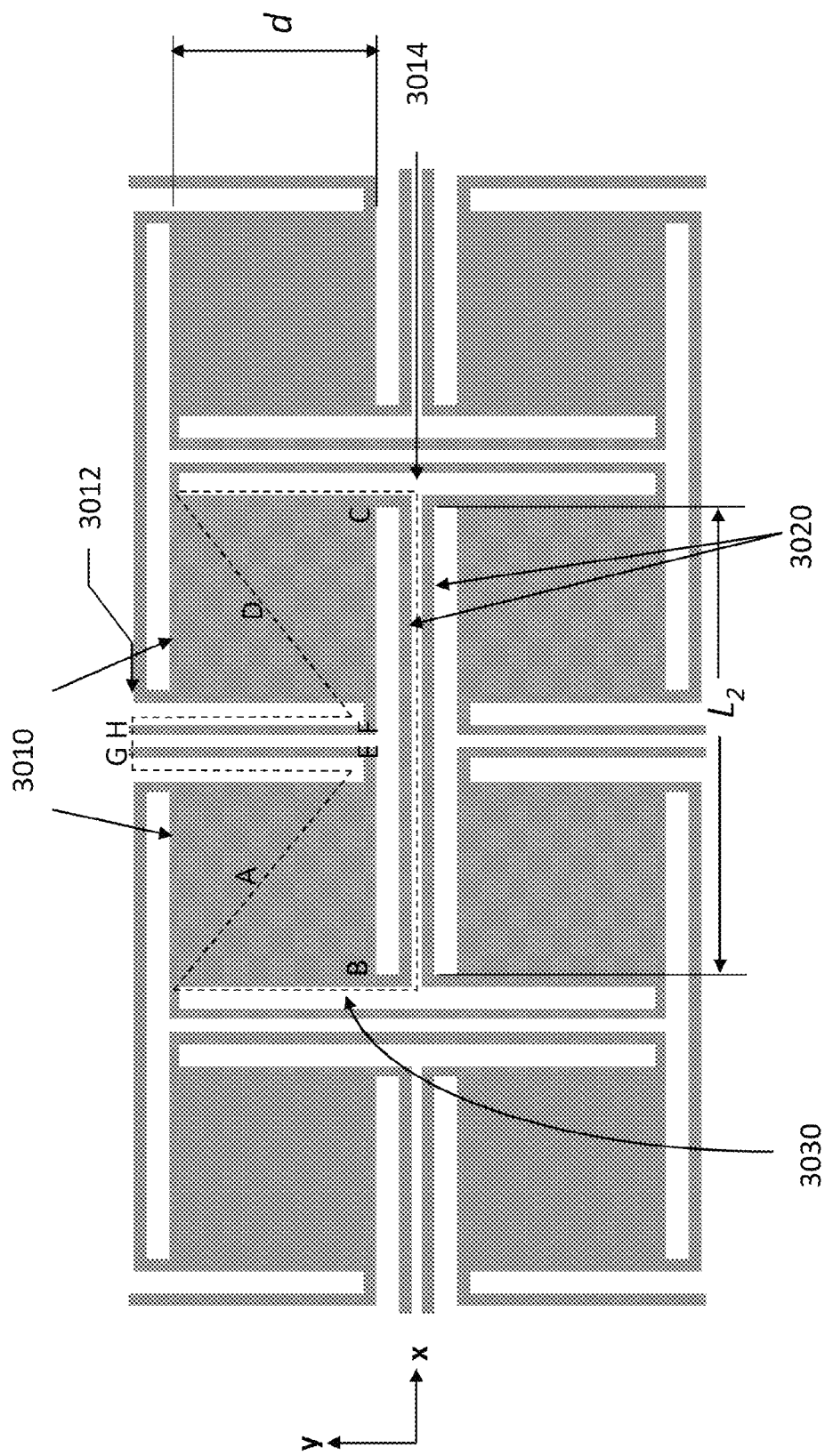
FIG. 34 shows the geometric area within the EBG structure of FIG. 31 associated with the unit cell equivalent circuit.

The physical arrangements may be represented by equivalent circuit models. FIG. 34 is a pair of unit cells corresponding to the structure of FIG. 31. The closed dotted line encompasses an area 3030 that may be associated with an equivalent circuit. Electromagnetic waves are assumed to propagate in the x direction. In this situation, the longitudinal center lines, such as 3012 and 3014, of the coupled lines which are parallel to the x axis, are magnetic walls. That is, for example, the x axis lies on a magnetic wall. This may be inferred, as the symmetry of the unit cells has a result that each coupled line with a center line parallel to the x axis is driven in an even mode thereof. Full-wave simulations demonstrate that patches 3010 have currents which flow to and from the corners attached to horizontal coupled lines 3020, and currents that flow substantially along the diagonals of the patches extending to and from these corners. The diagonal dotted line crossing point A is a reference plane denoting one end of this two-port equivalent circuit. The dotted line crossing point D is a reference plane denoting the other end of the equivalent circuit. Points B and C denote reference planes where equivalent transmission lines are connected to the corners of a patch 3010. Points G and H are on the reference plane where a magnetic wall terminates the ends of a vertical (y directed) pair of coupled lines.

Figure 35:
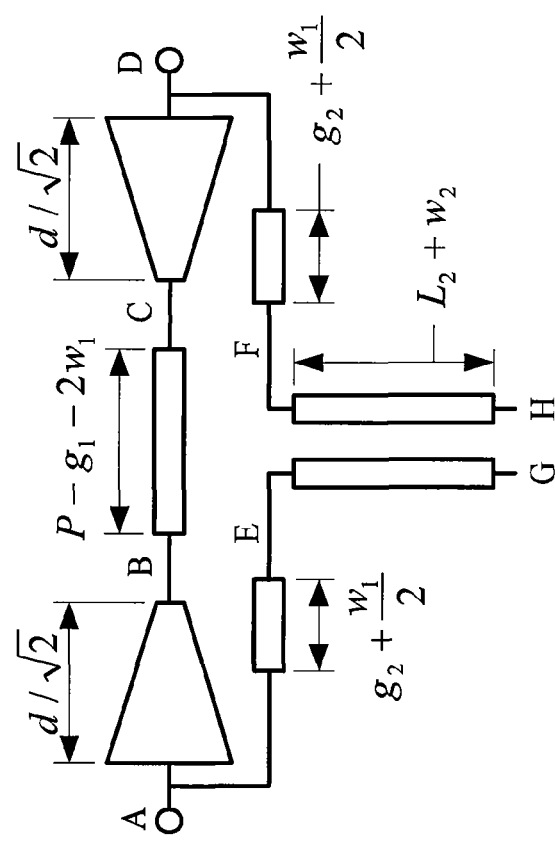
FIG. 35 shows an equivalent circuit model for one-half a unit cell of FIG. 34.

One-half of each unit cell may be modeled by an equivalent circuit. A full period can then be modeled by two cascaded equivalent circuits, each equivalent circuit being identical. The equivalent circuit for the stripline waveguide is shown in FIG. 35. The circuit is comprised of seven transmission lines which are denoted by letters A-H corresponding to nodes at the end of each transmission line (TL). For instance, TL-AB denotes a transmission line connecting node A to node B. TL-AB and TL-CD are non-uniform transmission lines whose width tapers linearly from $\sqrt{2}d$ to $w_2$ over a longitudinal distance of $d/\sqrt{2}$. These sections of transmission lines have a non-uniform characteristic impedance. TL-BC is one of the coupled lines, and the characteristic impedance is the even mode value, $Z_{oe}$, since a magnetic wall is the boundary condition along the centerline of the coupled lines. TL-EG and TL-FH are another coupled transmission line pair. Nodes G and H are open circuits.

Aside from the dimensions in the table of FIG. 35, the only remaining physical dimension needed for calculations is the gap $g_1$ between coupled lines. The dielectric constant and thickness of each core in the stripline construction should also be specified in order calculate the equivalent circuit characteristic impedances.

An equivalent circuit model may be used for design purposes to improve speed and flexibility when comparing alternatives or modifying design variables. Equivalent circuits may be cascaded, and dimensional variables, such as the period and line widths, adjusted to meet desired frequency specifications for stopbands.

Figure 36:
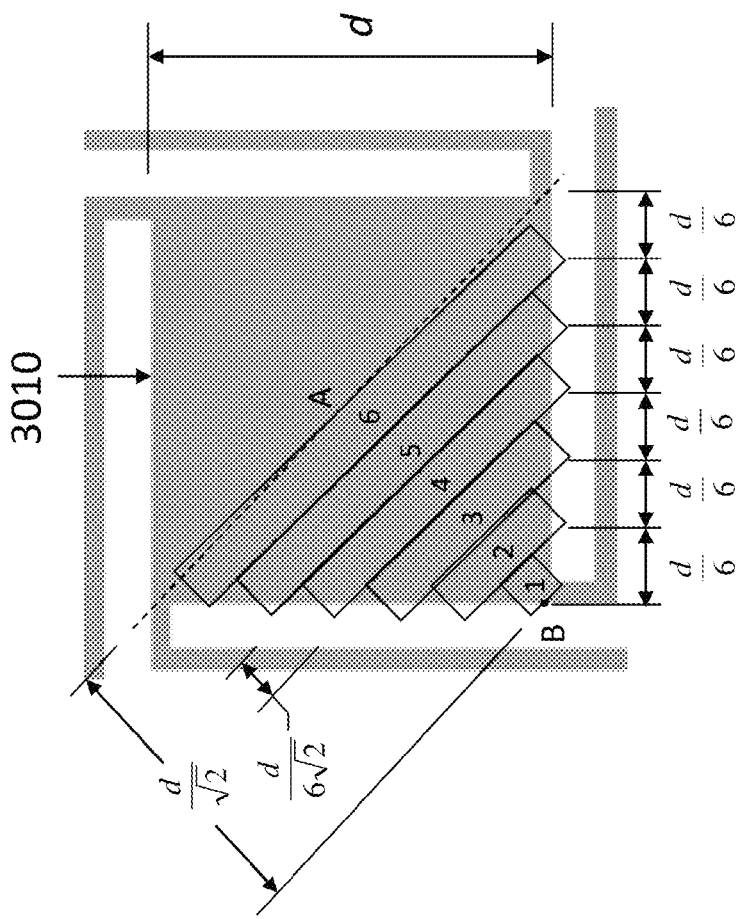
FIG. 36 shows a stepped-impedance approximation to the tapered transmission lines in the half unit cell equivalent circuit of FIG. 35.

Most circuit simulators need adaptation to model non-uniform transmission lines such as TL-AB and TL-CD as shown in FIG. 35. A stepped approximation to the linearly-tapered transmission lines TL-AB and TL-CD may be used. One such analysis is shown in FIG. 36. One-half of the patch 3010, located between reference planes A and B, is replaced with a cascade of six, uniform-width transmission lines. The width of each stepped transmission line is the average of the transverse dimension at each of its ends. For instance, TL-1 models a triangular section of the patch 3010 that has a width of zero on its narrower end, point B, and a width of $\sqrt{2}d/6$ at its wider end. The length of the nth section in this stepped approximation is $d/(6\sqrt{2})$ and the line width is $(2n-1)d/(6\sqrt{2})$.

FIG. 37(a) shows a schematic where five of the equivalent circuits of FIGS. 35 and 36 are cascaded to model the finite length stripline waveguide of FIG. 31. The upper part of this schematic shows circuit network blocks N1 through N5 each of which references a unit cell equivalent circuit UC1. The details of UC1 are shown in FIG. 37(b). The line widths are listed for the stepped transmission line approximation to TL-AB and TL-CD. The variables not listed on this schematic, but used in the circuit simulation, are: the stripline total substrate height of 10 mils, and the substrate relative dielectric constant of 4.8. In the circuit simulation, the dielectric constant was increased from a value of 4.0, which was used in the full-wave simulation, to 4.8 in order to obtain better agreement with the stopband band edges. The circuit simulation was done using Genesys™ version 2003.10 from Eagleware Elanix (Norcross, Ga.)

Figure 37:
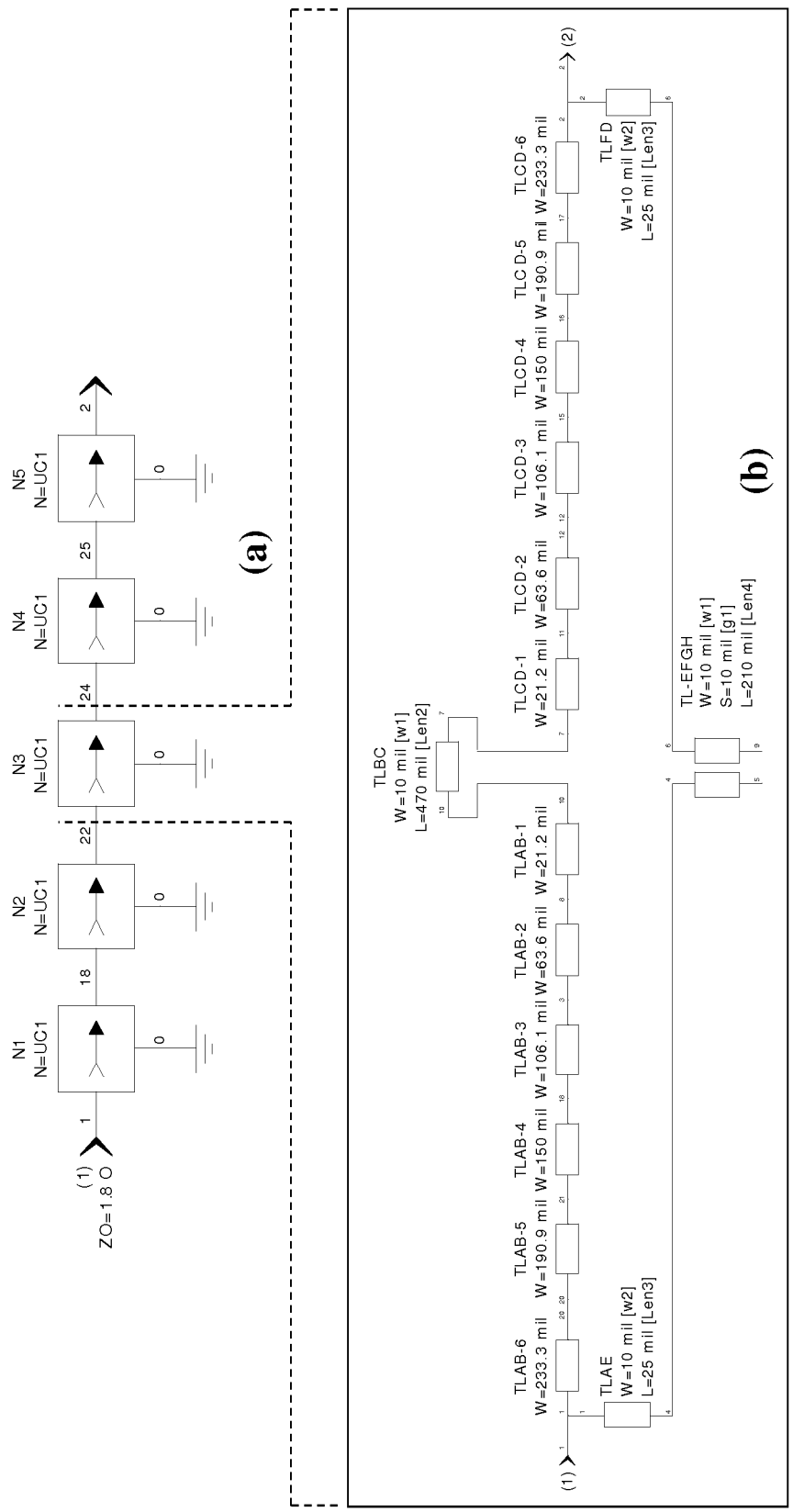
FIG. 37 shows cascaded unit cell equivalent circuits used to model the stripline EBG structure of FIG. 31; (a) five cascaded half unit cells, (b) circuit detail of each half unit cell using the stepped-impedance approximation of FIG. 36.
Figure 38:
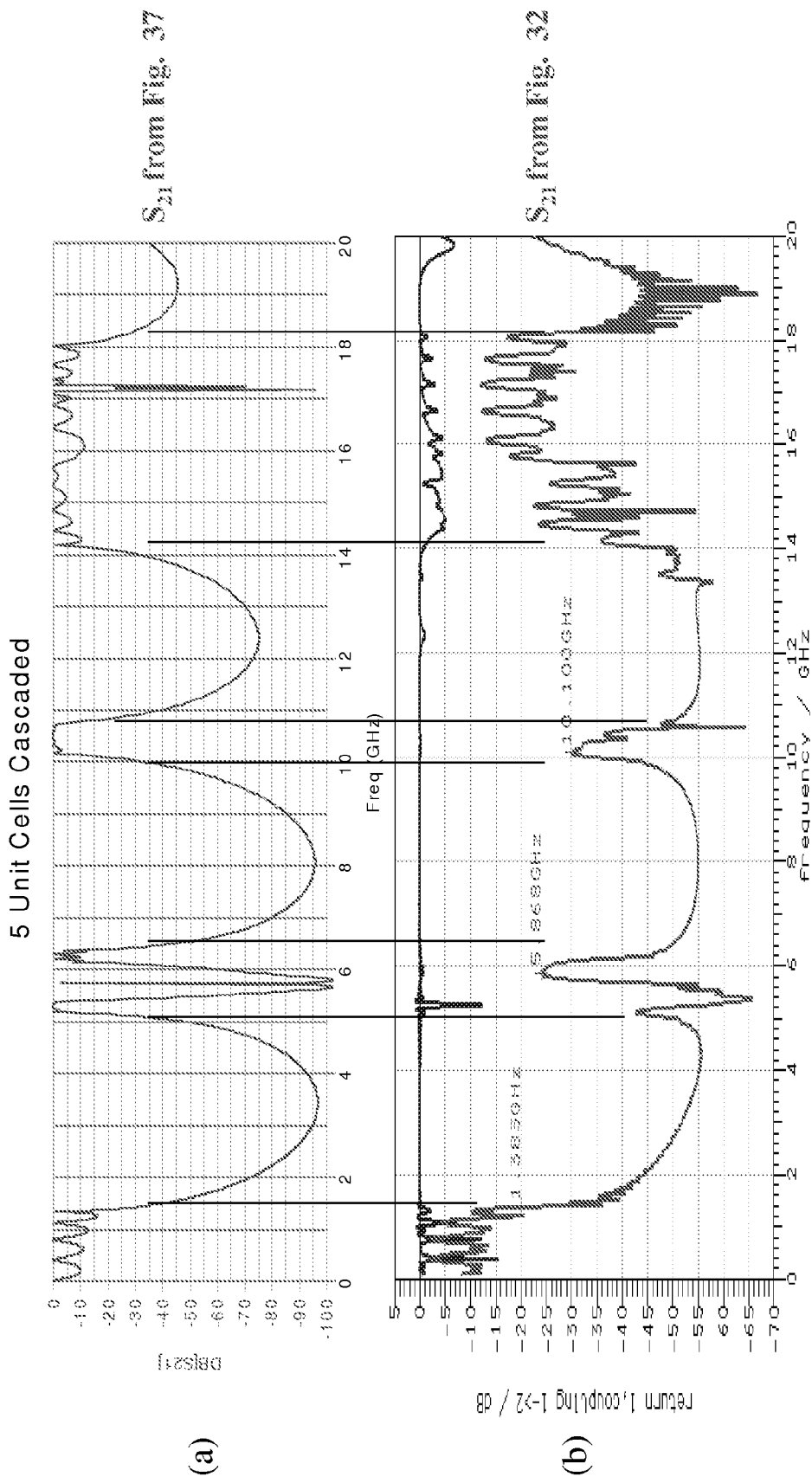
FIG. 38 shows a comparison of (a) the stepped-impedance transmission line circuit model of FIG. 37 to (b) the Microstripes™ (full-wave) simulation of FIG. 33.

FIG. 38(a) shows the transmission response for a cascade of five equivalent circuits of FIG. 37. FIG. 38(b) repeats FIG. 33 showing the full-wave simulation results for comparison. The circuit model lacked a series inductance associated with the narrow gaps in the stripline center conductor at each end of the waveguide, however the band edges for stopbands, as highlighted by vertical lines connecting the two portions of the figure, are well aligned when comparing the equivalent circuit model to the full-wave simulation. The circuit model was defined by the physical dimensions of the unit cell and the dielectric constant. The circuit simulator calculated the stripline characteristic impedances from the specified line widths and substrate permittivity.

In another aspect, the structure may be formed as a PPW. The same equivalent circuit may be used. However, for a given line width, the characteristic impedance will be different, and the guide wavelength will also be a function of the line width.

Figure 39:
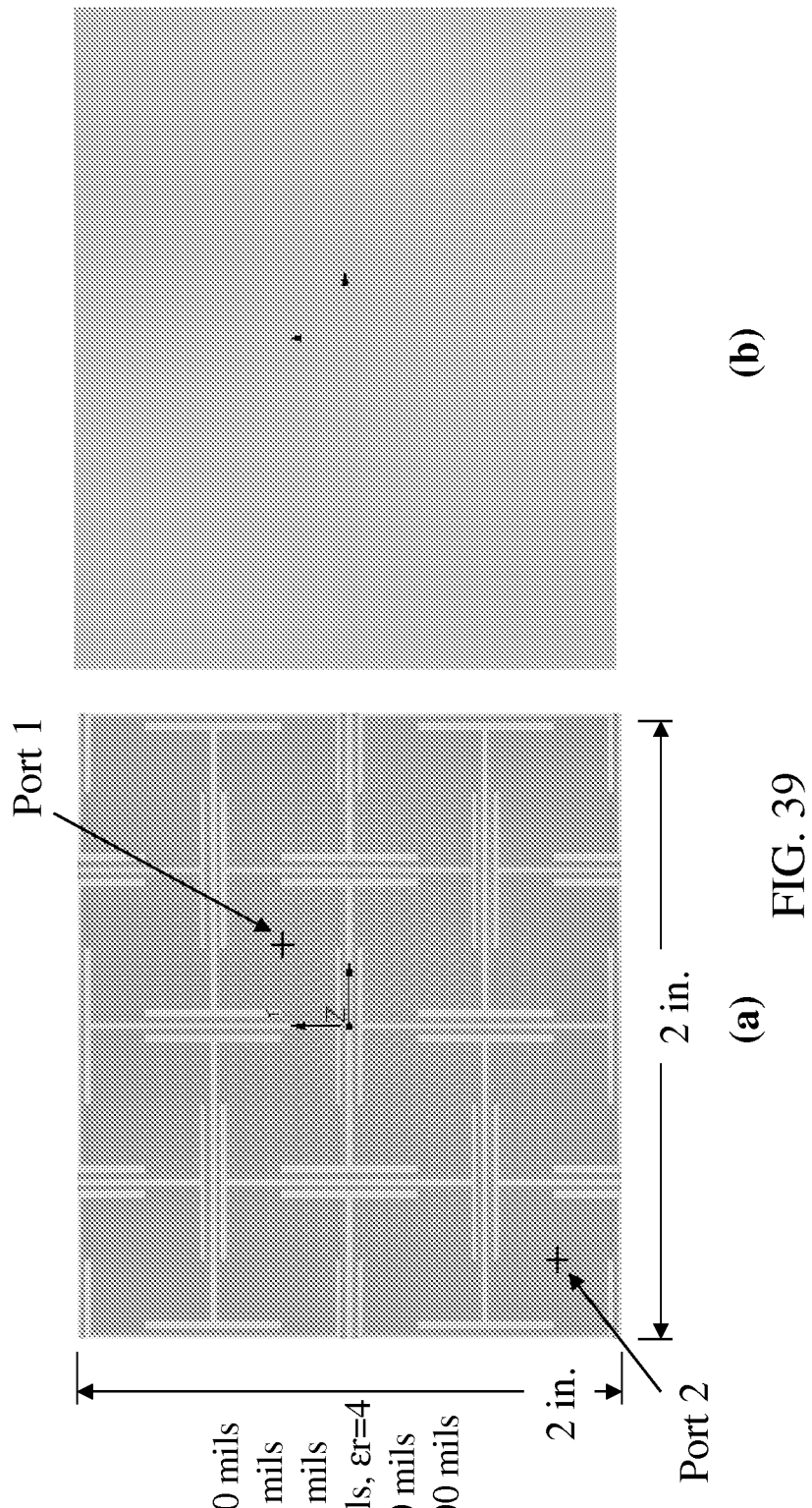
FIG. 39 shows a second sub-example of example eight which is a parallel-plate waveguide with an upper conductor comprised of a dumbbell-slot EBG structure, and a lower conductor comprised of a solid ground plane: (a) plan view from the slotted side; and, (b) plan view from the solid conductor side.

A second sub-example of example eight is a PPW. FIG. 39 shows plan views of a model of a PPW where the upper conductive plane (for example, a power supply plane) may be the coplanar EBG conductor of FIG. 28, and the lower conductor may be a solid ground plane. The upper and lower conductors are separated by a 4 mil thick FR4 core of relative dielectric constant 4. The origin for a coordinate system may be positioned, for example, at the top and center of the upper conductor. The overall dimensions of this PPW are 2 inches square and 4 mils thick. RF ports are located near the center of different patches at coordinates (x,y)=(275, 275) mils and (−725, −725) mils. The RF ports are 50 ohm vertical wire ports where each end of the wire touches one plate of the PPW. A full-wave Microstripes simulation was used to predict the coupling between the RF ports.

Figure 40:
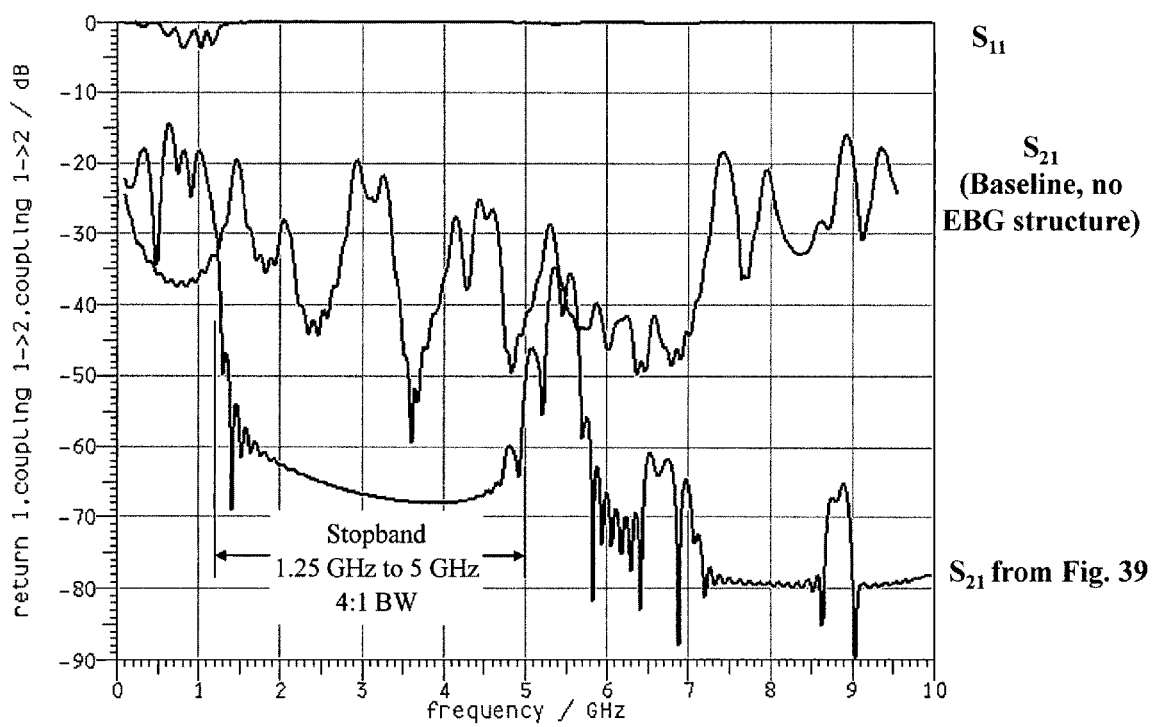
FIG. 40 shows S-parameter results for a full-wave simulation of the structure of FIG. 39.

The results of the simulation for transmission S21 between ports is shown as the lower curve in FIG. 40. A region of suppressed coupling is observed between about 1.25 GHz and 5 GHz. This frequency range will be called a stopband even though only two full periods are modeled in each coordinate direction. A second Microstripes simulation was performed on a similar PPW structure where the upper conductive plane was replaced with a solid conductor (that is, no EBG). This is referred to as the baseline configuration and its port-to-port S21 coupling is also shown in FIG. 40. The peaks of S21 for the baseline configuration may correspond to resonances within the cavity formed by the PPW; that is, power plane resonances. The parasitic resonance frequencies may be calculated from $$f_o = \frac{c}{2\pi\sqrt{\varepsilon_r}}\sqrt{\left(\frac{m\pi}{a}\right)^2 + \left(\frac{n\pi}{b}\right)^2} \quad (22)$$

where a and b are the x and y dimensions of the PPW and c is the speed of light in a vacuum. In this full-wave model, the metal and dielectric losses (tan δ=0.025 at 2 GHz) are included as well as radiation loss from the open edges of the PPW. Such losses limit the Q of each parasitic resonance and help to suppress the peaks. Even with all of the losses modeled, the EBG structure suppresses the resonant peaks in the $S_{21}$ response by more than 30 dB across the entire fundamental stopband. This result is obtained even though the coplanar EBG conductor contains only a 4×4 array of patches (less than 250 mils square each) and the coupled ports are only 2 patches apart.

Figure 41:
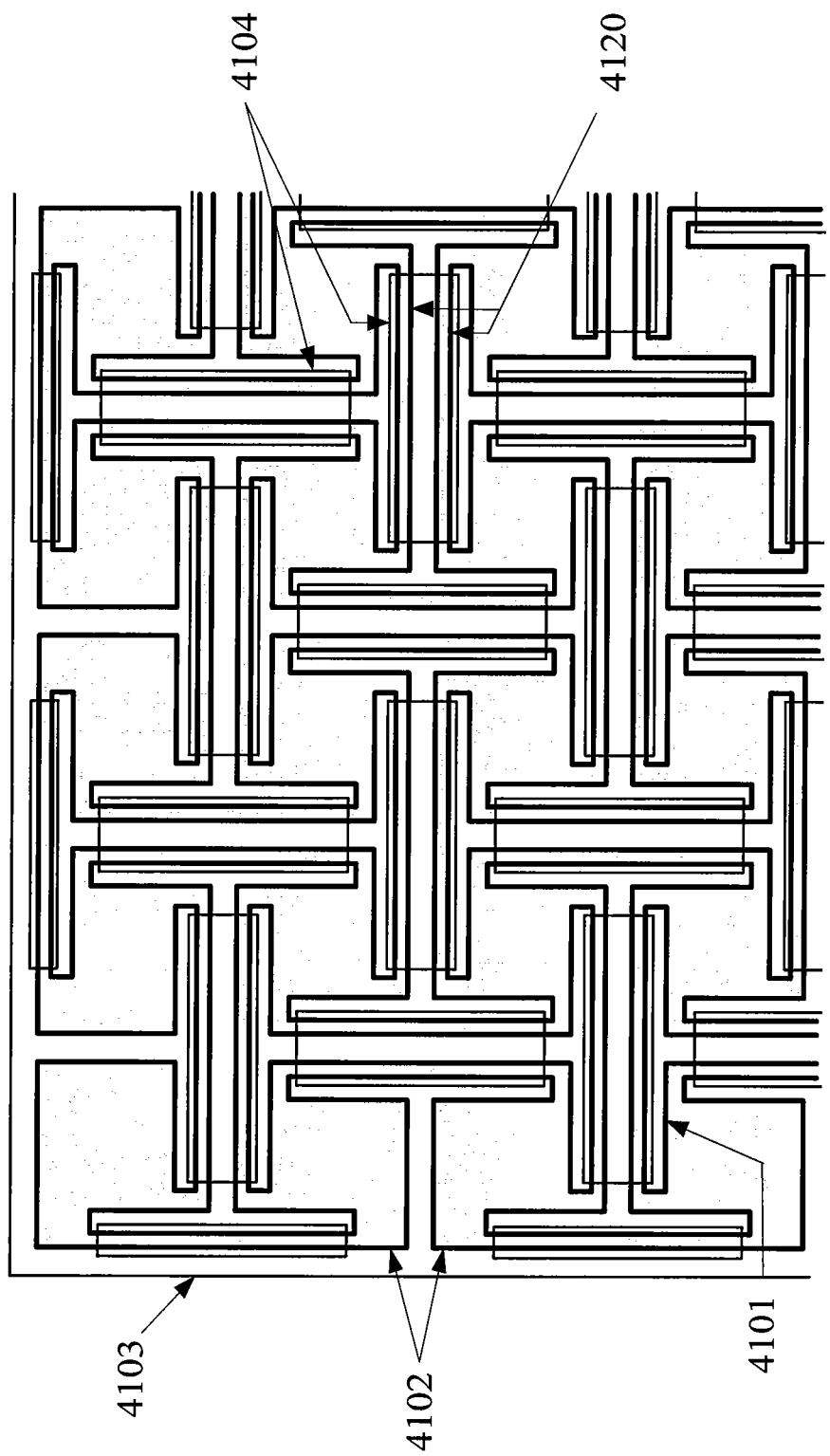
FIG. 41 shows sub-example three of the eighth example of an EBG structure.

A third sub-example of example eight is shown in FIG. 41. This example has similarities to that of FIG. 38, but has one or more adjacent conductive plane(s) 4103 in which slots 4104 are formed under the coplanar coupled transmission lines 4120 of the conductive layer 4102. The adjacent conductors may be a single ground plane in a PPW, or both the upper and lower ground planes in a stripline waveguide. The slots 4103 may extend under a portion of the coupled lines 4120 or under the entire area occupied by the coupled lines 4120. The purpose of the extra slots 4103 is to increase the even and odd mode characteristic impedance of the coupled lines. Increasing the ratio of the even mode characteristic impedance for the coupled lines, to the characteristic impedance of the patch transmission line may increase the bandwidth ratio (upper to lower band edge frequency) of the fundamental stopband.

Figure 42:
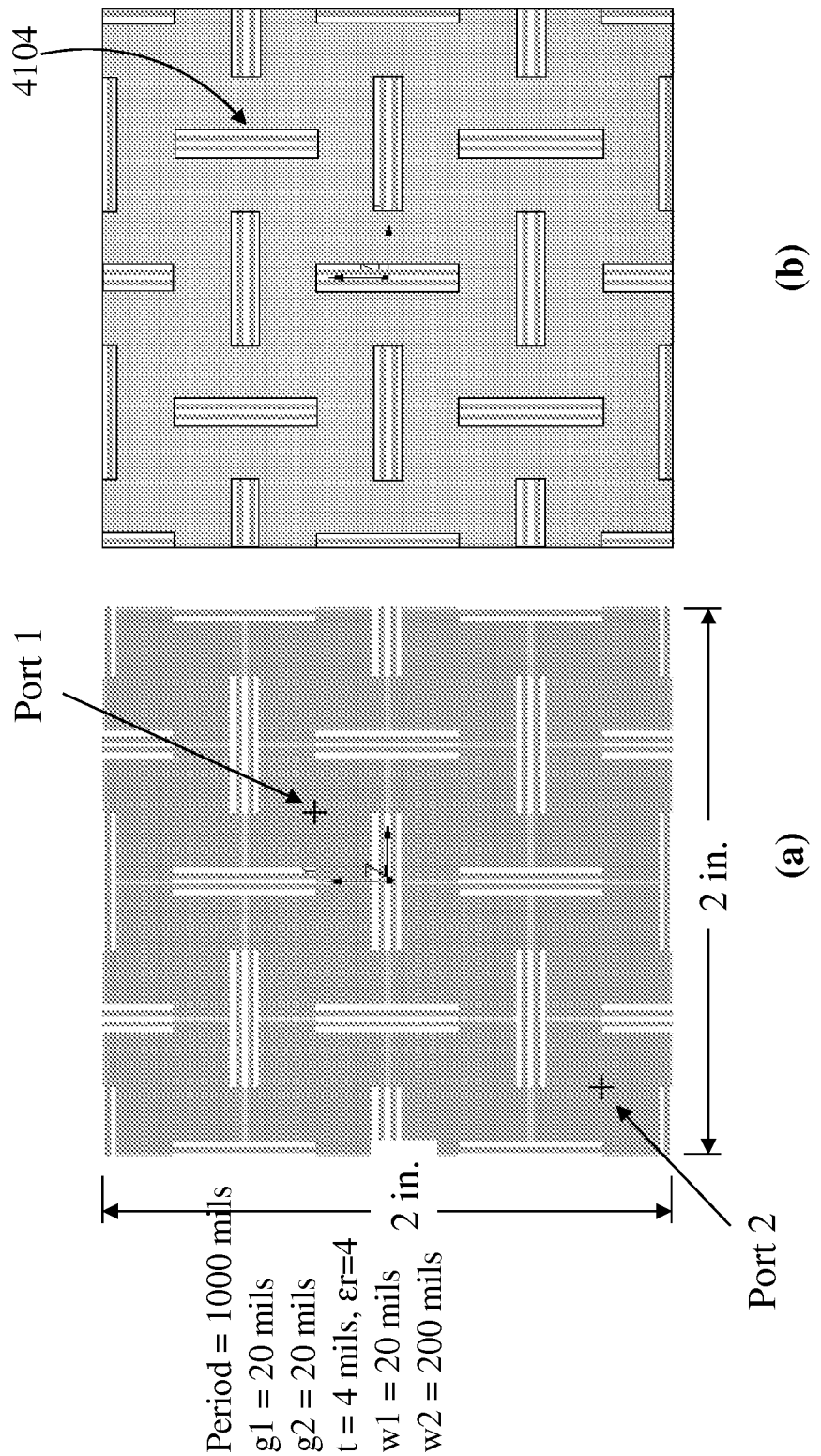
FIG. 42 shows sub-example four of the eighth example, a parallel-plate waveguide including a dumbbell-slot EBG structure and a slotted ground plane; (a) plan view from the dumbbell-slot side; and, (b) plan view from the slotted conductor side.
Figure 43:
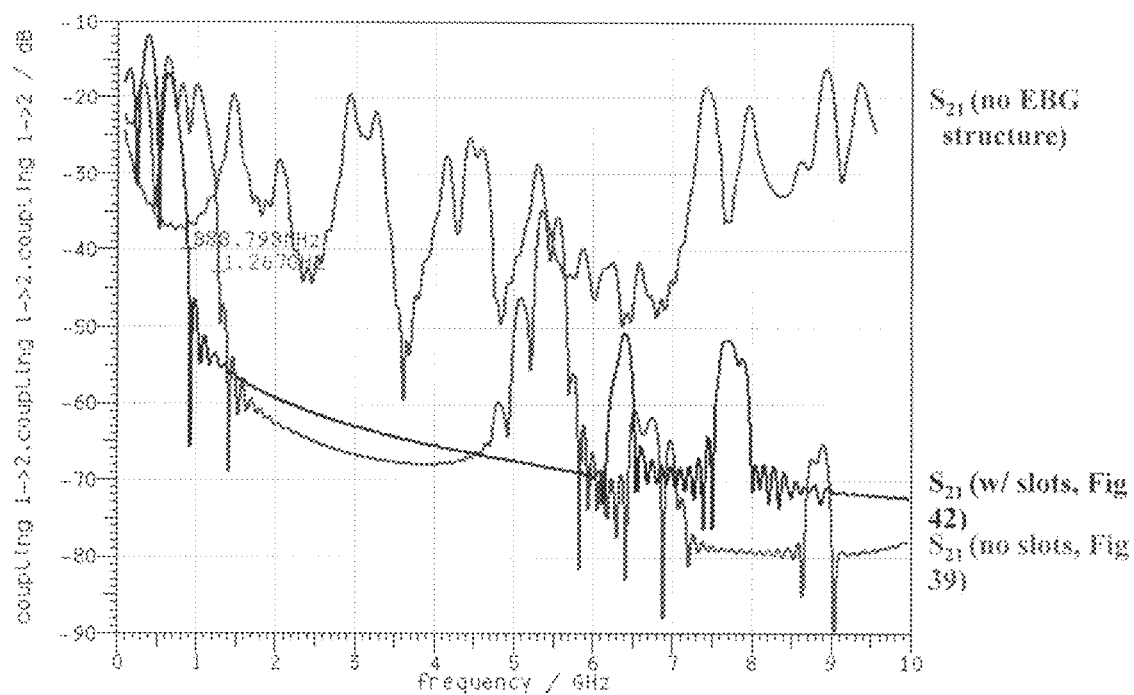
FIG. 43 shows a comparison of S-parameter results for sub-examples three and four.

In a fourth sub-example, shown in FIG. 42, the PPW has the same details as shown in FIG. 41, except that slots are now formed in the ground plane under each coupled transmission line pair. In this example, the slots have a length of $L_2$ and a width of $g_1+2w_1+2g_2$, except at the edges of the PPW where the coupled lines are truncated. The slot dimensions are 100× 500 mils. The characteristic impedance of the even mode of each coupled line is raised. FIG. 43 shows the comparison of transmission response $S_{21}$ for both examples sub-examples one and four, along with the baseline configuration where both parallel plate conductors were replaced by solid ground planes.

The lower band edge of the fundamental stopband (the cutoff frequency) has decreased from about 1270 MHz to about 890 MHz: about a 30% reduction. The bandwidth ratio of the fundamental stopband has increased from about a 4:1 ratio to about a 7:1 ratio. Suppression of the power plane resonances by more than 30 dB may be maintained in the fundamental stopband.

Figure 44:
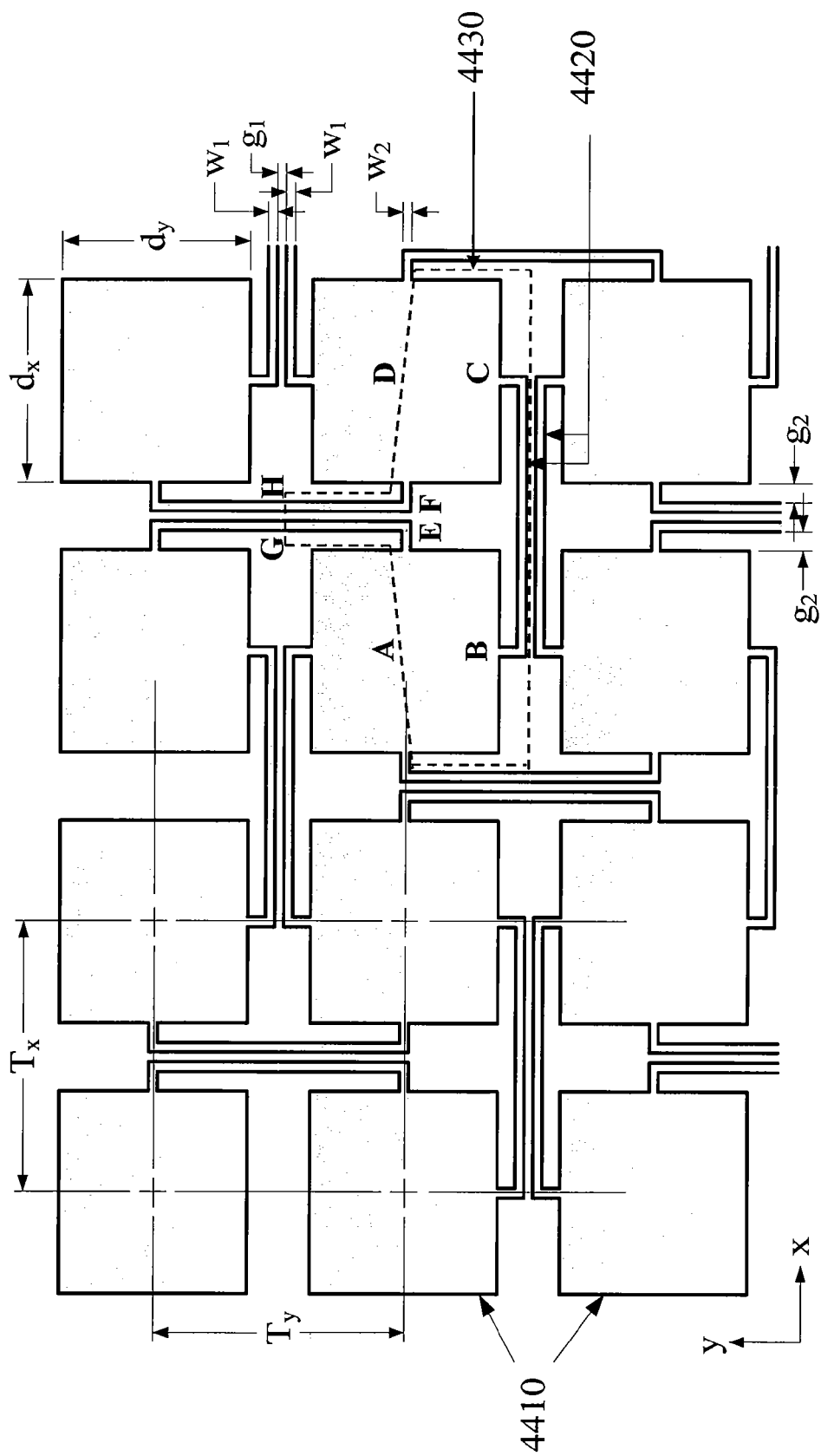
FIG. 44 shows sub-example five of example eight.

A fifth sub-example of example eight is shown in FIG. 44, having coupled transmission lines 4420 connecting to the rectangular patches 4410 at or near the midpoint of the sides of the patches. The coplanar patches are arrayed in a rectangular lattice with period $T_x$ and $T_y$ in the x and y coordinate directions respectively. In this example the periods will be equal, such that $T_x=T_y=T$. The rectangular patches have general dimensions $d_x$ by $d_y$; however, in the following examples, the patches are squares where $d_x=d_y=d$. This sub-example is similar to the first sub-example (FIG. 34) except for the location where the coupled line attaches to the patches. The independent design variables for the simulation were T, $g_1$, $g_2$, $w_1$, and $w_2$. The patch size d may be a dependent variable, where $d=T-g_1-2w_1-2g_2$.

Figure 45:
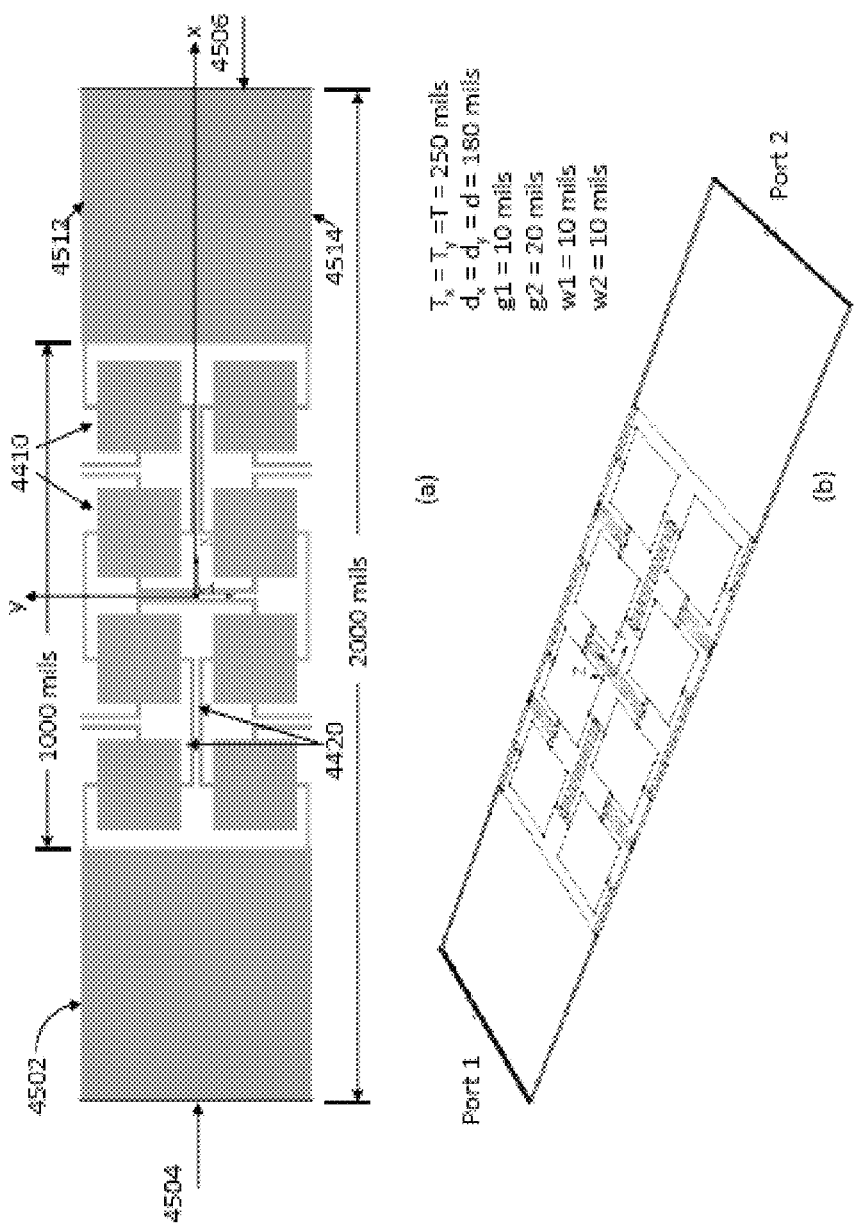
FIG. 45 shows is a stripline model for the full-wave simulation of Embodiment sub-example six of example eight: (a) plan view of the center conductor; and, (b) 3d wire view.

A sixth sub-example of example eight, employs sub-example five in a stripline waveguide configuration as shown, for example, in FIG. 45. The stripline configuration has a center conductor 4502. At the left and right sides of FIG. 45, at x=+/−1000 mils, are stripline ports, 4504 and 4506. At the top and bottom of the plan view (y=+/−250 mils) are H-walls (4512 and 4514), or magnetic walls. Magnetic wall boundary conditions on the sides of the stripline waveguide are used to make the stripline appear periodic and infinitely wide in the +/−y directions. Due to symmetry of the unit cells and the way in which the stripline ports are defined, there exists a theoretical magnetic wall 4512, 4514 along the center line of each horizontal pair of coupled lines. This results in modeling the transmission of a plane TEM wave that travels in the x direction across a 2D stripline EBG structure.

The stripline substrate is modeled with two FR4 laminate dielectric layers that have a relative permittivity of 4. The two dielectric layers, one on either side of the periodic center conductor, are each 5 mils thick for a total substrate height of 10 mils. The conductors are assumed to have zero thickness and all materials are modeled as being lossless. As in the other simulations of the disclosure, where a conductor is said to have zero thickness for simulation purposes, it should be understood that this represents a conductor of finite thickness, sufficient to carry electrical current and having a thickness greater than at least several skin depths at the frequency being modeled.

Figure 46:
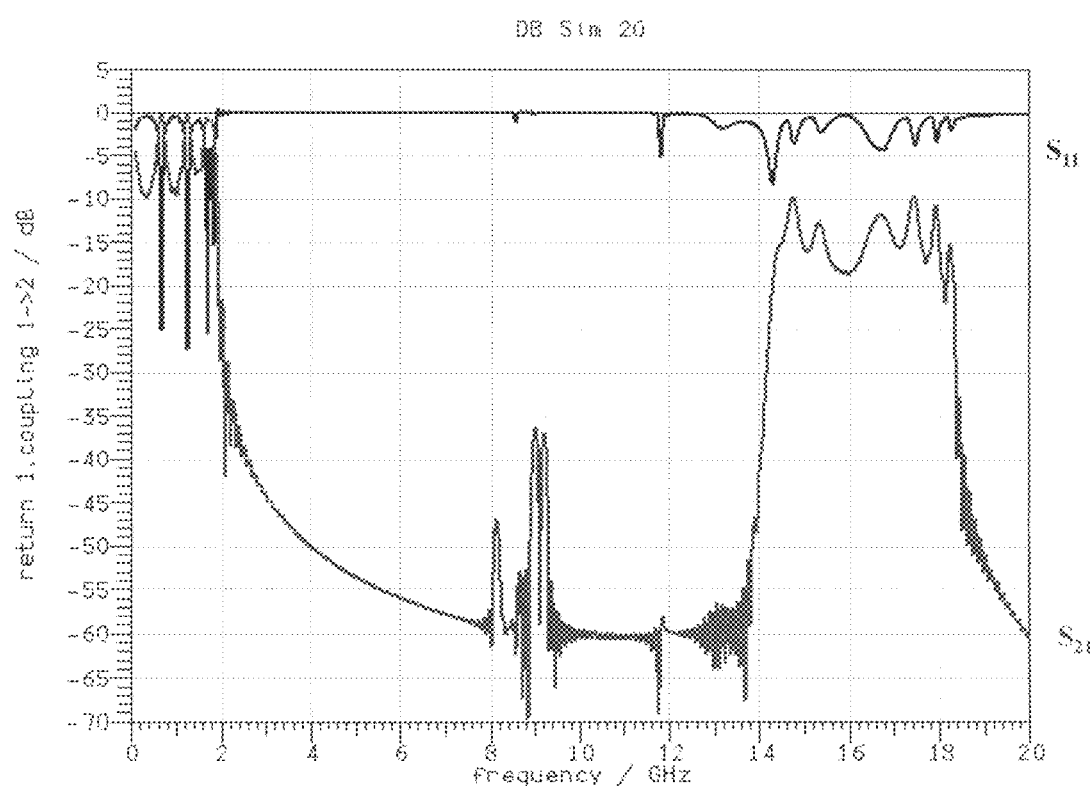
FIG. 46 shows the S parameters for the full-wave simulation of the structure of FIG. 45.

The simulated S parameters for FIG. 45, for transmission and reflection, are shown in FIG. 46. The transmission plot shows a fundamental stopband beginning near 2 GHz (−20 dB transmission) and extending up to near 8 GHz, which is about a 4:1 ratio of the upper to the lower stopband limit frequencies. Higher frequency stopbands are also observed, such as between about 9.5 GHz and about 14 GHz. Attenuation in the fundamental stopband ranges from 30 dB to more than 55 dB, although the entire EBG structure extends only 1000 mils in the direction of wave propagation.

The area enclosed by the dotted line in FIG. 44 encompasses an area 4430 that may be associated with an equivalent circuit. Assume that electromagnetic waves propagate in the x direction. The longitudinal center lines of the coupled lines 4420, parallel to the x axis, are magnetic walls. This property may be inferred as the symmetry of the unit cells results that each coupled line with a center line parallel to the x axis is driven in its even mode. The dotted line crossing point A is a reference plane denoting one end of the two-port equivalent circuit. The dotted line crossing point D is a reference plane denoting the other end of the two-port equivalent circuit. Points B and C denote reference planes where equivalent transmission lines are connected to midpoints along a side of the patches 4410. Points G and H are on a reference plane where a magnetic wall terminates the ends of a y-directed pair of coupled lines.

Similarly to the equivalent circuit model for sub-example one (FIG. 35), one-half of each unit cell may be modeled with an equivalent circuit. A full period may be modeled by two identical cascaded equivalent circuits. The equivalent circuit for the stripline waveguide shown in FIG. 47, and includes seven transmission lines denoted by the letters of the nodes at the end of each line. TL-AB and TL-CD are uniform lines of width d. TL-BC is one of the coupled lines, and its characteristic impedance is the even mode value, $Z_{oe}$, since a magnetic wall is the boundary condition along the centerline of the coupled lines. TL-EG and TL-FH are another coupled transmission line pair.

The parameter Δ is the extra line length assigned to the narrower stripline at the step discontinuity in line width going from a width of d down to $w_1$ and may be computed as:

$$\Delta = \frac{D_1}{\pi}\frac{Z_{o1}}{Z_{o2}}\ln\left[csc\left(\frac{\pi}{2}\frac{D_2}{D_1}\right)\right] - \frac{b\ln(2)}{\pi}$$

where $D_1$ and $D_2$ are the effective widths of the wider and narrower striplines respectively, b is the substrate height, and $Z_{o1}$ and $Z_{o2}$ are the characteristic impedances of the wider and narrower striplines. This formula was derived from a formula given by Oliner (Discontinuities in the Center Conductor of Symmetric Strip Transmission Line, 1960, IRE Trans. Microwave Theory and Tech., pp. 328-339), and the relationship for the equivalent series inductance of a short stripline, $L=Z_0\sqrt{\in_r}d/c$, where d is the length of the line, c is the speed of light, and $\in_r$ is the relative dielectric constant of the substrate.

Figure 47:
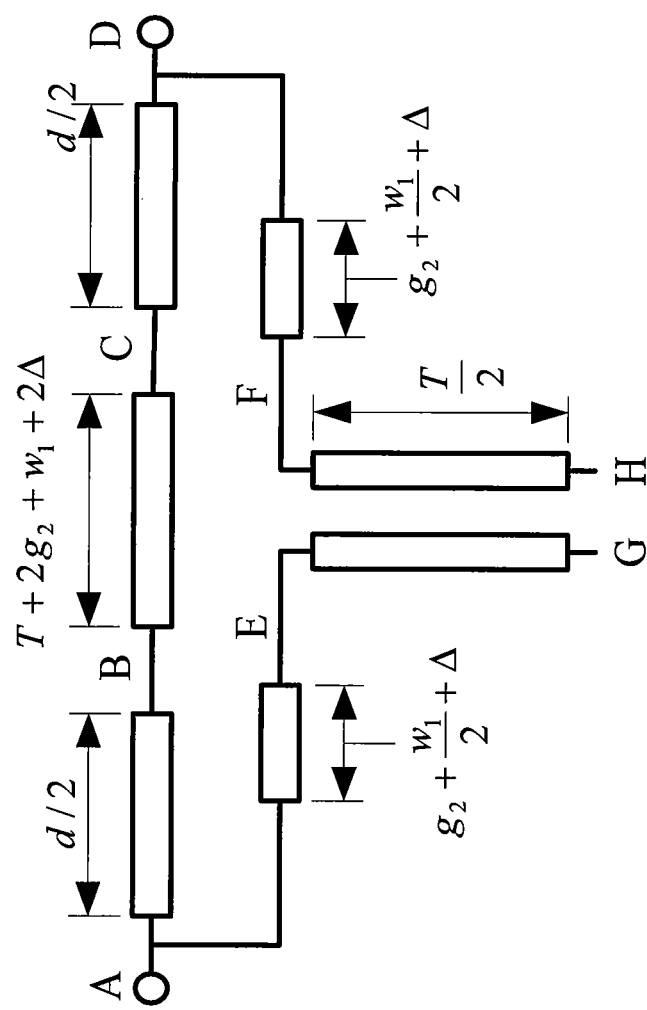
FIG. 47 shows an electrical equivalent circuit model for a half unit cell of the structure of FIG. 45: (a) schematic; and, (b) variable definitions.
Figure 48:
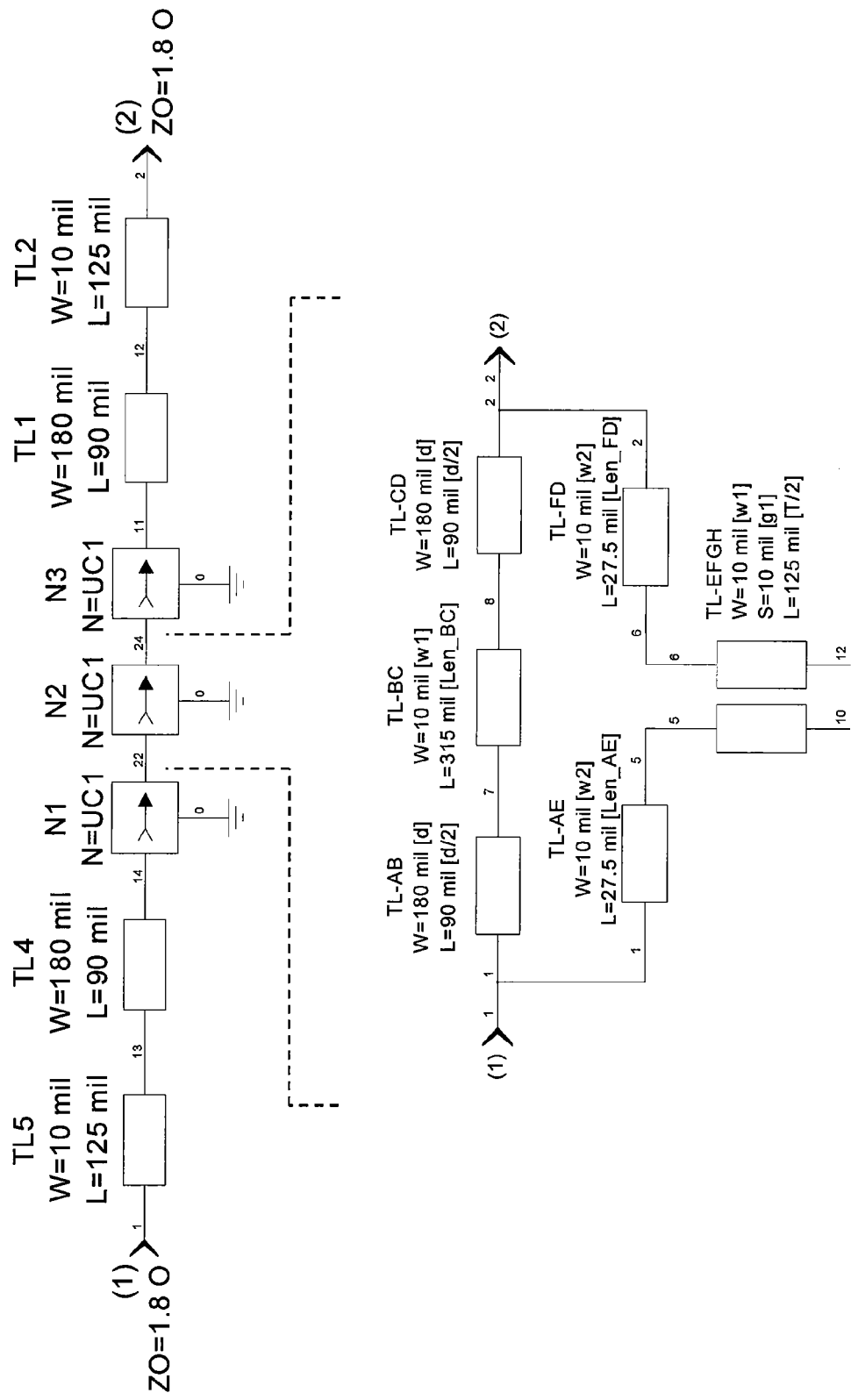
FIG. 48 shows an equivalent circuit for the stripline geometry of FIG. 45.

FIG. 48 shows a schematic where three of the equivalent circuits of FIG. 47 are cascaded to model the finite-length waveguide. The upper part of this schematic shows network blocks N1, N2, and N3 which reference the unit-cell equivalent circuit shown in the bottom of FIG. 48. The stripline total substrate height is 10 mils and the substrate relative dielectric constant is 4.8. The circuit schematic was generated and the circuit simulation was performed using Genesys.

Figure 49:
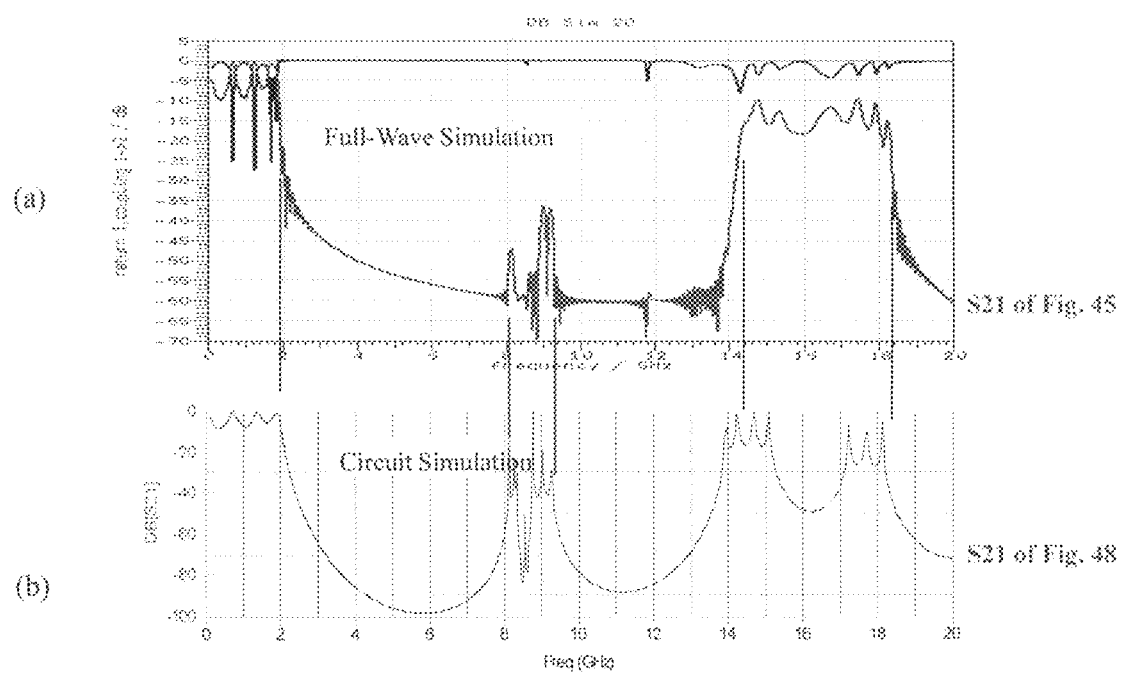
FIG. 49 shows a comparison of transmission responses for: (a) full-wave simulation; and, (b) vs. the circuit model of FIG. 47.

FIG. 49 shows a comparison of a full-wave simulation performed using the methods previously described, and the circuit simulation transmission plots for the present example. Empirically, by increasing the substrate dielectric constant in the circuit model from 4.0 to 4.8, good agreement of the band edge frequencies was obtained between full-wave and circuit simulations for frequencies up to at least about 14 GHz.

Figure 50:
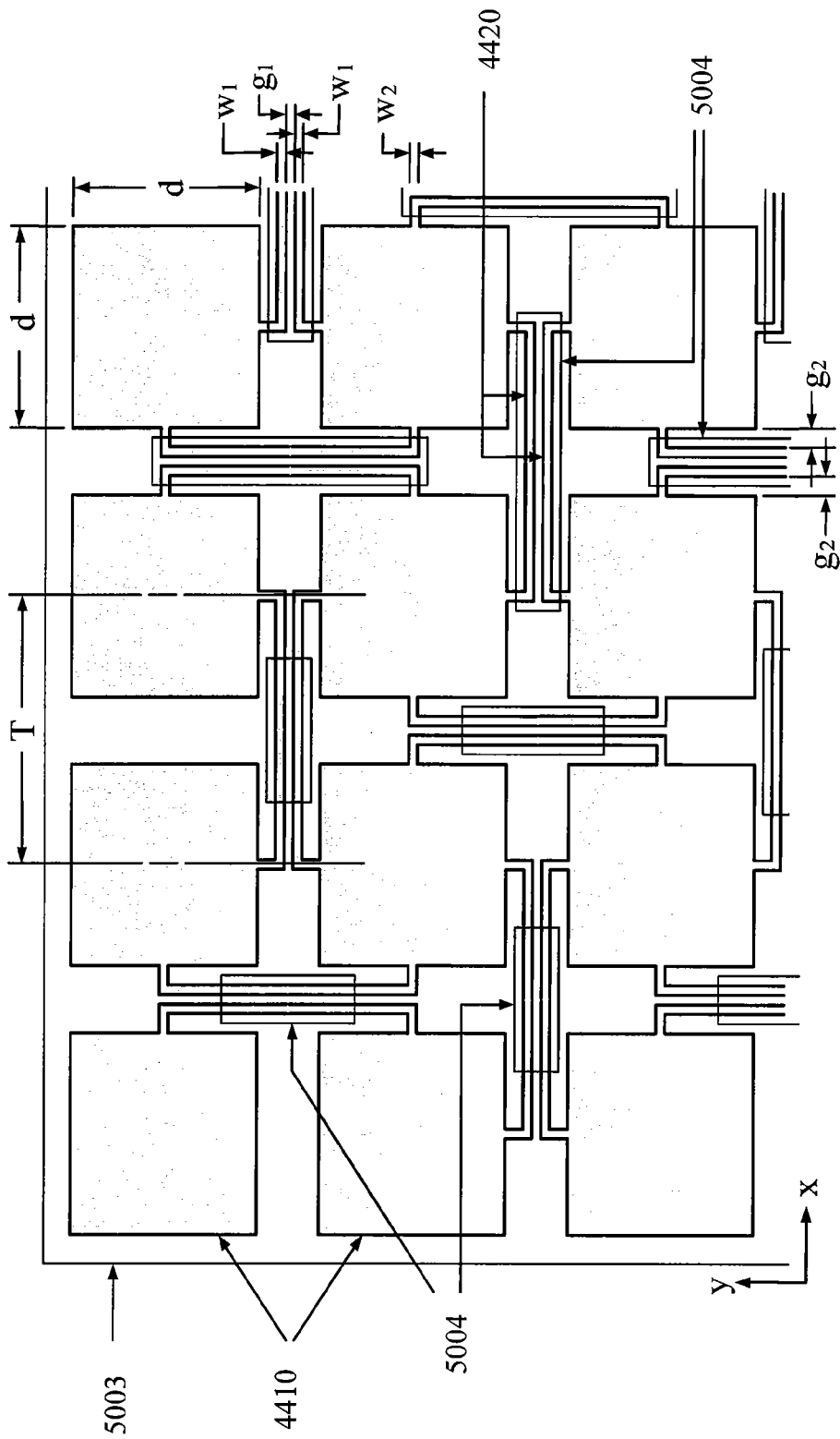
FIG. 50 shows sub-example seven of example eight.

A seventh sub-example of example eight is shown in FIG. 50. This example is similar to that shown in FIG. 44 but has one or more adjacent conductive plane(s) 5003 in which slots 5004 are formed disposed opposing the coupled transmission lines 4420 that interconnect patches 4410. The adjacent conducting plane may be a single ground plane as in a PPW, or both upper and lower ground planes as in a stripline waveguide. The slots 5004 may extend under a portion of the coupled lines 4420 as shown, or under the entire area occupied by the coupled lines 4420. The slots 5004 increase the even-mode characteristic impedance of the coupled lines. Increasing the ratio of the even-mode characteristic impedance for the coupled lines to the characteristic impedance of the patch transmission line, may increase the bandwidth ratio (upper-to-lower-band-edge frequency ratio) of the fundamental stopband.

Figure 51:
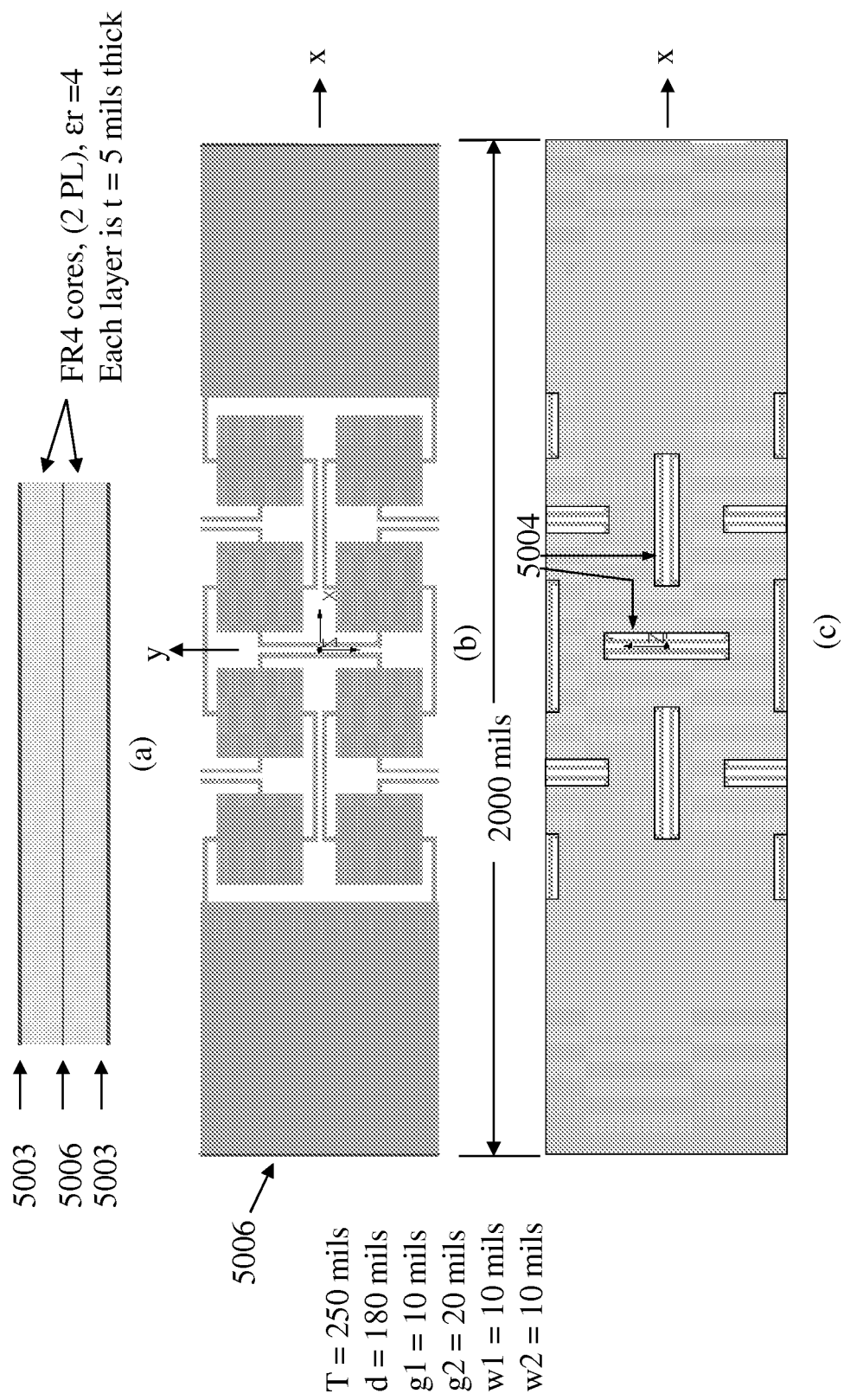
FIG. 51 shows a stripline model for the full-wave simulation of the structure of FIG. 50: (a) profile view; (b) plan view of the center conductor; and, (c) plan view showing all three metal layers with dielectric layers omitted.
Figure 52:
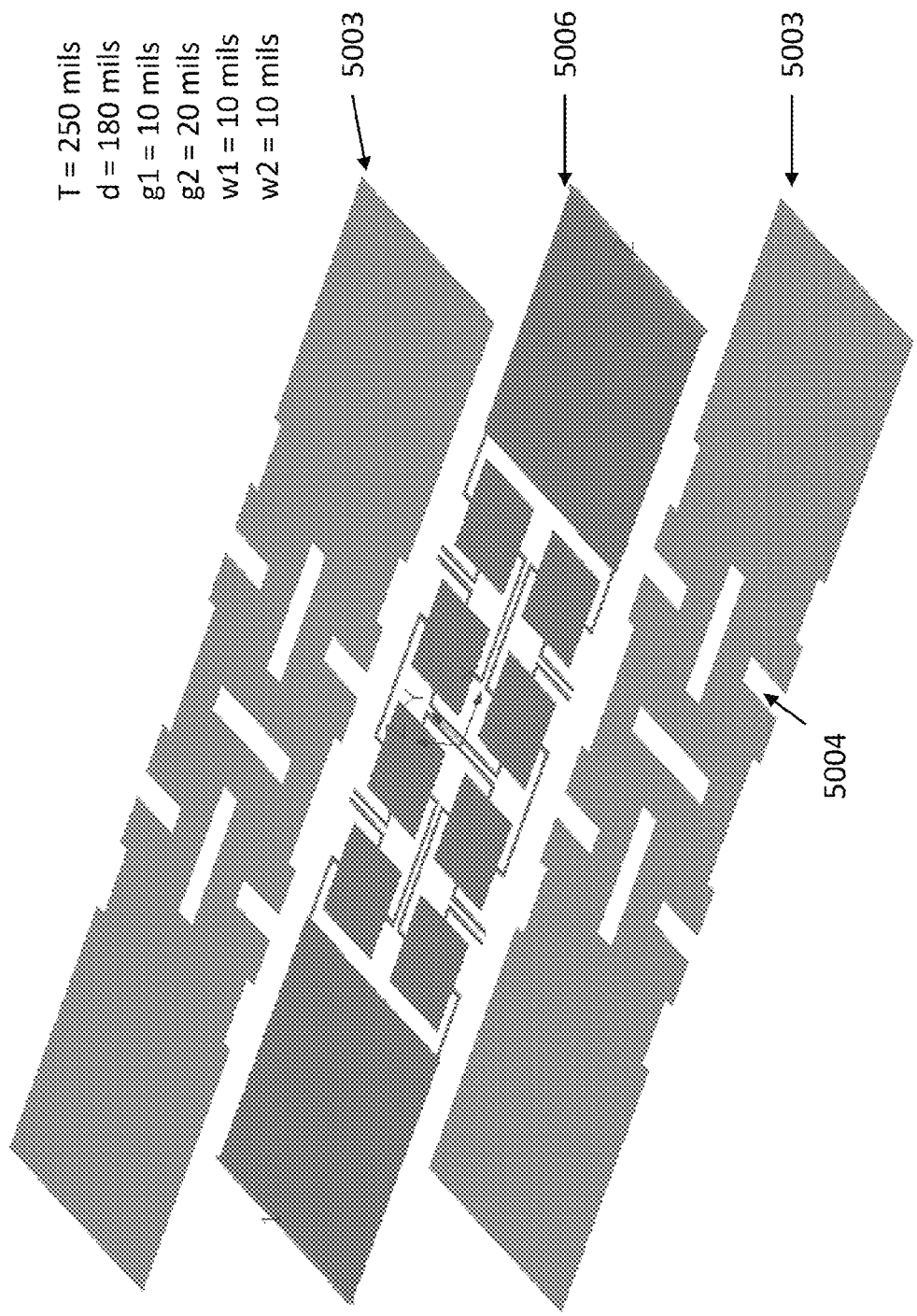
FIG. 52 shows an exploded view of the structure of FIG. 51, with the dielectric layers omitted.

An eighth sub-example of example eight is shown in FIG. 51, is a full-wave Microstripes model of a stripline waveguide that has the same design parameters, and where the overall dimensions, boundary conditions, and port definitions are the same as for the example of FIG. 45, except that slots 5004 are formed in the ground planes next to each coupled line pair. The slots 5004 have a length of $T+w_2$ and a width of $g_1+2w_1+2g_2$. The size and shape of each slot are not critical. As in the previous examples with ground plane slots, an objective is to raise the even-mode characteristic impedance of each coupled line. FIG. 51a illustrates the arrangement of layers in the z direction where the total substrate height is 10 mils. FIG. 51b is a plan view of the center conductor 5006, and FIG. 51c is plan view of all the metal layers, with the dielectric layers omitted. The individual lines in FIG. 51c represent the transmission line as viewed through the slots. FIG. 52 shows an exploded view of the structure of FIG. 51, where the slots 5004 in the upper and lower conducting planes may be seen.

Figure 53:
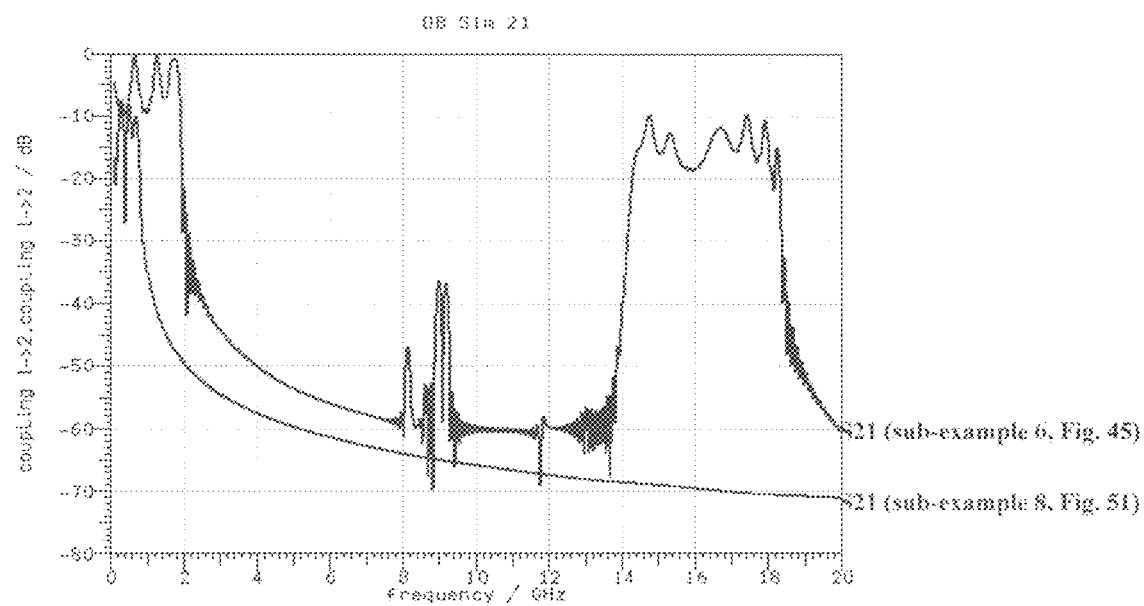
FIG. 53 shows a comparison of $S_{21}$ for the stripline examples of sub-examples six and eight.

FIG. 53 shows the comparison of transmission response S21 for both sub-example six of FIG. 45 and sub-example eight of FIG. 51 as determined from the Microstripes full-wave model. For sub-example 8, the lower band edge of the fundamental stopband (the cutoff frequency) has been decreased from about 2 GHz to about 810 MHz, a 59% reduction. No changes in dimensions or dielectric constants were made. Furthermore, the bandwidth ratio of the fundamental stopband has increased from a 4:1 ratio for sub-example six to more than a 20:1 ratio for sub-example eight. The upper edge of the fundamental stopband has moved beyond 20 GHz, and suppression of the TEM mode at microwave frequencies exceeds 50 dB for all frequencies in the approximately 2 GHz to greater than 20 GHz range.

Although the first sub-example of example eight, for example, was illustrated with symmetrically-shaped dumbbell slots, this is not a restriction. As shown in sub-example nine, the generating slots may be asymmetric, for example, such that the ends of the dumbbell shape may be offset. A periodic conductive layer such as that shown in FIG. 54 may be created. In this example, a conductive layer 5402 is formed by asymmetric dumbbell-shaped slots 5401 arrayed in a periodic pattern.

Figure 54:
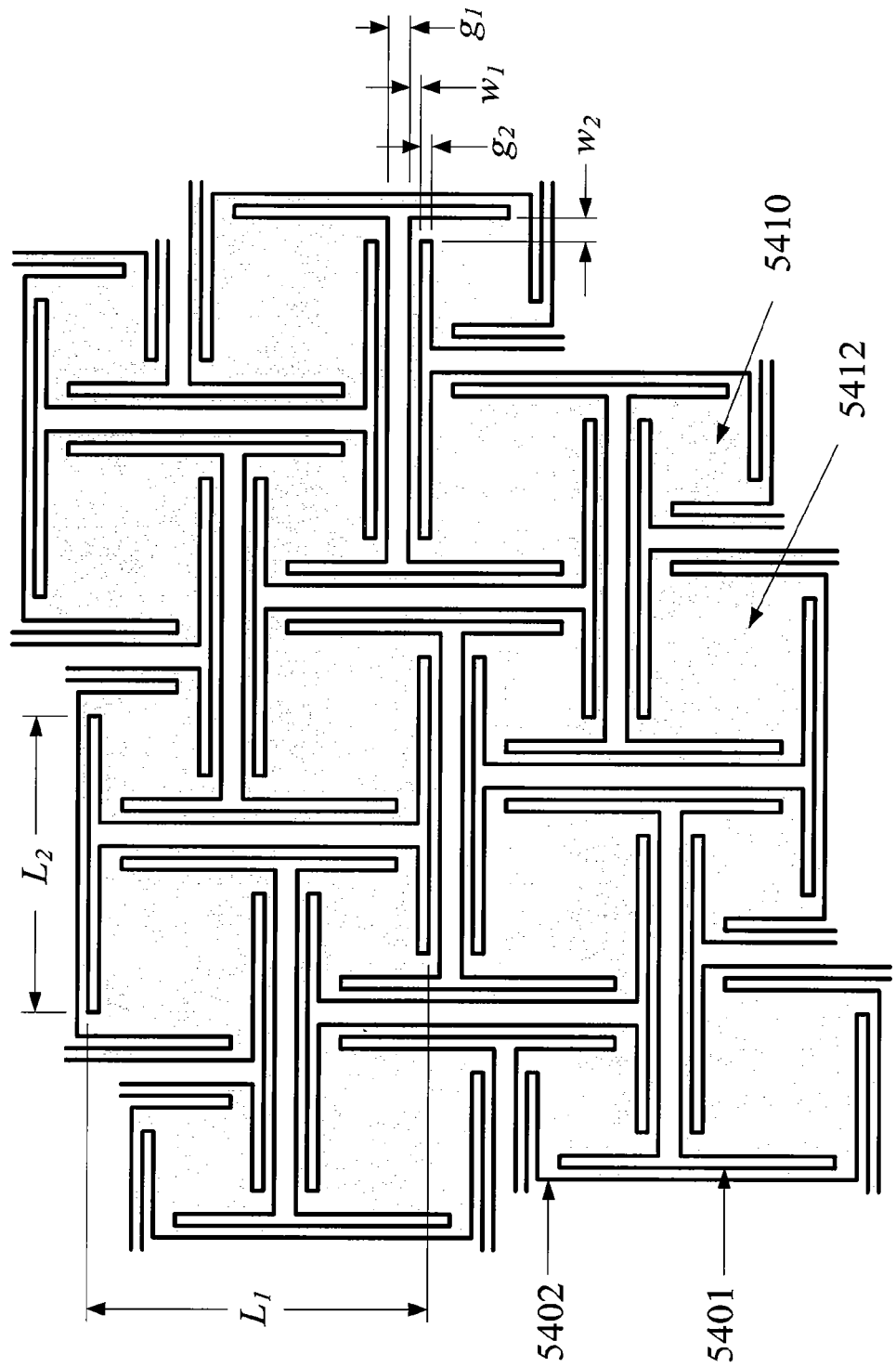
FIG. 54 shows sub-example nine of example eight which is a dual-scale dumbbell-shaped slot EBG structure.

Alternatively, the ninth sub-example of example eight, shown in FIG. 45, may be generated starting with a periodic array of isolated but non-uniform patches and interconnecting the non-uniform patches with pairs of coupled transmission lines. This may be termed a dual-scale dumbbell slot EBG structure, as the resulting patches have two characteristic sizes: smaller patches 5410 and larger patches 5412. The two patch sizes are not restricted in ratio. FIG. 54 illustrates the coupled lines connecting to corners of the patches; however, the coupled lines may connect to any point on the perimeter of the patch including the midpoint.

Any of the techniques known in the art for patterning printed circuit boards may be used to form the slots, the transmission lines and other structures described herein. Similarly, where the structure is other than a printed circuit board, other appropriate construction techniques may be used. Slots will raise the characteristic impedance of the inductive traces, thereby lowering the cutoff frequency of the EBG structure, and increasing the stopband ratio. When using slots to achieve this effect, rather than by reducing the width of the narrow traces, higher currents may flow through the high-impedance lines without fusing them. In another aspect, if the cutoff frequency of an EBG power plane is adequate, but the current carrying capability is not adequate, ground plane slots may be disposed below the inductive traces to allow the width of the inductive traces to be increased. As such, the characteristic impedance of the narrower trace on a solid ground plane may be equivalent to a wider trace on a slotted ground plane.

Extending the length of the high-impedance transmission line between patches may also lower the cutoff frequency. The S-shaped transmission lines 5520, shown as sub-example ten, in FIG. 55 wrap around the sides of patches 5510, forming a spiral of traces around each patch. Slots 5504 are formed in an opposing ground plane 5503 under at least a portion of the high-impedance lines to reduce the distributed capacitance, which further raises the characteristic impedance. Slots 5504 may be formed under only the middle section of line, as shown, or under the entire length of high-impedance line 5520.

Figure 55:
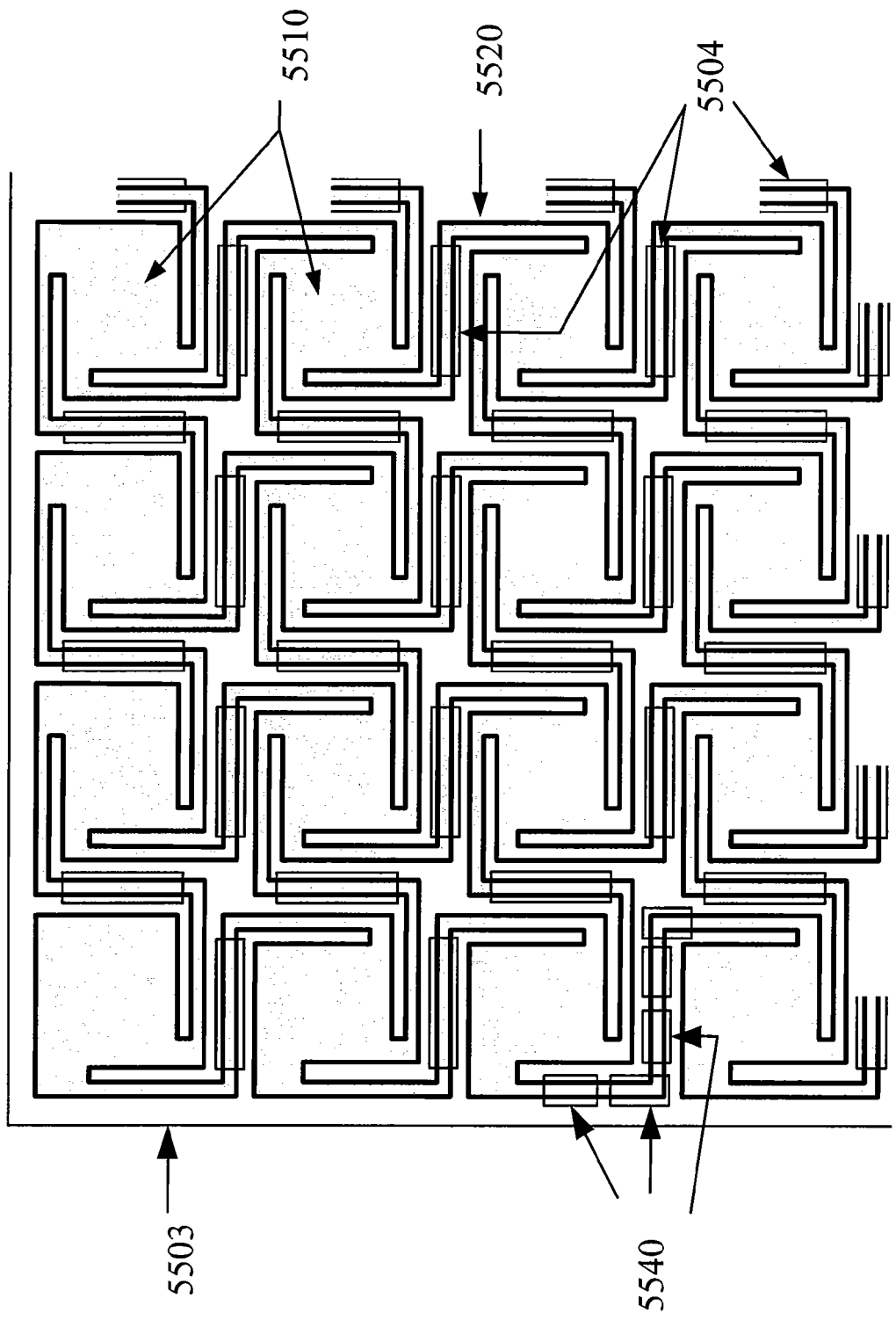
FIG. 55 shows sub-example ten of example eight.

The slots formed below high-impedance lines may become self-resonant as a half-wave resonator if the frequency is sufficiently high. One means of avoiding this parasitic resonance is to short the slot with a narrow trace. This is physically equivalent to placing two narrow slots end-to-end. Multiple shorter slots may be used to replace one long slot that runs under a inductive line. An example of this is technique is shown in FIG. 55 as multiple slots 5540.

Figure 56:
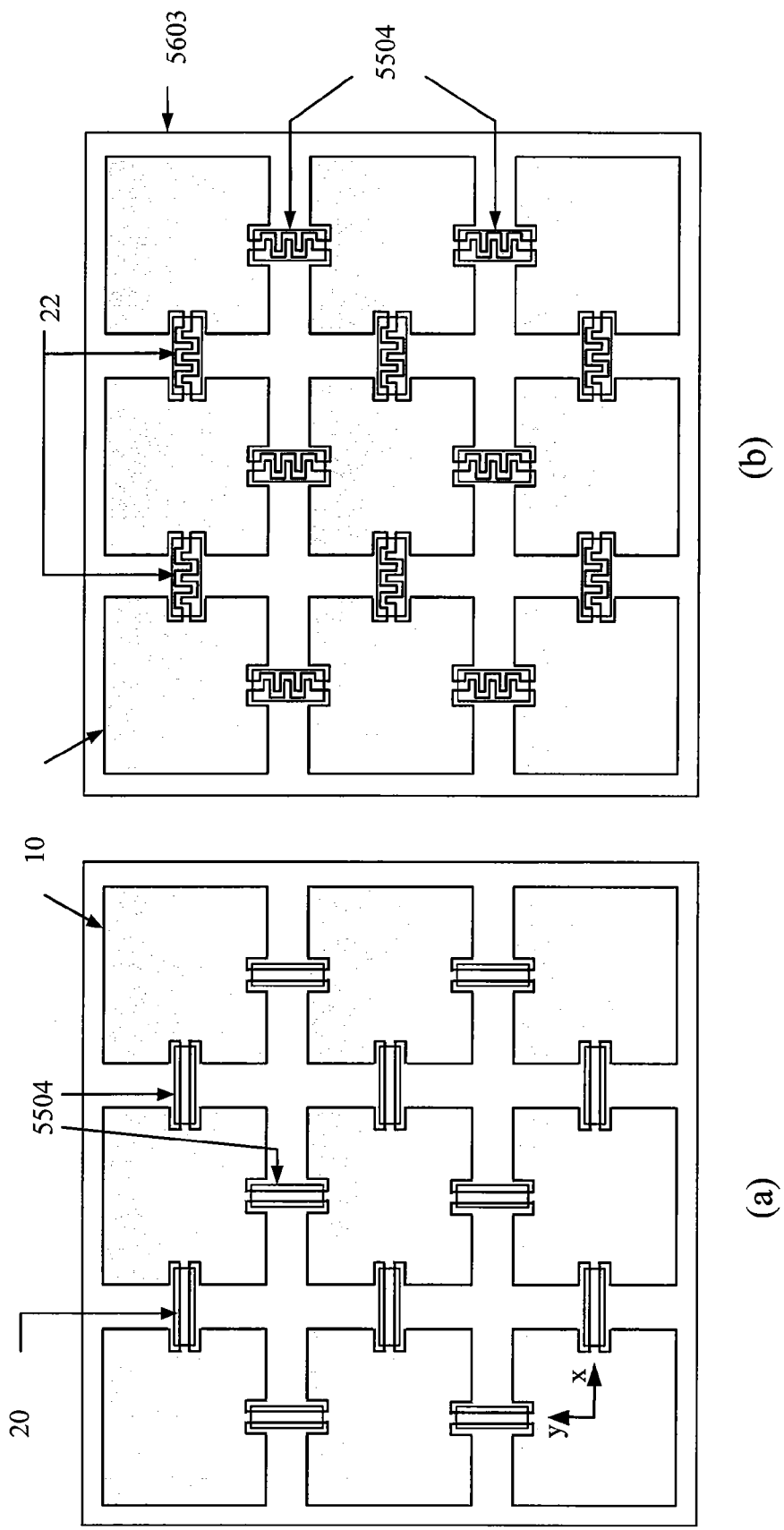
FIG. 56 shows sub examples eleven and twelve of example eight.

FIG. 56 illustrates sub-examples eleven and twelve, where slots are formed under high-impedance lines in coplanar EBG structures. FIG. 56*a* shows the uniplanar compact photonic bandgap (UC-PBG) conductor of FIG. 1 formed by patches 10 interconnected by straight traces 20 forming high-impedance transmission lines. One or two ground planes 5603 may be placed next to the UC-PBG layer, each of which has slots 5504 formed at locations under the straight traces 20. FIG. 56*b* shows another example where the high-impedance lines that connect patches are realized as meandering traces 22 to extend their effective length. Slots 5404 are formed under these meandering traces to raise the characteristic impedance of the transmission line.

These examples may be realized in, for example a PPW or stripline structure. Slots 5404 located opposing the traces or transmission lines may be formed in one ground plane for a PPW arrangement, and the slot 5404 may be formed in both the upper and the lower ground planes for a stripline waveguide arrangement.

Figure 57:
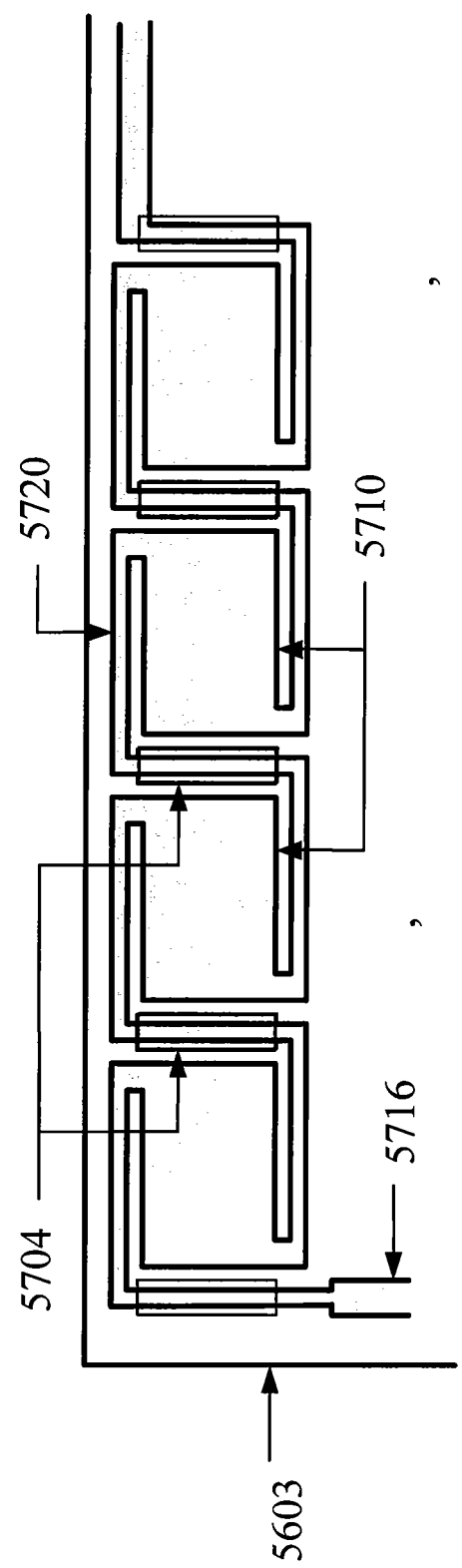
FIG. 57 shows sub-example thirteen of example eight, which is a one-dimensional (1D) periodic array.

The periodic waveguides of the previous aspects of example eight have been shown as two dimensional arrays. However, a one dimensional array may be also formed. 1D periodic arrays may be incorporated into power line traces. FIG. 57 is a thirteenth sub-example of example eight and illustrates a S-shaped high-impedance transmission line 5720 is wrapped between the low-impedance transmission lines 5710. This represents a series circuit of high- and low-impedance lines that form a part of a power trace 5716. The trace may be a microstripline or the center conductor of a stripline where one or two adjacent ground planes are located parallel to the power trace. Slots 5704 are formed in the ground plane or planes at locations under a portion of the length of or all of the length of the transmission lines 5720. Each period of the structure may contain one slot (as shown) or multiple slots. The slots reduce the distributed capacitance of the transmission lines 5720 thus raising the characteristic impedance of the transmission line. A higher ratio of characteristic impedance between the high- and the low-impedance transmission lines may lower the cutoff frequency of the fundamental stopband and increase the bandwidth ratio of the stopband.

Figure 58:
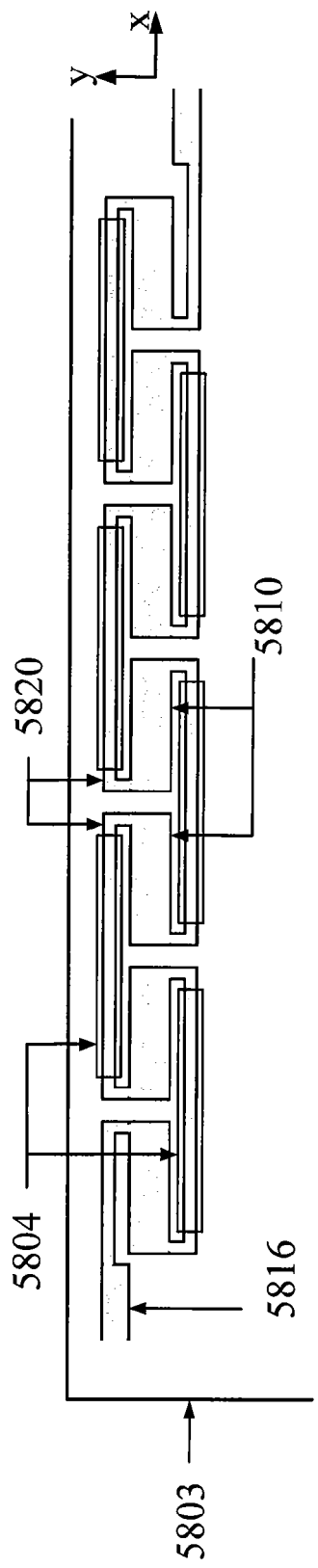
FIG. 58 shows sub-example fourteen of example eight, which is another one-dimensional (1D) periodic array.

Sub-example fourteen of example eight, shown in FIG. 58, is another arrangement of a 1D coplanar EBG structure for use as a power trace. This is similar to the periodic series circuit shown in FIG. 57, except that the high-impedance transmission lines 5820 begin and end on the same side of the row of low-impedance transmission lines 5810. The characteristic impedance of the lines 5820 may be increased by slots formed in the adjacent ground planes 5004.

Noise signal waveforms propagating through power distribution systems are independent of the polarity of the DC voltages applied to the power and ground planes. Hence, it is equally possible to reverse the descriptions of the power and ground planes in the examples presented and the electromagnetic analysis or performance of the EBG structures would be unaffected. That is, the ground plane may be patterned with patches connected with isolated or coupled transmission lines, and the power plane may be left as an essentially solid conductive plane; the change would not alter the stopband properties of the EBG structure. In addition, within the same PCB, one may alternate the coplanar EBG conductor (and equivalently the solid conductive plane) between the power plane and ground planes (that reside on different layers) as a function of position on the printed wiring board.

In another aspect, the periodicity of an array may be different in the orthogonal directions and may result in differing propagation characteristics in the orthogonal directions. Inductive coupling between patches may be limited to one of the orthogonal directions over some or all of the array.

Any of the configurations of example eight may be combined with any of the examples of a resonant via to produce a hybrid EBG structure. Example nine compares the performance of a PCB configured for a hybrid EBG structure, with coupled transmission lines and slots disposed opposing the coupled transmission lines for the situation where (i) no discrete capacitors are connected to the resonant vias and (ii) a 1000 pF capacitor is connected between each of the vias and the associated patch. To a substantial extent, the omission of the discrete capacitors in case (i) causes the structure to act predominantly as a inductive-grid EBG structure, whereas the capacitor in case (ii) causes the structure to act as a hybrid EBG structure.

Figure 59:
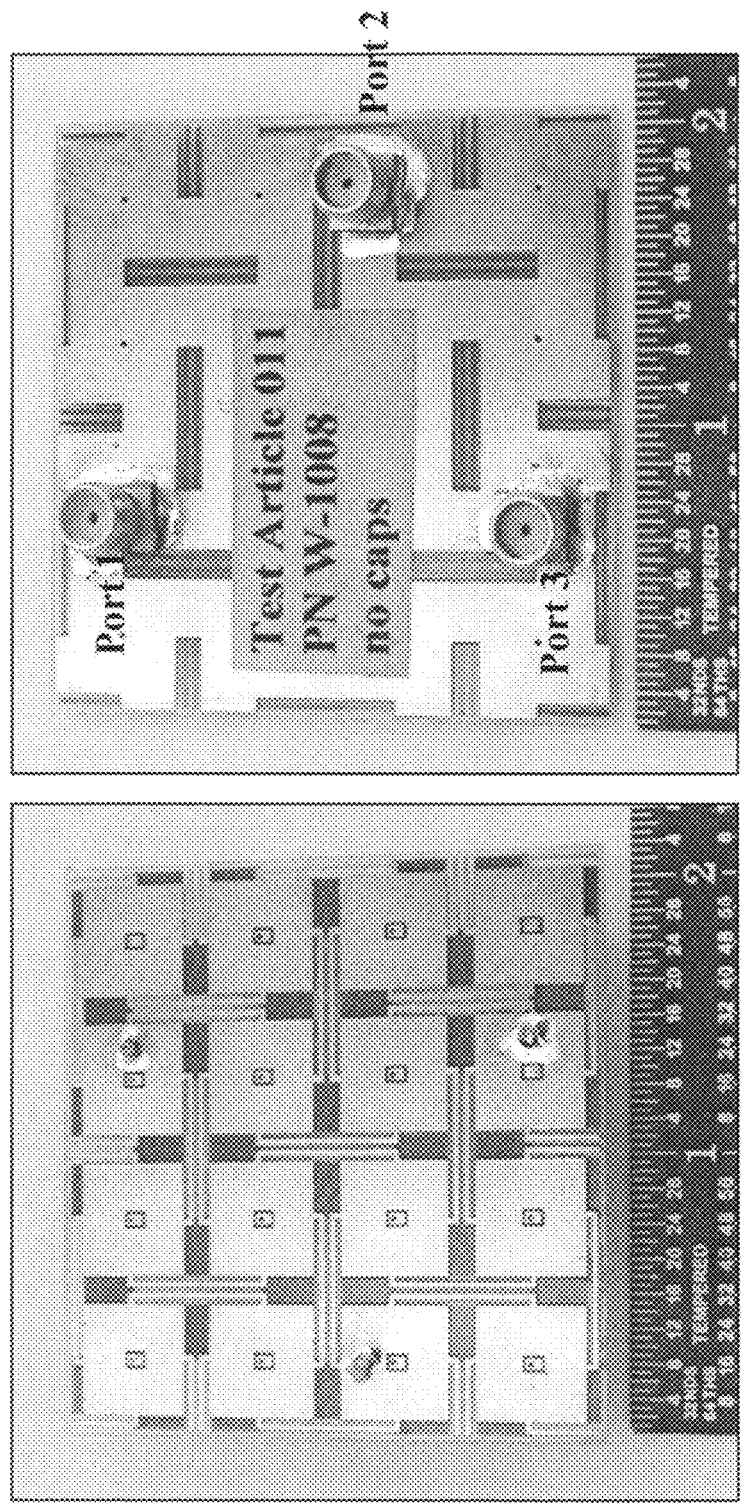
FIG. 59 shows an EBG structure having patches connected by coupled transmission lines: (a) front side; and (b) rear side showing coaxial test connectors.
Figure 60:
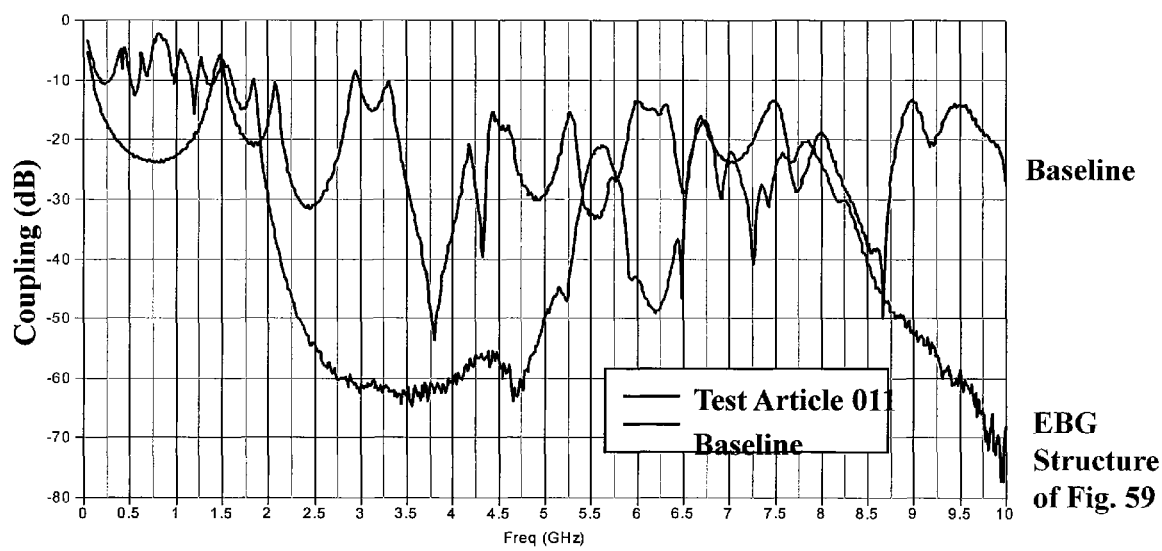
FIG. 60 shows the measured coupling $S_{21}$ between two test ports of the EBG structure of FIG. 59 compared with a baseline test article.

FIG. 59(*a*) illustrates a surface of a PCB having the patches and coupled transmission lines and FIG. 59(*b*) illustrates the opposing surface having the slots disposed opposing the coupled transmission lines and the coaxial connectors installed for testing purposes. FIG. 60 illustrates the measured S21 coupling parameter as the lower curve, and a similar measurement on a test article comprising a PCB with solid power and ground planes and no vias, and having the coaxial connectors disposed in the same locations as in FIG. 59(*b*). A stopband is observed between about 2 GHz and about 5.3 GHz.

Figure 61:
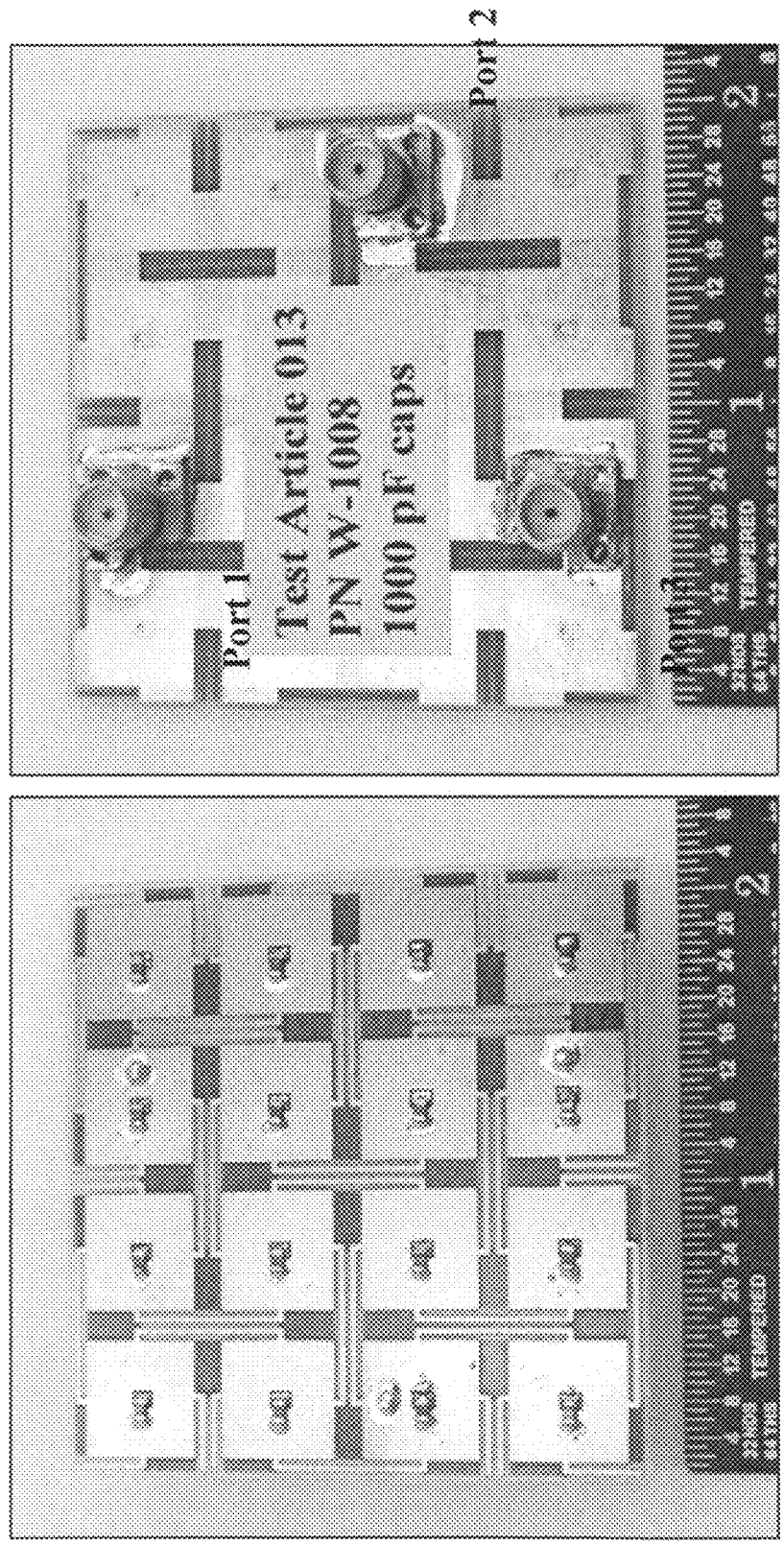
FIG. 61 shows the EBG structure of FIG. 59 having chip capacitors connecting the vias with the corresponding patch: (a) front side; and (b) rear side showing coaxial test connections.
Figure 62:
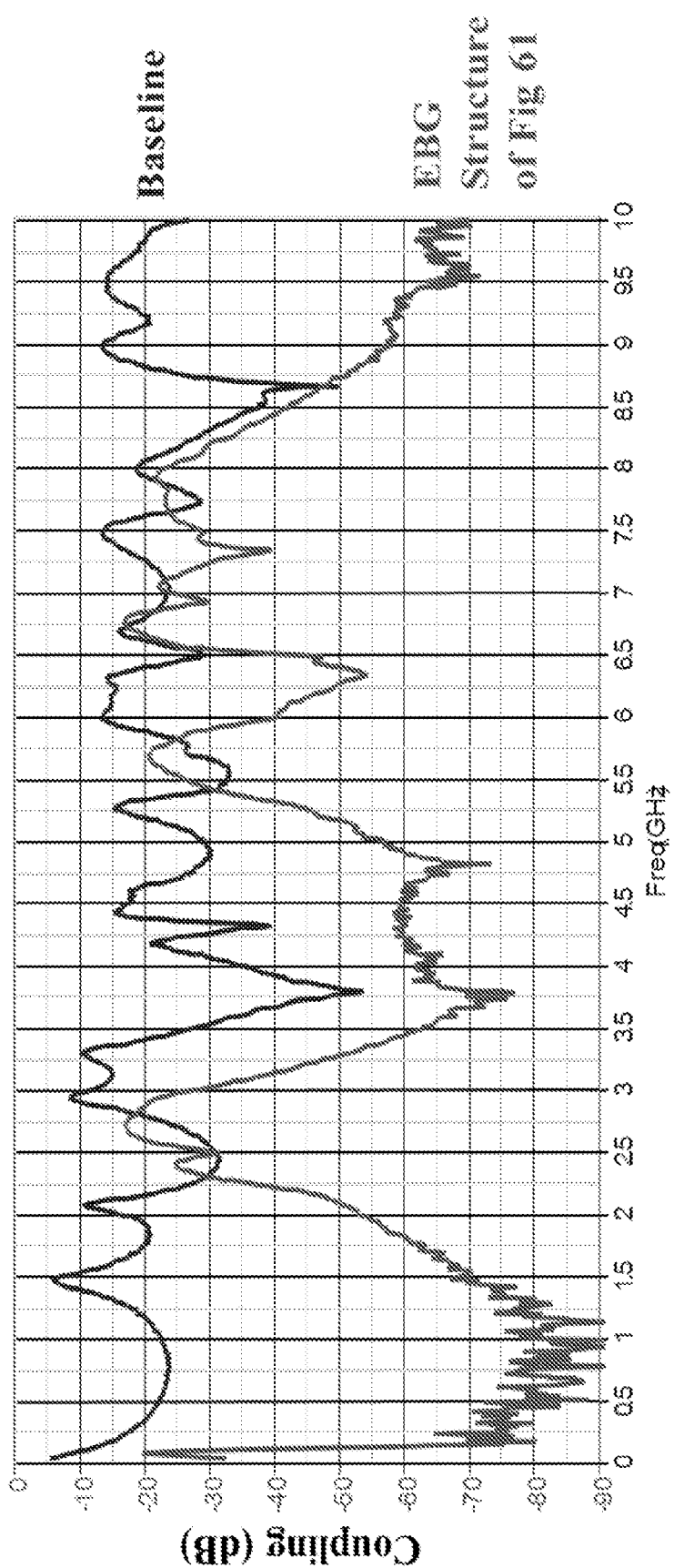
FIG. 62 shows the measured coupling $S_{21}$ between two test ports of the EBG structure of FIG. 61 compared with a baseline test article.

FIG. 61(*a*) illustrates the same surface of the PCB as illustrated in FIG. 59(*a*), except that 1000 pF SMT capacitors have been connected from the via to patch associated with the via. FIG. 61(*b*) shows the same printed circuit design as FIG. 59(*b*). The hybrid EBG structure using coupled transmission lines has a measured S21 coupling parameter shown in FIG. 62 as the lower curve. The stopband lower band edge has been substantially reduced in frequency and the fundamental stopband extends from about 120 MHz to about 2300 MHz, for an approximately 19 to 1 bandwidth.

Figure 63:
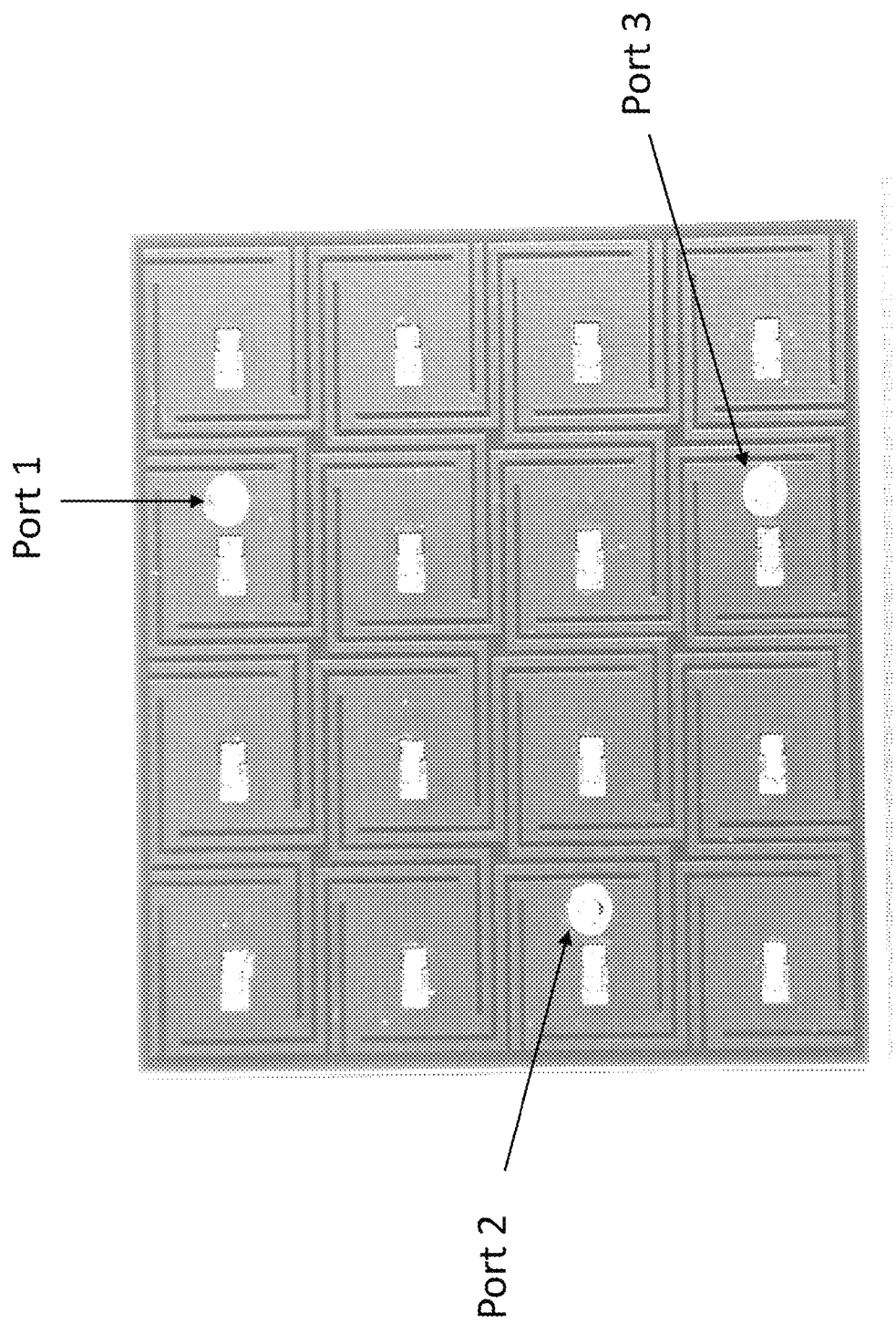
FIG. 63 shows an EBG structure having patches connected by S-shaped transmission lines and having chip capacitors connecting the vias with the corresponding patch.

Example ten compares the performance of a hybrid EBG structure with that of a parallel-plate waveguide having a lattice of resonant vias disposed on the same spacing pattern as the resonant vias in the hybrid EBG structure. FIG. 63 illustrates the surface of the hybrid EBG structure having the resonant via capacitors and the inductive traces between the patches. The hybrid EBG structure is constructed on a 16 mil thick FR4 dielectric substrate. The square patches have a period of 500 mils. All lines and spaces have a 20 mil width. Thus the side length $d_1$ of the square patches is 360 mils. S-shaped inductive traces having an approximate length $d_2$ of 1300 mils interconnect adjacent patches. Panasonic chip capacitors of size 0603 and having a capacitance of 10,000 pF connect the 20 mil diameter vias to the patches. The vias are directly connected to the opposing conductive surface. The via inductance is estimated at 0.33 nH.

Figure 64:
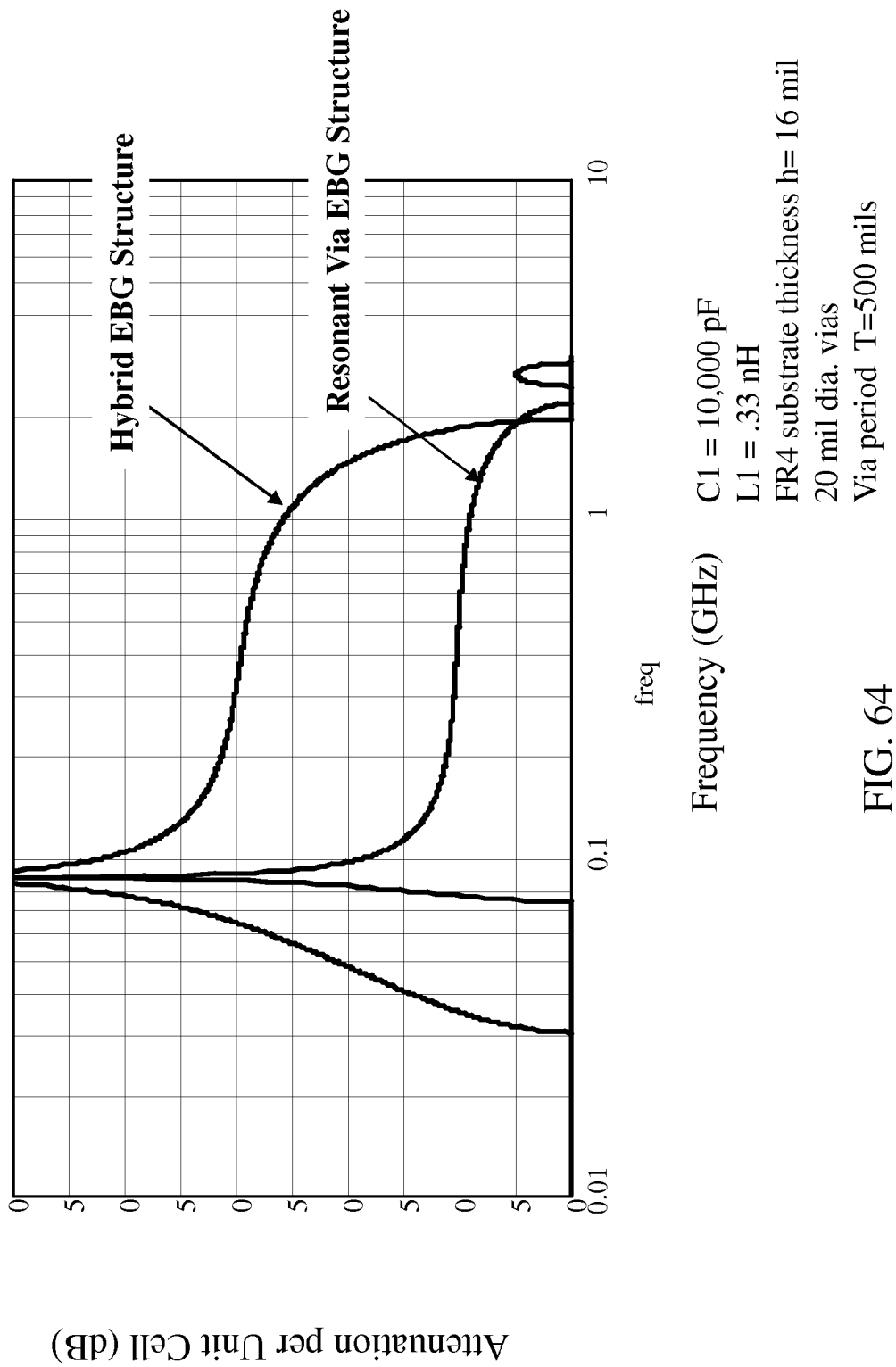
FIG. 64 shows a comparison of the computed attenuation in the hybrid EBG structure of FIG. 63 with a simpler resonant via EBG structure of identical resonant vias having the same spacing.
Figure 65:
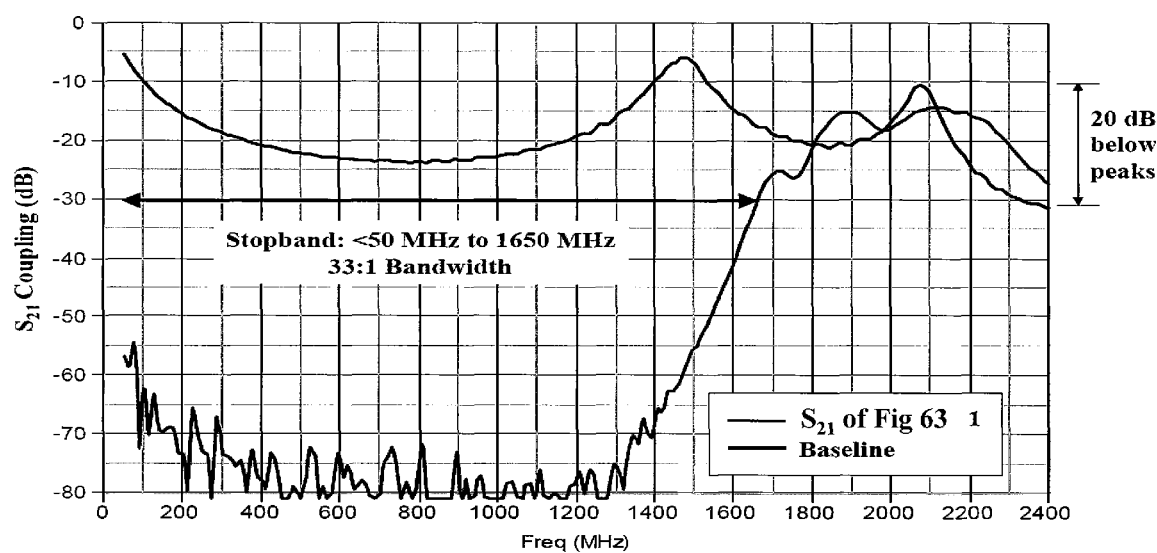
FIG. 65 shows the measured coupling $S_{21}$ between two test ports of the EBG structure of FIG. 63 compared with a baseline test article.

FIG. 64 shows the predicted theoretical attenuation in dB per unit cell as a function of frequency. A comparison is made between the hybrid EBG structure of FIG. 63 and a similar resonant via EBG structure that has the same thickness, dielectric constant, period, and the same resonant vias implemented with 10,000 pF chip capacitors and 20 mil diameter vias. The salient difference between the two EBG structures is that the hybrid structure has an etched power plane and the resonant via EBG structure has a solid power plane. The lower band edge for the hybrid EBG structure is calculated at 33.34 MHz from equation (21) where the effective series inductance $L_2$ is given as $Z_{o2}\sqrt{\epsilon_{eff2}}d_2$,c, $Z_{o2}$ and $\epsilon_{eff2}$ are the characteristic impedance and effective dielectric constant of the S-shaped transmission lines, c is the speed of light in a vacuum. The lower band edge of the resonant via EBG structure is calculated as 74.3 MHz from equation (1). The stopband bandwidth of the hybrid EGB structure is twice that of the resonant via EBG structure; the attenuation per unit cell of the hybrid EBG is more than twice (in dB) that of the resonant via EBG structure. The lower curve in FIG. 65 illustrates the measured $S_{21}$ coupling for the hybrid EBG structure, and is substantially the same as the predicted attenuation.

Figure 66:
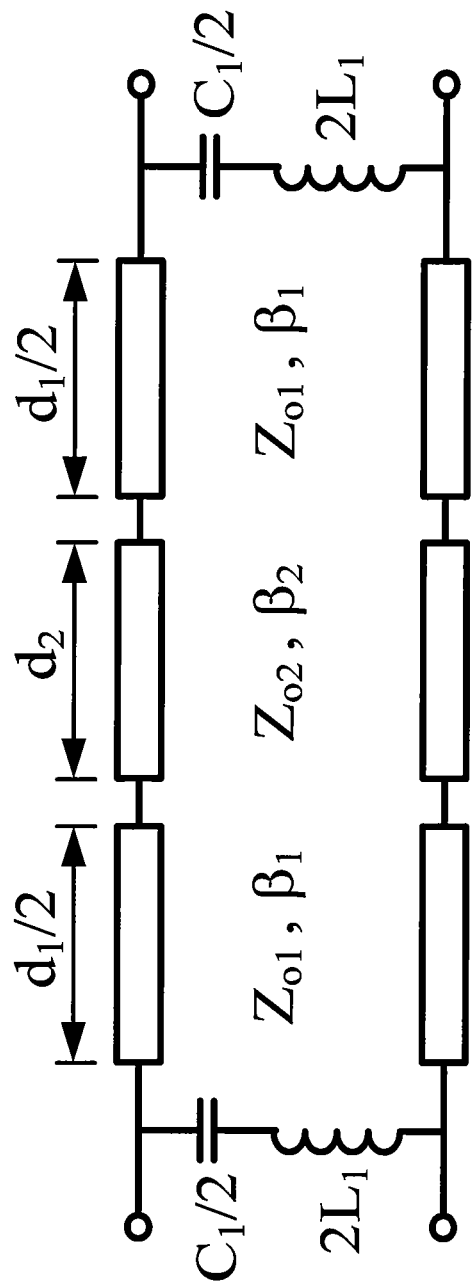
FIG. 66 is a unit cell equivalent circuit of the structure of FIG. 63.

Design of the hybrid EBG structure shown in FIG. 63 may be based on the dispersion equation for a hybrid EBG structure which may be modeled as the unit cell equivalent circuit of FIG. 66. The value of lumped capacitance used in each unit cell is $C_1$, and the value of the via inductance is $L_1$. The characteristic impedance and phase constant for each transmission line section in the unit cell is $Z_{on}$ and $\beta_n$, respectively, for n=1 or 2.

The characteristics of a unit cell may be expressed in terms of cascaded ABCD matrices:

$$\begin{bmatrix} A & B \\ C & D \end{bmatrix} = \begin{bmatrix} 1 & 0 \\ Y_s & 1 \end{bmatrix}\begin{bmatrix} A_1 & B_1 \\ C_1 & D_1 \end{bmatrix}\begin{bmatrix} A_2 & B_2 \\ C_2 & D_2 \end{bmatrix}\begin{bmatrix} A_1 & B_1 \\ C_1 & D_1 \end{bmatrix}\begin{bmatrix} 1 & 0 \\ Y_s & 1 \end{bmatrix} \quad (23)$$

where $Y_s$ is the shunt admittance on each end:

$$Y_s = \frac{1}{2}\frac{j\omega C_1}{(1-\omega^2 L_1 C_1)};$$

$$\begin{bmatrix} A_1 & B_1 \\ C_1 & D_1 \end{bmatrix} = \begin{bmatrix} \cos\left(\beta_1\frac{d_1}{2}\right) & jZ_{o1}\sin\left(\beta_1\frac{d_1}{2}\right) \\ \frac{j}{Z_{o1}}\sin\left(\beta_1\frac{d_1}{2}\right) & \cos\left(\beta_1\frac{d_1}{2}\right) \end{bmatrix};$$

and $$\begin{bmatrix} A_2 & B_2 \\ C_2 & D_2 \end{bmatrix} = \begin{bmatrix} \cos(\beta_2 d_2) & jZ_{o2}\sin(\beta_2 d_2) \\ \frac{j}{Z_{o2}}\sin(\beta_2 d_2) & \cos(\beta_2 d_2) \end{bmatrix}$$

The dispersion equation may be written as $$\cos(k_x(d_1+d_2))=A \quad (24)$$

which may be expanded to:

$$\cos(k_x(d_1+d_2)) = \quad (25)$$
$$\cos(\beta_1 d_1)\cos(\beta_2 d_2) - \frac{1}{2}\left(\frac{Z_{o1}}{Z_{o2}}+\frac{Z_{o2}}{Z_{o1}}\right)\sin(\beta_1 d_1)\sin(\beta_2 d_2) +$$
$$jY_sZ_{o1}\begin{bmatrix} \sin(\beta_1 d_1)\cos(\beta_2 d_2) + \\ \frac{1}{2}\left(\frac{Z_{o1}}{Z_{o2}}+\frac{Z_{o2}}{Z_{o1}}\right)\cos(\beta_1 d_1)\sin(\beta_2 d_2) + \\ \frac{1}{2}\left(\frac{Z_{o2}}{Z_{o1}}-\frac{Z_{o1}}{Z_{o2}}\right)\sin(\beta_2 d_2) \end{bmatrix}$$

The dispersion equation may be used to estimate engineering parameters such as the lower edge of the fundamental stopband, or the cutoff frequency, which will be denoted as $\omega_c=2\pi f_c$. At this frequency, the Bloch mode phase constant $k_x$ becomes $\pi/P$ where the period, P, is the length of $d_1+d_2$, and left-hand-side of the dispersion equation (19) tends to unity. At the cutoff frequency, the electrical lengths of $\beta_1 d_1$ and $\beta_2 d_2$ are small compared to unity and the dispersion equation may be solved for the cutoff frequency: $\omega_c$:

$$\omega_c = \sqrt{\frac{-b \pm \sqrt{b^2-4ac_2}}{2a}} \quad (26)$$

where $$a = \frac{-S}{c^2\omega_1^2}\sqrt{\epsilon_{eff1}\epsilon_{eff2}}\,d_1 d_2$$

$$b = \frac{4}{\omega_1^2} + \frac{S}{c^2}\sqrt{\epsilon_{eff1}\epsilon_{eff2}}\,d_1 d_2 + C_1\left\{\frac{Z_{o1}\sqrt{\epsilon_{eff1}}\,d_1}{c} + \frac{Z_{o2}\sqrt{\epsilon_{eff2}}\,d_2}{c}\right\}$$

$$c_2 = -4,$$

$\sqrt{\epsilon_{effn}}$ is the effective dielectric constant of each transmission line, c is the speed of light in a vacuum, and $$S = \frac{Z_{o1}}{Z_{o2}} + \frac{Z_{o2}}{Z_{o1}}.$$

A further simplification to the dispersion equation yields a formula which may be used to estimate the cutoff frequency:

$$f_c = \frac{\omega_c}{2\pi} \cong \frac{1}{2\pi\sqrt{\left(L_1+\frac{Z_{o1}\sqrt{\epsilon_{eff1}}\,d_1}{4c}+\frac{Z_{o2}\sqrt{\epsilon_{eff2}}\,d_2}{4c}\right)C_1}}. \quad (27)$$

The terms $Z_{on}\sqrt{\epsilon_{eff\_n}}\,d_n/c$; n=1,2 are the equivalent inductance of the transmission lines in the unit cell. Increasing any of the inductances or the capacitance $C_1$ will decrease the cutoff frequency of the fundamental stopband. This may be done, for example, by one or more of:

(a) increasing the length of the transmission lines $d_1$ or $d_2$, (b) increasing either effective dielectric constant $\sqrt{\epsilon_{effn}}$ by choosing a higher substrate and/or superstrate permittivity, (c) increasing $Z_{o2}$ by using narrower transmission lines to connect patches, or by designing slots below the narrower transmission lines to reduce the distributed capacitance, (d) increasing $L_1$, which is the via inductance, by decreasing the via diameter or by increasing the spacing between vias in the array of vias, or by increasing the substrate thickness, or (e) increasing the capacitance $C_1$ of the chip capacitor.

The chip capacitor parasitic inductance appears in series with $L_1$ and may help to lower the cutoff frequency.

For the structure shown in FIG. 63, the n=2 term is much larger than the n=1 term since $d_2 \gg d$, and $Z_{o2} \gg Z_{o1}$, and the estimator of the cutoff frequency may be further simplified to $$f_c = \frac{\omega_c}{2\pi} \cong \frac{1}{2\pi\sqrt{\left(L_1 + \frac{Z_{o2}\sqrt{\varepsilon_{\mathit{eff}\_2}}\, d_2}{4c}\right)C_1}} \qquad (28)$$

Equation (27) typically approximates $f_c$, to within 0.05%. The approximation of equation (28) is typically accurate to within 3%.

At the upper edge of the fundamental stopband, $f_{c2}$, the phase constant $k_x$ tends to zero. Since the right-hand side of the dispersion equation is the "A" term of the unit cell ABCD parameter matrix, then the transcendental expression that is solved to obtain $f_{c2}$ is $$A(f_{c2}) - 1 = 0 \qquad (29)$$

where A(f) is $$A = \cos(\beta_1 d_1)\cos(\beta_2 d_2) - \frac{1}{2}\left(\frac{Z_{o1}}{Z_{o2}} + \frac{Z_{o2}}{Z_{o1}}\right)\sin(\beta_1 d_1)\sin(\beta_2 d_2) +$$

$$jY_sZ_{o1}\left[\begin{array}{c} \sin(\beta_1 d_1)\cos(\beta_2 d_2) + \frac{1}{2}\left(\frac{Z_{o1}}{Z_{o2}} + \frac{Z_{o2}}{Z_{o1}}\right)\cos(\beta_1 d_1)\sin(\beta_2 d_2) + \\ \frac{1}{2}\left(\frac{Z_{o2}}{Z_{o1}} - \frac{Z_{o1}}{Z_{o2}}\right)\sin(\beta_2 d_2) \end{array}\right]$$

The lowest frequency root of equation (29) is the upper cutoff frequency of the fundamental stopband. The lower or upper band edge of an electromagnetic stopband for either the fundamental or higher order stopbands may be referred to as characteristic frequencies.

The hybrid EBG structure shown in FIG. 63 has the following parameters: $d_1$=0.36 in $d_2$=1.3 in, $Z_{o1}$=7.5ω, $Z_{o2}$=47.1Ω, $\in_{\mathit{eff}1}$=3.7, $\in_{\mathit{eff}2}$=3.06, $L_1$=0.33 nH, and $C_1$=10 nF. The net value of 0.33 nH for $L_1$ is comprised of 0.23 nH from the via inductance plus another 0.10 nH attributed to the 10 nF chip capacitor. The net value for $L_1$ was determined by fitting a cascaded unit cell circuit model to measured S21 data.

Equation (29) may be solved using conventional numerical techniques to obtain the lowest upper cutoff frequency at $f_{c2}$=1.969 GHz. Higher frequency solutions may occur at frequencies where the phase constant k tends becomes zero. These frequencies may be the lower or upper band edges of higher order stopbands. For instance the zero crossings at approximately 3.6 GHz and 4.9 GHz correspond to the lower and upper band edges of the $3^{rd}$ stopband. The next two zero crossings near 7.9 GHz and 8.2 GHz correspond to the lower and upper band edges of the $5^{th}$ stopband.

Figure 67:
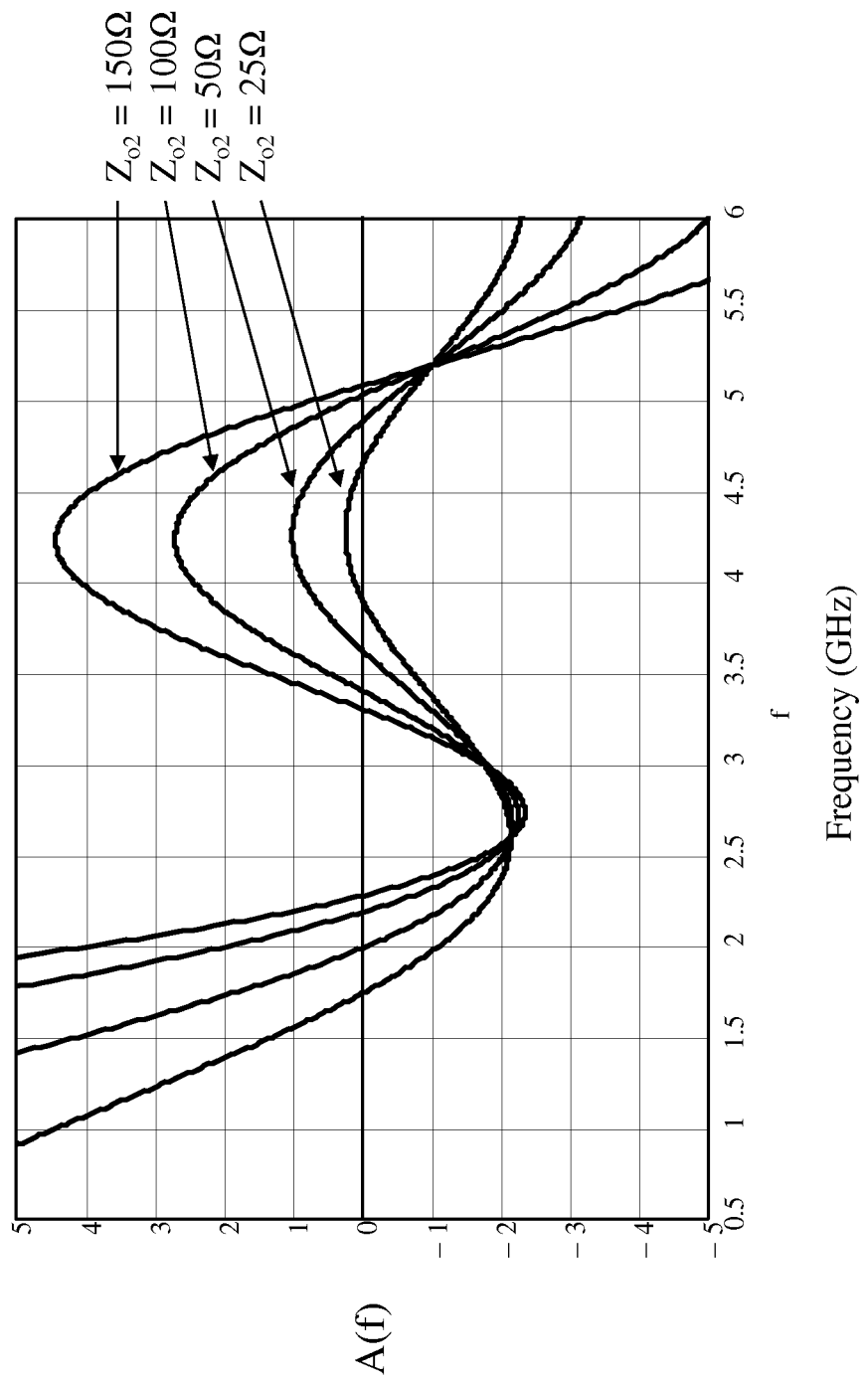
FIG. 67 shows a graphical solution of the dispersion equation, parametric in $Z_{o2}$.

FIG. 67 shows equation (29) as a parametric function of the characteristic impedance, $Z_{o2}$, where $Z_{o2}$ ranges from 25Ω to 150Ω. The bandwidth ratio of the fundamental stopband is $f_{c2}/f_c$ where $f_c$ and $f_{c2}$ are the lower and upper cutoff frequencies of the stopband, respectively. This bandwidth ratio is a function of the impedance ratio $R=Z_{o2}/Z_{o1}$. The effective dielectric constants of the transmission lines may change with their characteristic impedance. However, to first order, it may sufficient to approximate $\in_{\mathit{eff}1}$ for the patch to be the same as $\in_r$, the substrate permittivity, as the patch is wide. For the narrower interconnecting lines, $\in_{\mathit{eff}2}$ may be approximated as $(\in_r+1)/2$ as these lines may be relatively narrow with respect to the substrate height.

Figure 68:
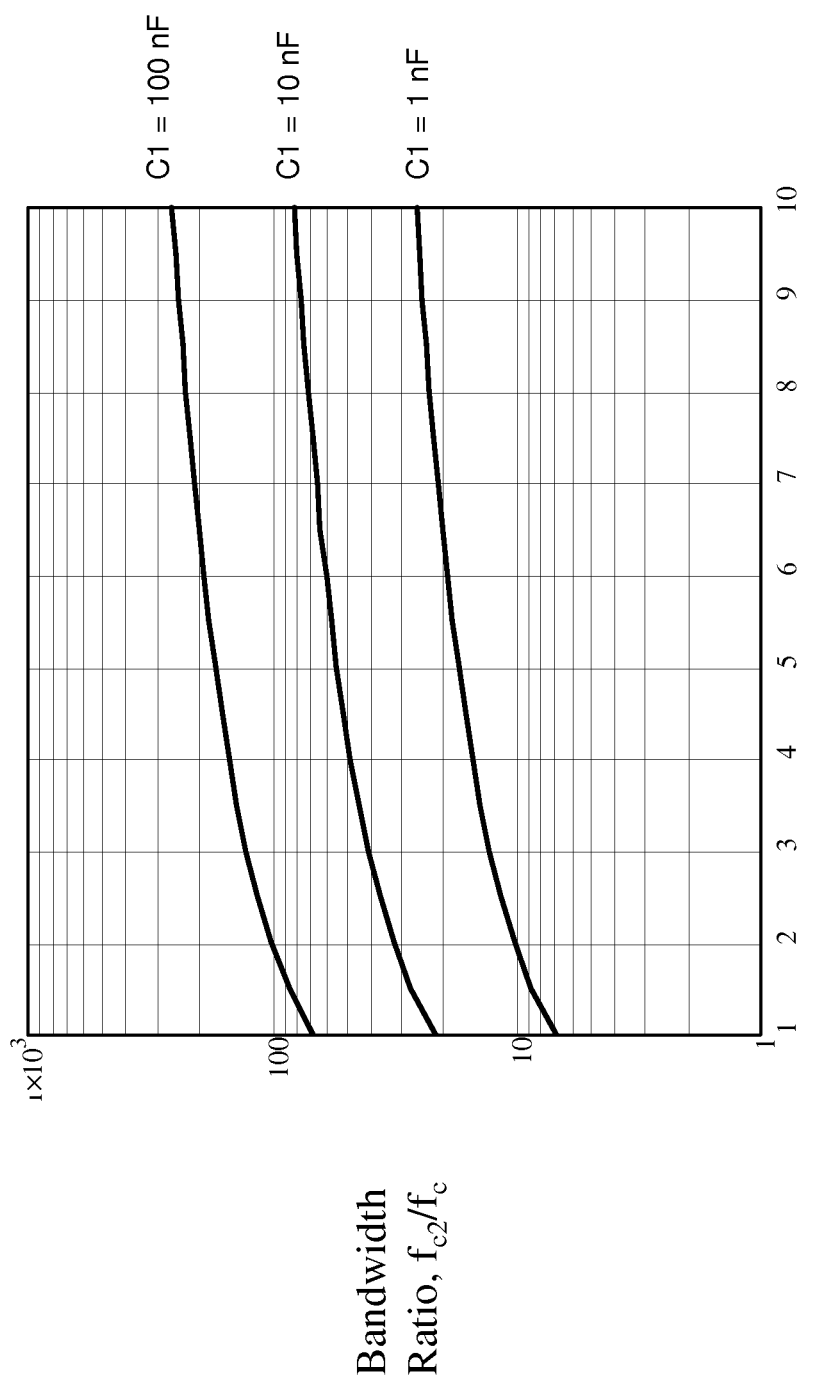
FIG. 68 shows the computed bandwidth ratio of the fundamental stopband as a function of the ratio of the transmission line characteristic impedances.
Figure 69:
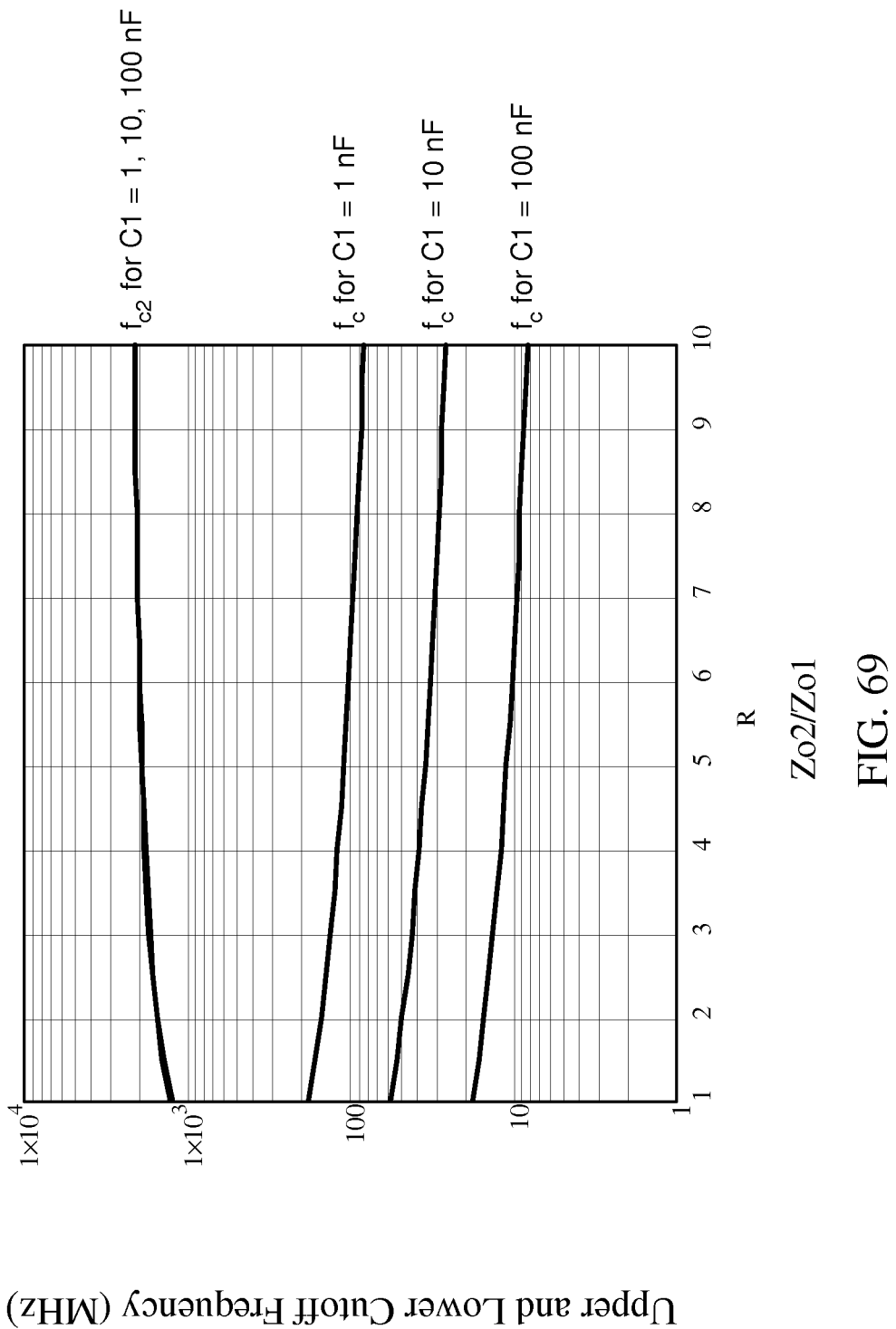
FIG. 69 shows the computed upper and lower band edges of the fundamental stopband as a function of the ratio of the transmission line characteristic impedances.

Bandwidth ratios in excess of 100:1 may be possible using 100 nF shunt capacitors with the printed circuit structure shown in FIG. 63. The computed upper and lower cutoff frequencies are shown on the same graph in FIG. 69 where the design parameters are the same as for FIG. 68. As the impedance ratio $Z_{o2}/Z_{o1}$ increases, both the lower and upper band edges move in directions such that bandwidth ratio increases. FIG. 69 shows that the upper cutoff frequency $f_{c2}$ is relatively insensitive to the value of shunt capacitance $C_1$.

The lower band edge of the fundamental stopband may be affected by changes in shunt capacitance. From equation (27), there is a order of magnitude reduction in $f_c$ as $C_1$ is increased by a factor of 100. It may possible move the lower band edge down to, for example, 10 MHz using 100 nF capacitors, and these capacitors are presently available in SMT packages such as an 0603 size. The size and form factor of electronic components evolves with technology and market factors, and specific types and sizes of electronic components are given as examples and not by way of limitation.

The fundamental stopband may be shifted to a higher frequency range by scaling the physical dimensions and the shunt capacitance values down in value by a fixed factor. This will result in an increase of the frequencies of both band edges by the same factor, and the stopband bandwidth ratio should be essentially unchanged. Such scaling may used for a power distribution network built into a ceramic module. Where all of the dimensions may not be scalable by the same factor, such as where the printed circuit board may have a minimum layer thickness, and only one dimension is decreased, the change in stopband frequency will not be as great.

Figure 70:
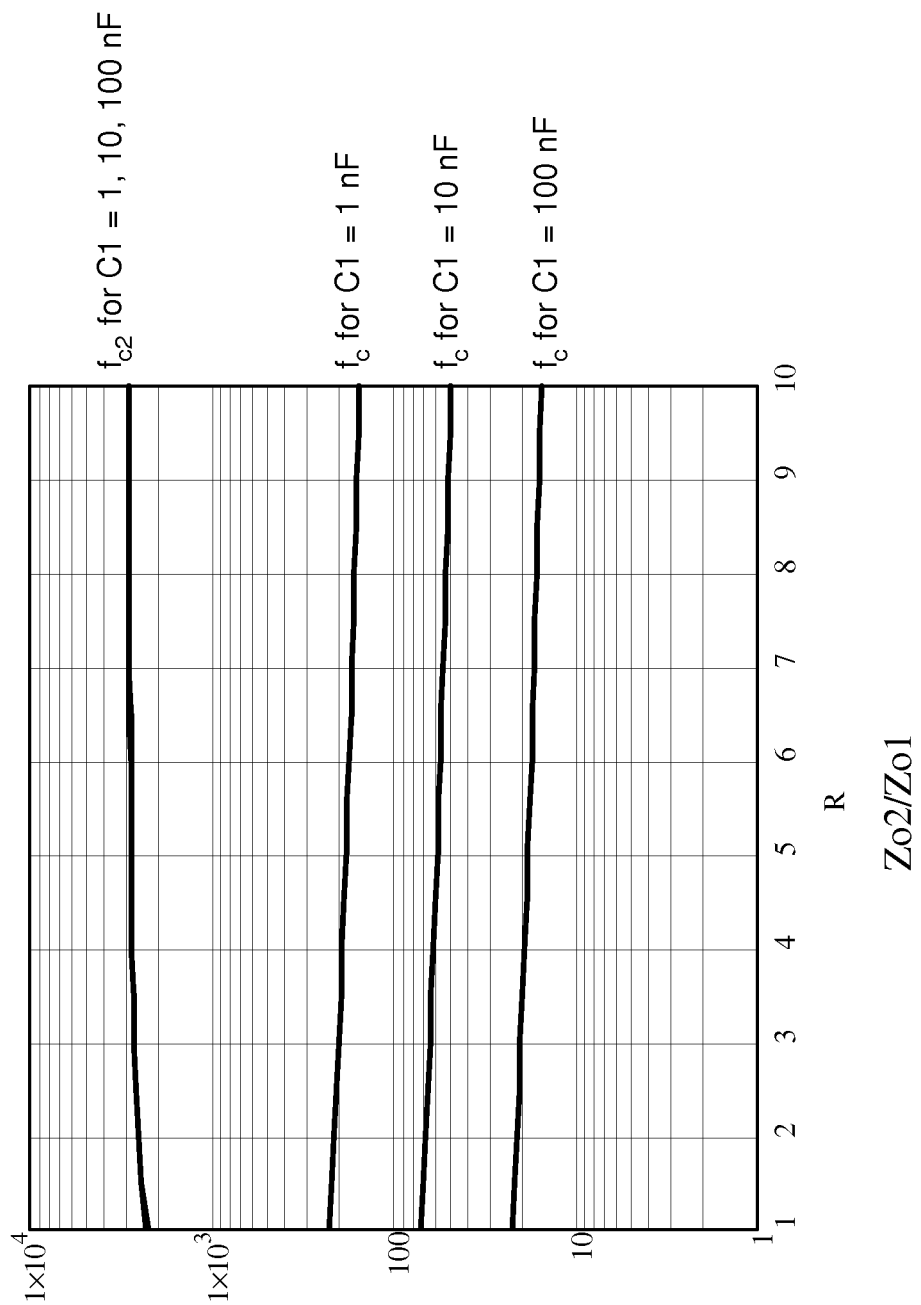
FIG. 70 shows the computed upper and lower band edges of the fundamental stopband as a function of the ratio of the transmission characteristic impedances, where the length $d_2$ of the interconnecting transmission lines has been decreased from 1.3 inches to 0.25 inches.

FIG. 70 shows the effect of decreasing only the length $d_2$ of the interconnecting transmission lines from 1.3 inches to 0.25 inches, keeping the other parameters as in FIG. 69. The decrease in the length $d_2$ is a factor of about 5, but the stopband frequencies increase by a factor of only 2.

It will be appreciated by persons of skill in the art that the structures and arrangements shown herein may serve as the basic pattern of the ground plane and the power plane, although the actual details of each of the planes may be varied in order to accommodate that electrical circuit requirements of the apparatus to be built on the EBG PCB structure. In such circumstances, traces may extend into areas shown as cutouts in this specification, and apertures may be placed in areas shown as solid material. These represent the traces and clearances needed to interconnect with the specific components which may be mounted on a circuit board. As such, the traces or apertures generally have small dimensions, are of irregular distribution, or the like, the effects are likely to be observed as small perturbations in the measured attenuation properties of the EBG structure actually built. Such small perturbations in attenuation may represent a small electrical energy.

It is therefore intended that the foregoing detailed description be regarded as illustrative rather than limiting, and that it be understood that it is the following claims, including all equivalents, that are intended to define the spirit and scope of this invention.

What is claimed is:

1. A method of controlling electromagnetic waves in a device, the method comprising:
   providing a first conductive layer;
   providing a patch layer having conductive patches, the conductive patches connected by an inductive element;
   providing a conductive element disposed between the first layer and at least one of the conductive patches and electrically connected to one of the first layer or the at least one of the conductive patches; and
   providing a capacitive element disposed to couple between the conductive element and at least one of the at least one of the conductive patches, or to the first layer, wherein the inductive element is a coupled transmission line and the first conductive layer has an opening defining a slot disposed so as to be aligned with a portion of the coupled transmission line.

2. The method of claim 1, wherein characteristics of one or more of the conductive patches, an inductance of the inductive element, a dielectric constant of a dielectric layer disposed between the first layer and the patch layer, or the capacitance of the capacitive element, are selected to control a stop band characteristic frequency.

3. The method of claim 1, further comprising spacing the first layer and the patch layer in substantially parallel planes.

4. The method of claim 1, further comprising selecting at least one of a distance between adjacent patches, a size of the patches, or a length, width, or spacing of the coupled transmission line so as to control a characteristic frequency of an electromagnetic stop band.

5. The method of claim 1, further comprising disposing the first layer and the conductive patches so as to comprise a power distribution network.

6. The method of claim 1, further comprising disposing the conductive patches in a one dimensional array to form a conductive path in a power distribution network.

7. The method of claim 1, further comprising disposing the conductive patches between a noise generating component of a circuit and a noise susceptible component of the circuit.

8. The method of claim 1, further comprising incorporating the first conductive layer, the conductive patches, and the conductive element in a printed circuit board.

9. The method of claim 1, incorporating the first conductive layer, the conductive patches and the conductive element a in a multi chip module.

10. The method of claim 1, further comprising incorporating the first conductive layer, the conductive patches and the conductive element in a semiconductor chip.

11. The method of claim 1, further comprising configuring the device as a stripline.

12. The method of claim 1, further comprising configuring the device as a microstripline.

* * * * *

UNITED STATES PATENT AND TRADEMARK OFFICE
CERTIFICATE OF CORRECTION

PATENT NO. : 8,595,924 B2  Page 1 of 1
APPLICATION NO. : 12/603071
DATED : December 3, 2013
INVENTOR(S) : William E. McKinzie, III It is certified that error appears in the above-identified patent and that said Letters Patent is hereby corrected as shown below:

In the Claims

In column 42, claim 9, line 11, after "conductive" replace "element a in" with --element in--.

Signed and Sealed this
Twenty-seventh Day of May, 2014

Michelle K. Lee
*Deputy Director of the United States Patent and Trademark Office*